US012565512B2

(12) United States Patent
Miyashita et al.

(10) Patent No.: US 12,565,512 B2
(45) Date of Patent: Mar. 3, 2026

(54) ORGANIC COMPOUND, ORGANIC LIGHT-EMITTING ELEMENT, DISPLAY APPARATUS, PHOTOELECTRIC CONVERSION APPARATUS, ELECTRONIC APPARATUS, ILLUMINATION APPARATUS, MOVING OBJECT, AND EXPOSURE LIGHT SOURCE

(71) Applicant: CANON KABUSHIKI KAISHA, Tokyo (JP)

(72) Inventors: Hirokazu Miyashita, Kanagawa (JP); Naoki Yamada, Tokyo (JP); Hironobu Iwawaki, Kanagawa (JP); Yosuke Nishide, Kanagawa (JP); Jun Kamatani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 896 days.

(21) Appl. No.: 17/869,631

(22) Filed: Jul. 20, 2022

(65) Prior Publication Data

US 2023/0095563 A1 Mar. 30, 2023

(30) Foreign Application Priority Data

Jul. 27, 2021 (JP) ................................ 2021-122660

(51) Int. Cl.
*C07F 15/00* (2006.01)
*H10K 50/11* (2023.01)
(Continued)

(52) U.S. Cl.
CPC .......... *C07F 15/0033* (2013.01); *H10K 50/11* (2023.02); *H10K 50/125* (2023.02);
(Continued)

(58) Field of Classification Search
CPC ... C07F 15/0033; H10K 50/11; H10K 50/125; H10K 85/342; H10K 2101/40;
(Continued)

(56) References Cited

U.S. PATENT DOCUMENTS 5,728,480 A * 3/1998 Stern ...................... C09K 11/06 313/506
2011/0095280 A1* 4/2011 Meyer .................... C08G 61/10 524/610

(Continued)

FOREIGN PATENT DOCUMENTS

CN 1478372 A 2/2004
CN 1781925 A 6/2006

(Continued)

OTHER PUBLICATIONS

Chouai, Latif et al., Pyrene-bridged bis (phenanthroline) ligands and their dinuclear ruthenium (II) complexes, European Journal of Inorganic Chemistry, 2003, 2774-2782 (Year: 2003).*

(Continued)

*Primary Examiner* — Michael M Dollinger
(74) *Attorney, Agent, or Firm* — Canon U.S.A., Inc. IP Division

(57) ABSTRACT

An organic compound is represented by formula [1]. In formula [1], L and L' are bidentate ligands different from each other, a partial structure $IrL_m$ is a partial structure represented by formula [2], and a partial structure $IrL'_n$ is a partial structure represented by formula [3-1] or formula [3-2].

$$IrL_mL'_n \quad [1]$$

[2]

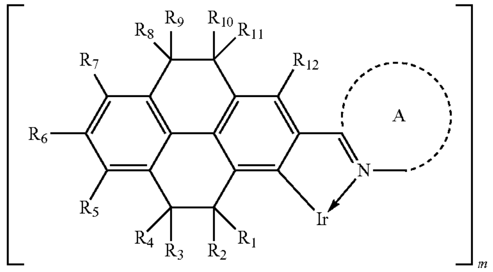

(Continued)

| COMPOUND | STRUCTURE | SKELETON SURROUNDED BY DASHED LINE AS VIEWED PERPENDICULARLY TO DRAWING PLANE | SKELETON SURROUNDED BY DASHED LINE AS VIEWED IN PARALLEL TO DRAWING PLANE |
|---|---|---|---|
| EXEMPLARY COMPOUND A25 |  |  |  |
| COMPARATIVE COMPOUND 1-a |  |  |  |

-continued

[3-1]

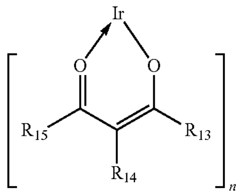

[3-2]

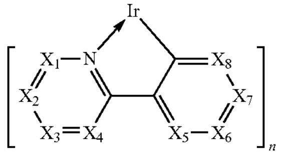

20 Claims, 10 Drawing Sheets

(51) Int. Cl.
*H10K 50/125* (2023.01)
*H10K 85/30* (2023.01)
*H10K 101/40* (2023.01)

(52) U.S. Cl.
CPC ........ *H10K 85/342* (2023.02); *C07B 2200/05* (2013.01); *H10K 2101/40* (2023.02)

(58) Field of Classification Search
CPC .. H10K 85/615; H10K 2101/10; H10K 50/12; H10K 85/654; H10K 85/6572; C07B 2200/05; C09K 2211/185; C09K 11/06; F21Y 2115/15; Y02E 10/549
See application file for complete search history.

(56) References Cited

U.S. PATENT DOCUMENTS

| | | | | |
|---|---|---|---|---|
| 2014/0291638 | A1* | 10/2014 | Kwong | C07D 333/50 548/440 |
| 2016/0164012 | A1* | 6/2016 | Lee | H10K 85/40 546/4 |
| 2019/0062357 | A1* | 2/2019 | Yoo | H10K 85/348 |

FOREIGN PATENT DOCUMENTS

| | | | | | |
|---|---|---|---|---|---|
| CN | 108610383 | A | * | 10/2018 | C07F 15/0033 |
| CN | 110144213 | A | | 8/2019 | |
| CN | 112694501 | A | | 4/2021 | |
| EP | 1645610 | A1 | * | 4/2006 | C09K 11/06 |
| KR | 20090072168 | A | * | 7/2009 | H10K 50/16 |

OTHER PUBLICATIONS

Edkins, R.M., et al., "Syntheses, Structures, and Comparison of the Photophysical Properties of Cyclometalated ridiurn Complexes Containing the Isomeric 1- and 2-(2'-pyridyl)pyrene Ligands", Inorganic Chemistry, 2013, pp. 9842-9860, vol. 52, No. 17.

* cited by examiner

| COMPOUND | STRUCTURE | SKELETON SURROUNDED BY DASHED LINE AS VIEWED PERPENDICULARLY TO DRAWING PLANE | SKELETON SURROUNDED BY DASHED LINE AS VIEWED IN PARALLEL TO DRAWING PLANE |
| --- | --- | --- | --- |
| EXEMPLARY COMPOUND A25 |  |  |  |
| COMPARATIVE COMPOUND 1-a |  |  |  |

| COMPOUND | STRUCTURE | HOMO | LUMO |
|---|---|---|---|
| EXEMPLARY COMPOUND A25 |  |  |  |

ORGANIC COMPOUND, ORGANIC LIGHT-EMITTING ELEMENT, DISPLAY APPARATUS, PHOTOELECTRIC CONVERSION APPARATUS, ELECTRONIC APPARATUS, ILLUMINATION APPARATUS, MOVING OBJECT, AND EXPOSURE LIGHT SOURCE

BACKGROUND OF THE INVENTION

Field of the Invention

The present disclosure relates to an organic compound, an organic light-emitting element, a display apparatus, a photoelectric conversion apparatus, an electronic apparatus, an illumination apparatus, a moving object, and an exposure light source.

Description of the Related Art

An organic light-emitting element (hereinafter also referred to as an "organic electroluminescent element" or an "organic EL element") is an electronic element including a pair of electrodes and an organic compound layer disposed between the electrodes. By injecting electrons and holes through the pair of electrodes, excitons of a luminescent organic compound in the organic compound layer are generated. The organic light-emitting element emits light when the excitons return to their ground state.

Recent progress in organic light-emitting elements has been noticeable. For example, low driving voltages, various emission wavelengths, high-speed response, and thinner and lighter light-emitting devices have been enabled.

Luminescent organic compounds have been actively created to date. This is because creation of compounds having good light-emitting properties is important for providing high-performance organic light-emitting elements.

One of the compounds created so far is the following compound 1-a disclosed in Inorganic Chemistry, 2013, Vol. 52, No. 17, pp. 9842-9860 (NPL 1).

1-a

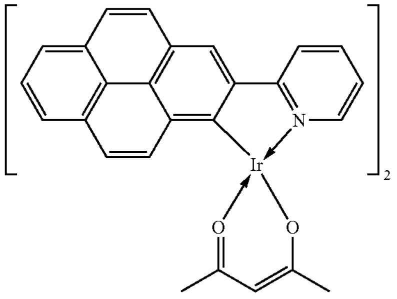

The present inventors have conducted studies and found that compound 1-a disclosed in NPL 1 has room for improvement in light-emitting properties. Improving the light-emitting properties of a compound can provide an organic light-emitting element with higher light emission efficiency.

SUMMARY OF THE INVENTION

In view of the foregoing, the present disclosure provides an organic compound having good light-emitting properties.

The present disclosure further provides an organic light-emitting element having good light-emitting properties.

An organic compound according to one aspect of the present disclosure is represented by formula [1] below.

$$IrL_mL'_n \qquad [1]$$

In formula [1], Ir represents iridium. L and L' represent bidentate ligands different from each other. m is an integer of 1 to 3, and when m is 1, n is 2, when m is 2, n is 1, and when m is 3, n is 0. A partial structure $IrL_m$ is a partial structure represented by formula [2], and a partial structure $IrL'_n$ is a partial structure represented by formula [3-1] or formula [3-2]. When m is 2 or greater, a plurality of L moieties may be the same or different. When n is 2 or greater, a plurality of L' moieties may be the same or different.

[2]

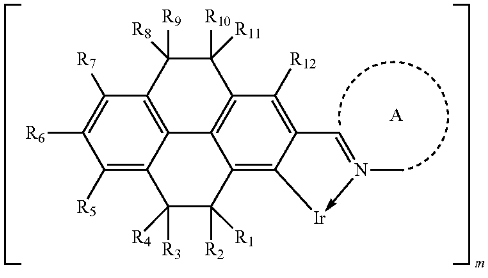

[3-1]

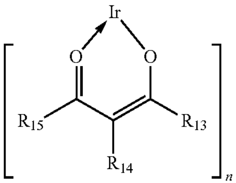

[3-2]

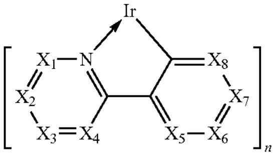

In formula [2], a ring A is selected from formulae [A-1] to [A-5] below.

[A-1]

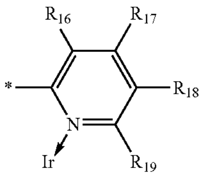

[A-2]

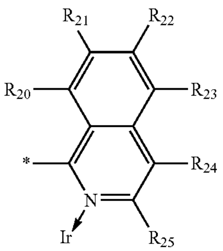

-continued

[A-3]

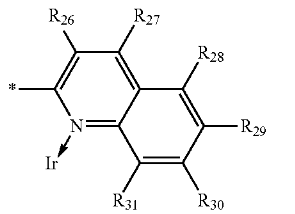

[A-4]

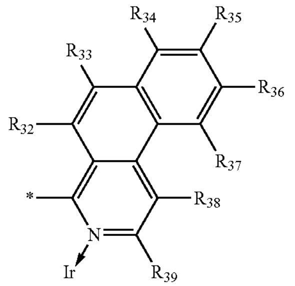

[A-5]

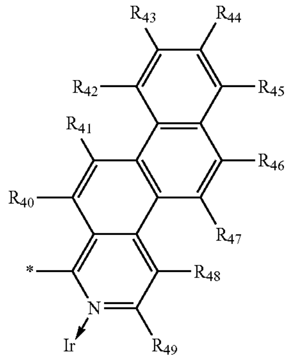

In formulae [A-1] to [A-5], * represents a bonding position.

In formulae [2], [3-1], and [A-1] to [A-5], $R_1$ to $R_{49}$ are each independently selected from a hydrogen atom, a deuterium atom, a halogen atom, a substituted or unsubstituted alkyl group, a substituted or unsubstituted alkoxy group, a substituted or unsubstituted amino group, a substituted or unsubstituted aryloxy group, a substituted or unsubstituted silyl group, a cyano group, a substituted or unsubstituted aromatic hydrocarbon group, and a substituted or unsubstituted heterocyclic group.

In formula [3-2], $X_1$ to $X_8$ are each independently selected from a carbon atom and a nitrogen atom. When $X_1$ to $X_8$ are carbon atoms, the carbon atoms each have a hydrogen atom, a deuterium atom, or a substituent, and each substituent is independently selected from a halogen atom, a substituted or unsubstituted alkyl group, a substituted or unsubstituted alkoxy group, a substituted or unsubstituted amino group, a substituted or unsubstituted aryloxy group, a substituted or unsubstituted silyl group, a cyano group, a substituted or unsubstituted aromatic hydrocarbon group, and a substituted or unsubstituted heterocyclic group.

Further features of the present disclosure will become apparent from the following description of exemplary embodiments with reference to the attached drawings.

DESCRIPTION OF THE EMBODIMENTS

Organic Compound

Figure 1:
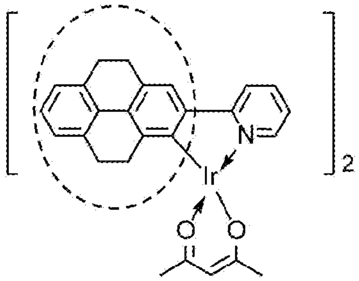
FIG. 1 shows results of comparison between an exemplary compound and a comparative compound focusing on the planarity of an aromatic ring moiety of a ligand.
Figure 1:
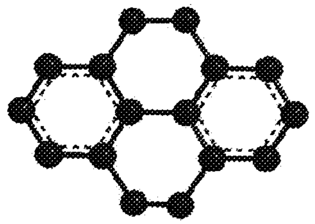
Figure 1:
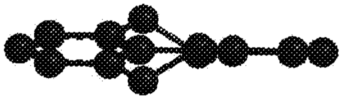
Figure 1:
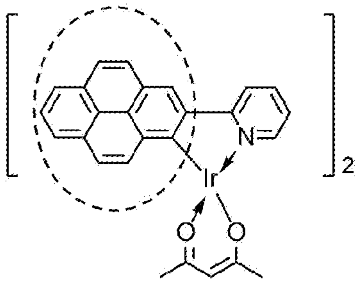
Figure 1:
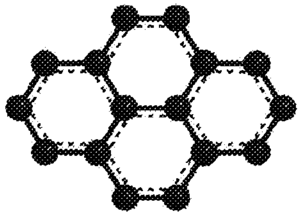
Figure 1:

An organic compound according to an embodiment will first be described.

The organic compound according to this embodiment is an organometallic complex represented by general formula [1] below.

$$IrL_mL'_n \quad [1]$$

In general formula [1], Ir represents iridium. L and L' represent bidentate ligands different from each other. m is an integer of 1 to 3, and when m is 1, n is 2, when m is 2, n is 1, and when m is 3, n is 0. A partial structure $IrL_m$ is a partial structure represented by general formula [2], and a partial structure $IrL'_n$ is a partial structure represented by general formula [3-1] or general formula [3-2]. When m is 2 or greater, a plurality of L moieties may be the same or different. A plurality of types of L moieties may be included. When n is 2 or greater, a plurality of L' moieties may be the same or different.

[2]

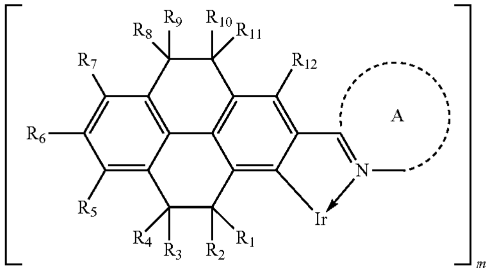

[3-1]

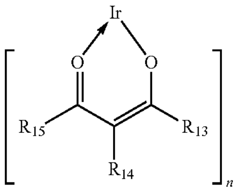

[3-2]

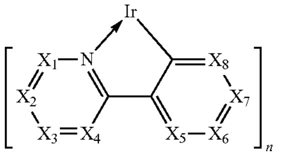

In general formula [2], a ring A is selected from general formulae [A-1] to [A-5] below.

[A-1]

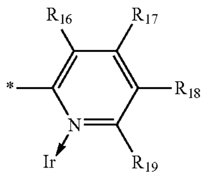

[A-2]

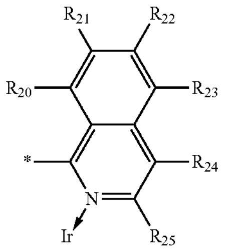

[A-3]

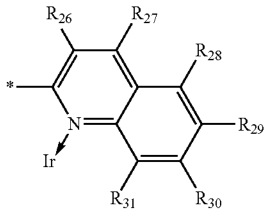

-continued

[A-4]

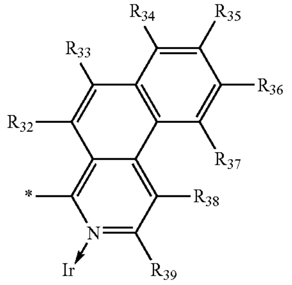

[A-5]

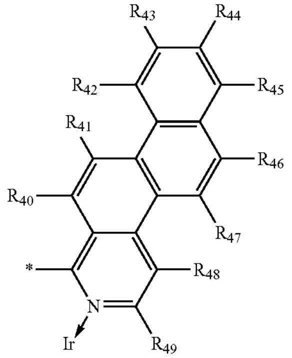

In general formulae [A-1] to [A-5], * represents a bonding position.

In general formulae [2], [3-1], and [A-1] to [A-5], $R_1$ to $R_{49}$ are each independently selected from a hydrogen atom, a deuterium atom, a halogen atom, a substituted or unsubstituted alkyl group, a substituted or unsubstituted alkoxy group, a substituted or unsubstituted amino group, a substituted or unsubstituted aryloxy group, a substituted or unsubstituted silyl group, a cyano group, a substituted or unsubstituted aromatic hydrocarbon group, and a substituted or unsubstituted heterocyclic group.

In general formula [3-2], $X_1$ to $X_8$ are each independently selected from a carbon atom and a nitrogen atom. When $X_1$ to $X_8$ are carbon atoms, the carbon atoms each have a hydrogen atom, a deuterium atom, or a substituent, and each substituent is independently selected from a halogen atom, a substituted or unsubstituted alkyl group, a substituted or unsubstituted alkoxy group, a substituted or unsubstituted amino group, a substituted or unsubstituted aryloxy group, a substituted or unsubstituted silyl group, a cyano group, a substituted or unsubstituted aromatic hydrocarbon group, and a substituted or unsubstituted heterocyclic group.

In general formulae [2], [3-1], and [A-1] to [A-5], $R_1$ to $R_{49}$ are preferably each independently selected from a hydrogen atom, a deuterium atom, a halogen atom, a substituted or unsubstituted alkyl group having 1 to 10 carbon atoms, a substituted or unsubstituted alkoxy group having 1 to 10 carbon atoms, a substituted or unsubstituted amino group having 1 to 6 carbon atoms, a substituted or unsubstituted aryloxy group, a substituted or unsubstituted silyl group, a cyano group, a substituted or unsubstituted aromatic hydrocarbon group having 6 to 30 carbon atoms, and a substituted or unsubstituted heterocyclic group having 3 to 27 carbon atoms.

In general formula [2], $R_1$ to $R_4$ and $R_8$ to $R_{11}$ are preferably each independently selected from a hydrogen atom and an alkyl group, and more preferably each independently selected from a hydrogen atom and a substituted or unsubstituted alkyl group having 1 to 10 carbon atoms. As will be described in detail later, the organic compound represented by general formula [1] has a partial structure represented by general formula [2] and has a tetrahydropyrene skeleton. The tetrahydropyrene skeleton has high planarity although not as high as that of a pyrene skeleton, and this planarity facilitates interaction with other organic compounds such as a host in a light-emitting layer of an organic light-emitting element. Thus, when $R_1$ to $R_4$ and $R_8$ to $R_{11}$ are each independently selected from a hydrogen atom and an alkyl group in general formula [2], the planarity can be higher than when other substituents are used.

When $X_1$ to $X_8$ in general formula [3-2] are carbon atoms, the substituents on the carbon atoms are preferably each independently selected from a halogen atom, a substituted or unsubstituted alkyl group having 1 to 10 carbon atoms, a substituted or unsubstituted alkoxy group having 1 to 10 carbon atoms, a substituted or unsubstituted amino group having 1 to 6 carbon atoms, a substituted or unsubstituted aryloxy group, a substituted or unsubstituted silyl group, a cyano group, a substituted or unsubstituted aromatic hydrocarbon group having 6 to 30 carbon atoms, and a substituted or unsubstituted heterocyclic group having 3 to 27 carbon atoms.

In general formulae [2], [3-2], [3-1], and [A-1] to [A-5], examples of halogen atoms that the carbon atoms represented by $X_1$ to $X_8$ may have as substituents and halogen atoms represented by $R_1$ to $R_{49}$ include fluorine, chlorine, bromine, and iodine, but are not limited thereto.

In general formulae [2], [3-2], [3-1], and [A-1] to [A-5], examples of alkyl groups that the carbon atoms represented by $X_1$ to $X_8$ may have as substituents and alkyl groups represented by $R_1$ to $R_{49}$ include a methyl group, an ethyl group, a n-propyl group, an isopropyl group, a n-butyl group, a tert-butyl group, a sec-butyl group, an octyl group, a cyclohexyl group, a 1-adamantyl group, and a 2-adamantyl group, but are not limited thereto.

In general formulae [2], [3-2], [3-1], and [A-1] to [A-5], examples of alkoxy groups that the carbon atoms represented by $X_1$ to $X_8$ may have as substituents and alkoxy groups represented by $R_1$ to $R_{49}$ include a methoxy group, an ethoxy group, a propoxy group, a 2-ethyl-octyloxy group, and a benzyloxy group, but are not limited thereto.

In general formulae [2], [3-2], [3-1], and [A-1] to [A-5], examples of amino groups that the carbon atoms represented by $X_1$ to $X_8$ may have as substituents and amino groups represented by $R_1$ to $R_{49}$ include an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N,N-dinaphthylamino group, an N,N-difluorenylamino group, an N-phenyl-N-tolylamino group, an N,N-ditolylamino group, an N-methyl-N-phenylamino group, an N,N-dianisolylamino group, an N-mesityl-N-phenylamino group, an N,N-dimesitylamino group, an N-phenyl-N-(4-tert-butylphenyl)amino group, an N-phenyl-N-(4-trifluoromethylphenyl)amino group, and an N-piperidyl group, but are not limited thereto.

In general formulae [2], [3-2], [3-1], and [A-1] to [A-5], examples of aryloxy and heteroaryloxy groups that the carbon atoms represented by $X_1$ to $X_8$ may have as substituents and aryloxy and heteroaryloxy groups represented by $R_1$ to $R_{49}$ include a phenoxy group and a thienyloxy group, but are not limited thereto.

In general formulae [2], [3-2], [3-1], and [A-1] to [A-5], examples of silyl groups that the carbon atoms represented by $X_1$ to $X_8$ may have as substituents and silyl groups represented by $R_1$ to $R_{49}$ include a trimethylsilyl group and a triphenylsilyl group, but are not limited thereto.

In general formulae [2], [3-2], [3-1], and [A-1] to [A-5], examples of aromatic hydrocarbon groups that the carbon atoms represented by $X_1$ to $X_8$ may have as substituents and aromatic hydrocarbon groups represented by $R_1$ to $R_{49}$ include a phenyl group, a naphthyl group, an indenyl group, a biphenyl group, a terphenyl group, a fluorenyl group, a phenanthryl group, a fluoranthenyl group, and a triphenylenyl group, but are not limited thereto.

In general formulae [2], [3-2], [3-1], and [A-1] to [A-5], examples of heterocyclic groups that the carbon atoms represented by $X_1$ to $X_8$ may have as substituents and heterocyclic groups represented by $R_1$ to $R_{49}$ include a pyridyl group, an oxazolyl group, an oxadiazolyl group, a thiazolyl group, a thiadiazolyl group, a carbazolyl group, an acridinyl group, a phenanthrolyl group, a dibenzofuranyl group, and a dibenzothiophenyl group, but are not limited thereto.

Examples of substituents that the above alkyl group, alkoxy group, amino group, aryloxy group, silyl group, aromatic hydrocarbon group, and heterocyclic group may further have include halogen atoms such as fluorine, chlorine, bromine, and iodine; alkyl groups such as a methyl group, an ethyl group, a n-propyl group, an isopropyl group, a n-butyl group, and a tert-butyl group; alkoxy groups such as a methoxy group, an ethoxy group, and a propoxy group; amino groups such as a dimethylamino group, a diethylamino group, a dibenzylamino group, a diphenylamino group, and a ditolylamino group; aryloxy groups such as a phenoxy group; aromatic hydrocarbon groups such as a phenyl group and a biphenyl group; heterocyclic groups such as a pyridyl group and a pyrrolyl group; and a cyano group, but are not limited thereto.

Features of Organic Compound According to this Embodiment

Next, features of the organic compound according to this embodiment will be described. The organic compound according to this embodiment has features as described below and thus has a high quantum yield and high sublimability. Furthermore, using this organic compound can also provide an organic light-emitting element having high light emission efficiency and high element durability.

(1) The organic compound has a high quantum yield because of having a tetrahydropyrene skeleton.

(2) The organic compound has high sublimability because of having a tetrahydropyrene skeleton.

Hereinafter, these features will be described using comparative compound 1-a as a comparative reference. Comparative compound 1-a is a compound disclosed in NPL 1.

(1) The Organic Compound has a High Quantum Yield Because of Having a Tetrahydropyrene Skeleton.

In inventing the organic compound of the present disclosure, the present inventors focused on the structure of ligands of the organic compound. Specifically, of an aromatic ring and a heterocyclic ring constituting a ligand of an Ir complex, a tetrahydropyrene skeleton was used as the aromatic ring in order to improve the quantum yield.

Here, the results of comparison regarding light-emitting properties between exemplary compound A25, which is the organic compound according to this embodiment, and comparative compound 1-a are shown in Table 1. The measurement of an emission wavelength was carried out using an F-4500 manufactured by Hitachi, Ltd. by photoluminescence (PL) measurement of a diluted toluene solution at an excitation wavelength of 350 nm at room temperature. For the measurement of a quantum yield, the absolute quantum yield of the diluted toluene solution was measured using an absolute PL quantum yield spectrometer (C9920-02) manufactured by Hamamatsu Photonics K.K. The quantum yield is expressed as a relative value, with the quantum yield of exemplary compound A25 being 1.0.

TABLE 1

| Compound | Structure | λmax [nm] | Quantum yield |
|---|---|---|---|
| Exemplary compound A25 | 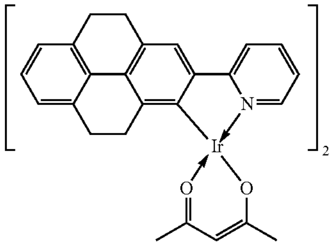 | 530 | 1.0 |
| Comparative compound 1-a | 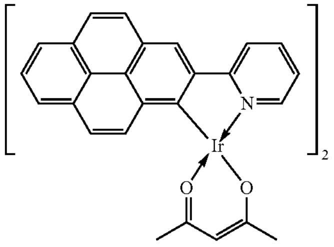 | 626 | 0.1 |

Table 1 shows that exemplary compound A25 has a much higher quantum yield and better light-emitting properties than comparative compound 1-a. The present inventors consider this as described below.

The difference in structure between the two compounds is a difference of aromatic rings coordinated to metallic Ir. The aromatic ring of comparative compound 1-a is a pyrene skeleton, whereas the aromatic ring of exemplary compound A25 is a tetrahydropyrene skeleton.

Here, the pyrene skeleton is a fused polycyclic structure in which four benzene rings are fused together. In this structure, π-electrons are delocalized over the entire pyrene skeleton to form an extended π-conjugated system. Thus, the ligand having the pyrene skeleton is a ligand having an extended π-conjugated system. Thus, the light-emitting properties of the Ir complex having the ligand with the pyrene skeleton are such that π-π* properties are strong and, on the other hand, metal to ligand charge transfer (MLCT) properties, which mean interaction with metallic Ir, are weak. As a result, comparative compound 1-a cannot exhibit light emission accompanying sufficient MLCT transition and thus has a low phosphorescent quantum yield.

By contrast, the ligand of exemplary compound A25 is a ligand having a tetrahydropyrene skeleton.

The tetrahydropyrene skeleton is a structure in which two ethylene chains are cross-linked to a biphenyl skeleton. Thus, in this structure, π-electrons are not delocalized over the entire tetrahydropyrene skeleton to form an extended π-conjugated system unlike the pyrene skeleton. As a result, sufficient MLCT transition can be maintained, and thus exemplary compound A25 has a high quantum yield.

In addition, comparative compound 1-a has an emission wavelength (λmax) of 626 nm and exhibits light emission in the red region, whereas exemplary compound A25 has an emission wavelength (λmax) of 530 nm and exhibits light emission in the green region. This is also due to the difference in structure between the aromatic rings coordinated to metallic Ir, as described above. Specifically, in the case of the pyrene skeleton, since the π-conjugated system extends over the entire pyrene skeleton, the emission wavelength is shifted to a longer wavelength, thus resulting in light emission in the red region. In the case of the tetrahydropyrene skeleton, since the π-conjugated system does not extend over the entire tetrahydropyrene skeleton, the emission wavelength is not shifted to a longer wavelength, thus resulting in light emission in the green region.

Thus, the organic compound according to this embodiment can have an emission wavelength in the visible light region even if the heterocyclic ring represented by the ring A in general formula [1] is a fused heterocyclic ring consisting of two or more rings in which conjugation extends wider than in the pyridine ring of exemplary compound A25. By contrast, in the case of having a pyrene skeleton as in comparative compound 1-a, if a fused heterocyclic ring consisting of two or more rings in which conjugation extends wider than in the pyridine ring is used as the heterocyclic ring, the emission wavelength is further shifted to a longer wavelength, thus resulting in light emission in the near infrared region. Light emission at an emission wavelength in the near infrared region or the infrared region cannot reproduce colors visible to human eyes in the visible light region, and thus is not suitable for image display device applications such as displays. In other words, the organic compound according to this embodiment is suitable for image display device applications such as displays because light emission in the visible light region is exhibited even if the heterocyclic ring represented by the ring A in general formula [1] is a fused heterocyclic ring consisting of two or more rings.

(2) The Organic Compound has High Sublimability Because of Having a Tetrahydropyrene Skeleton.

In inventing the organic compound according to this embodiment, the present inventors focused on the stereostructure of a ligand of the organic compound. Specifically, molecular design was performed such that the ligand has low planarity.

Here, the results of comparison between exemplary compound A25, which is the organic compound according to this embodiment, and comparative compound 1-a focusing on the planarity of an aromatic ring moiety of the ligand are shown in FIG. 1.

FIG. 1 shows that the pyrene skeleton which is the aromatic ring of comparative compound 1-a is highly planar. Here, when the planarity of the ligand is high, the π-π interaction between the ligands are facilitated, and the Ir complex becomes a compound prone to aggregation. As a result, the sublimability of the Ir complex is disadvantageously reduced.

By contrast, the tetrahydropyrene skeleton which is the aromatic ring of exemplary compound A25 has flexible ethylene chains and thus has low planarity. More specifically, two benzene rings included in the aromatic ring moiety are not completely parallel to each other and have a somewhat twisted structure. Thus, the interaction between the ligands can be suppressed, and aggregation of the Ir complexes can be suppressed. As a result, exemplary compound A25 is a compound having high sublimability.

Therefore, the compound according to this embodiment has high sublimability, that is, can be sublimed at a lower temperature. Due to the low sublimation temperature, pyrolysis during sublimation can be suppressed to achieve stable sublimation purification. This also means that the deposition stability during the production of an organic light-emitting element using the compound according to this embodiment is high. That is, according to this embodiment, a deposited film can be formed without being decomposed during deposition, and a long-lived organic light-emitting element can be provided.

Evaluations of the light-emitting properties and sublimability of the compounds described in the features (1) and (2) of the organic compound according to this embodiment will be described in more detail in EXAMPLES given later. Examples of organic compound according to this embodiment Specific examples of the organic compound according to this embodiment are shown below. However, the present disclosure is not limited thereto. In the following structural formulae, a broken line indicates a coordinate bond.

A1

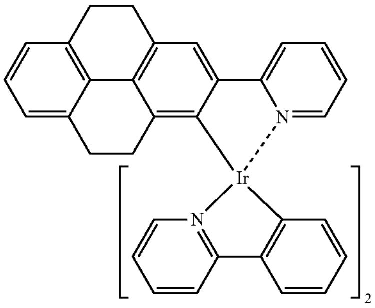

A2

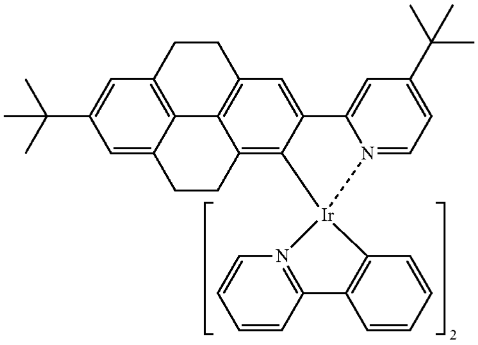

A3

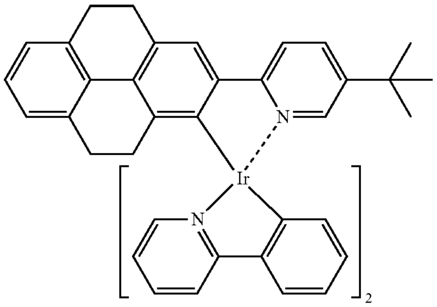

-continued

A4

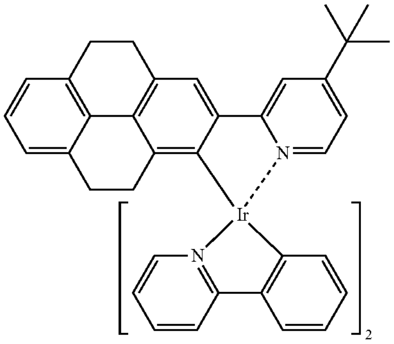

A5

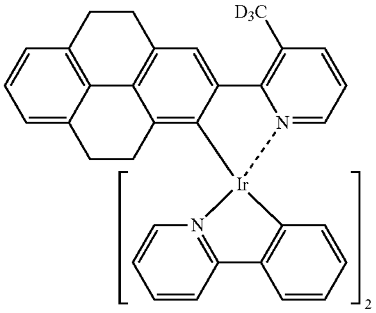

A6

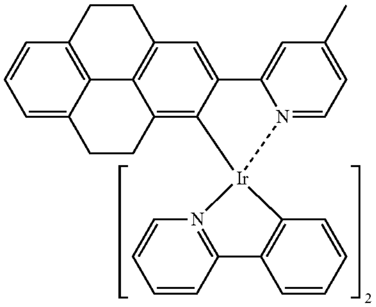

A7

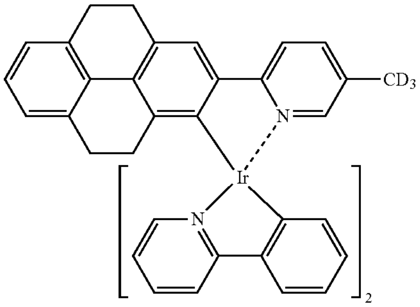

A8

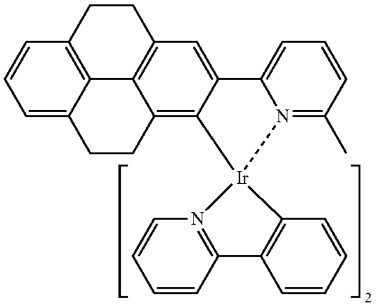

-continued
A9
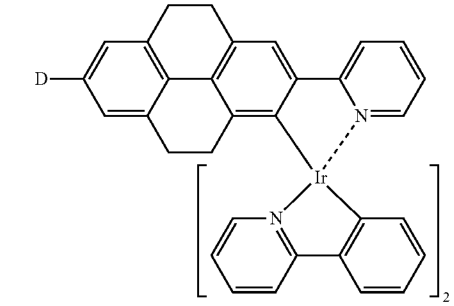
A10
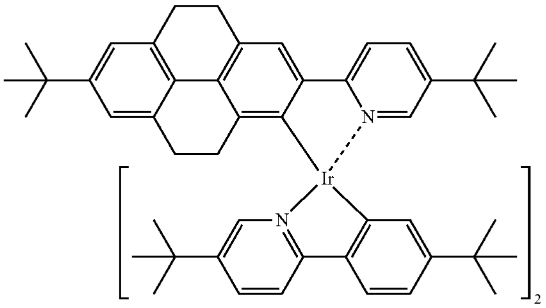
A11
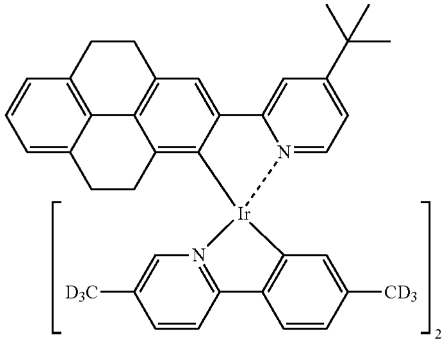
A12
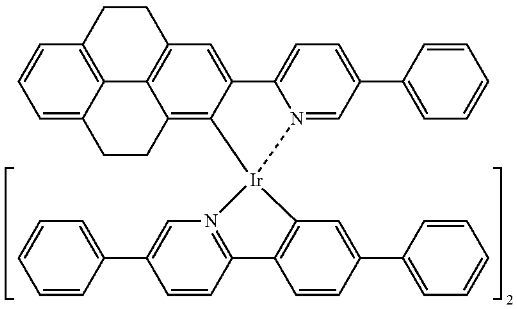
-continued
A13
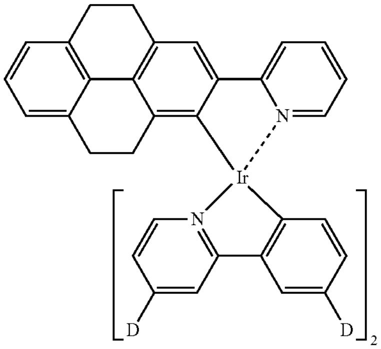
A14
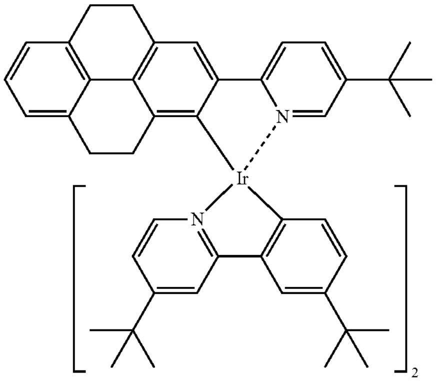
A15
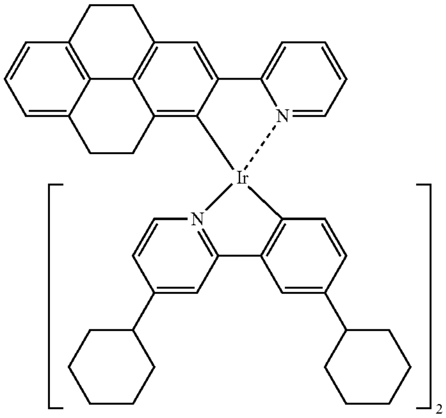
A16
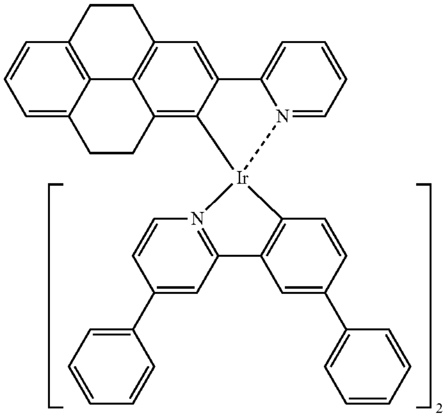

-continued
A17
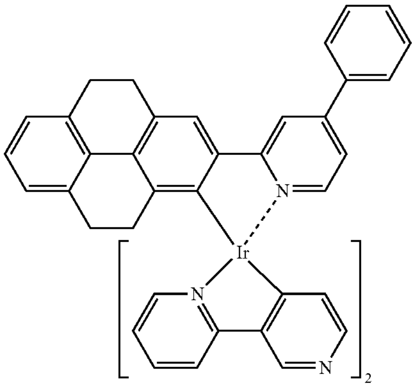
A18
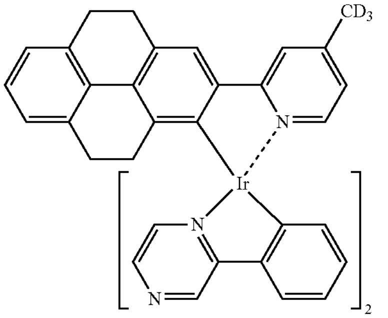
A19
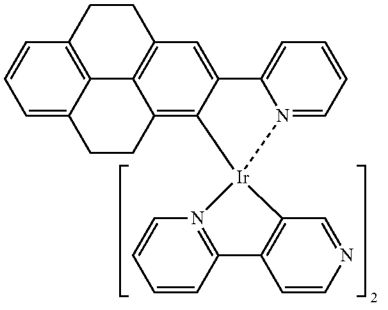
A20
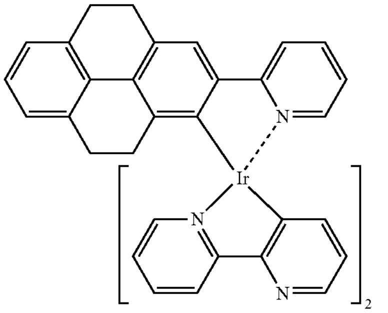
-continued
A21
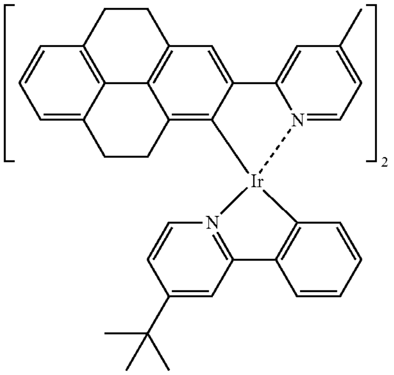
A22
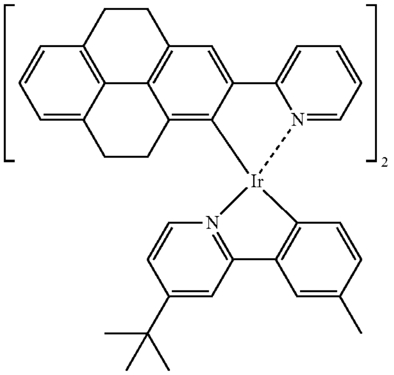
A23
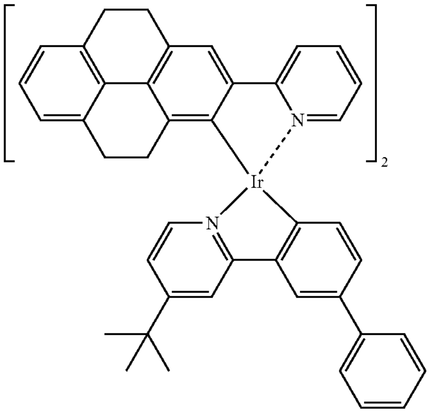
A24
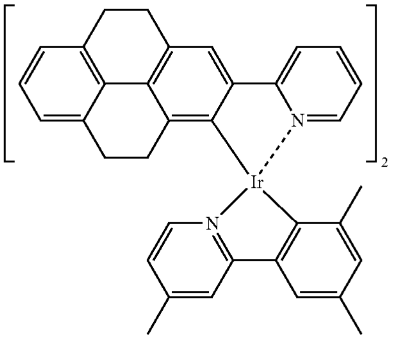

-continued
A25
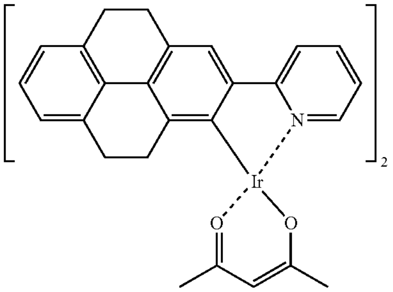
A26
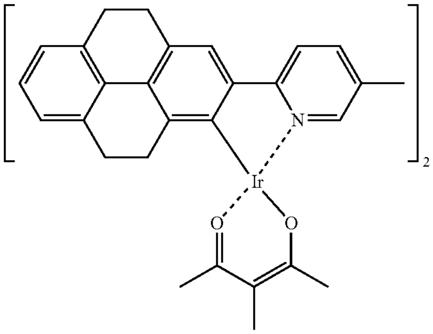
A27
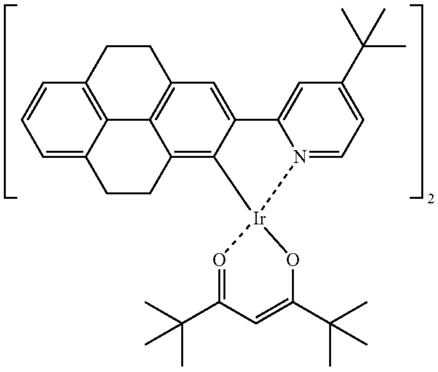
A28
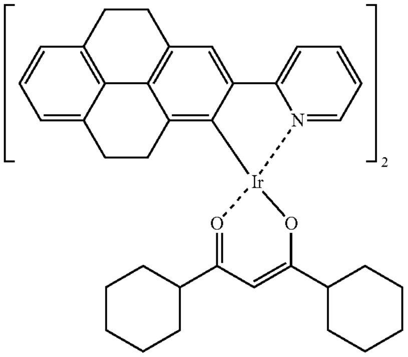
-continued
A29
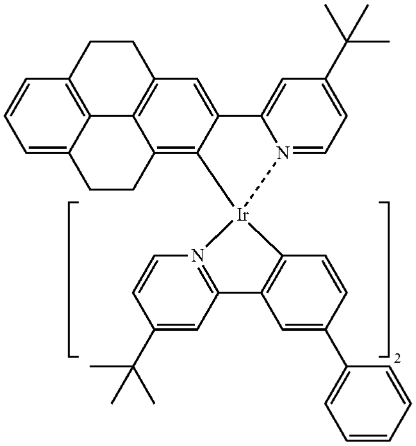
A30
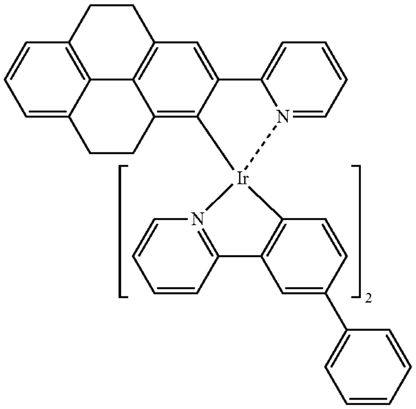
A31
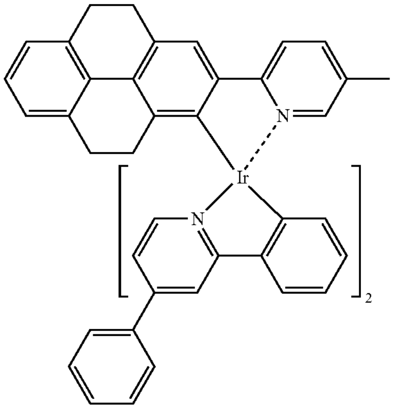
A32
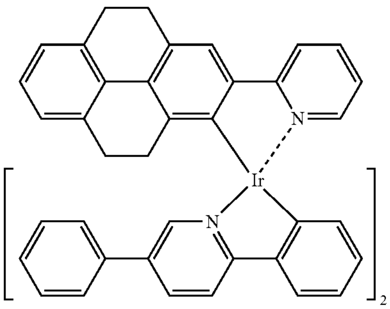

-continued
A33
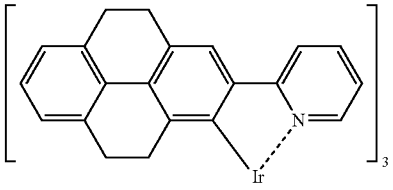
A34
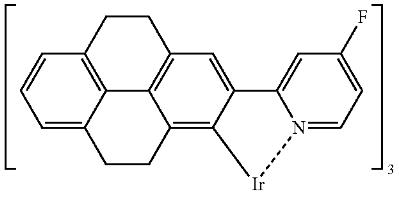
A35
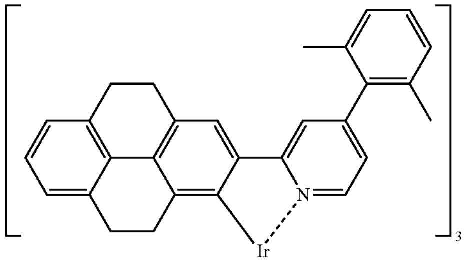
A36
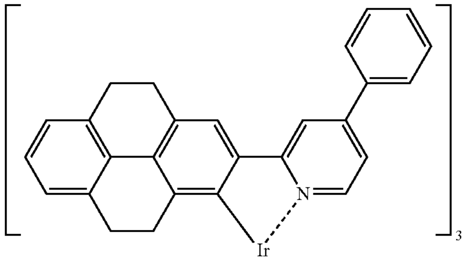
A37
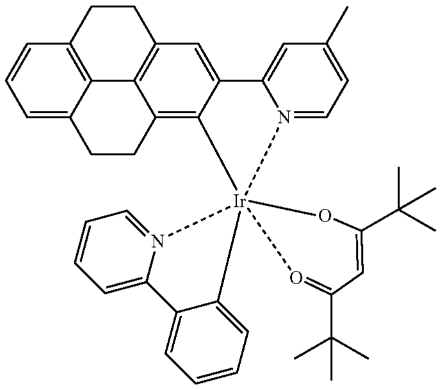
-continued
A38
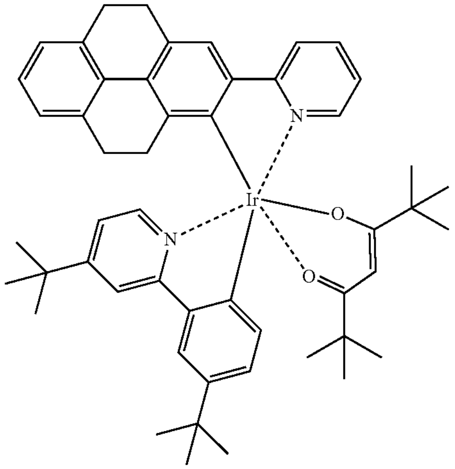
A39
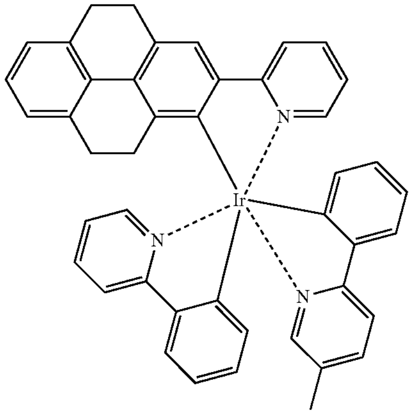
A40
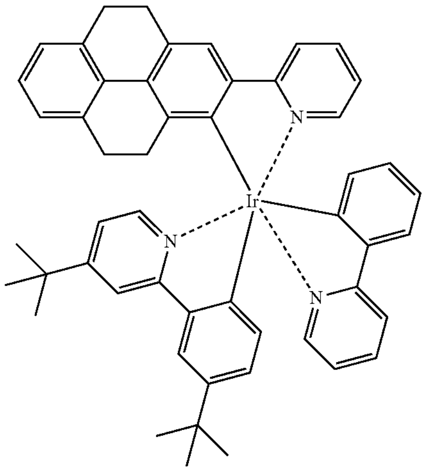

-continued
B1
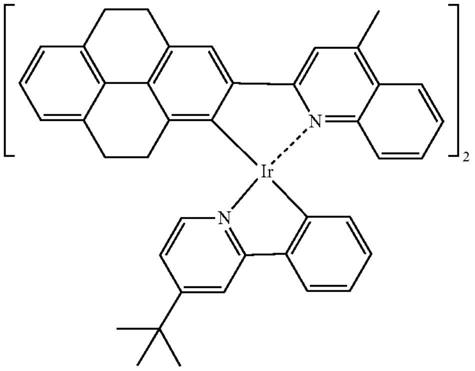
B2
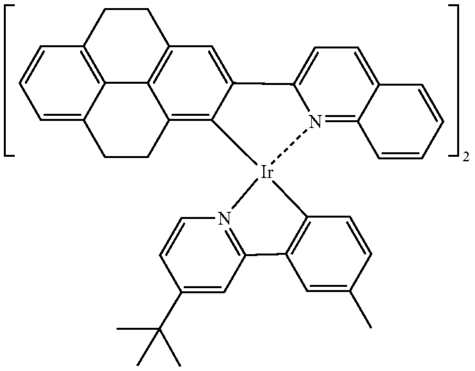
B3
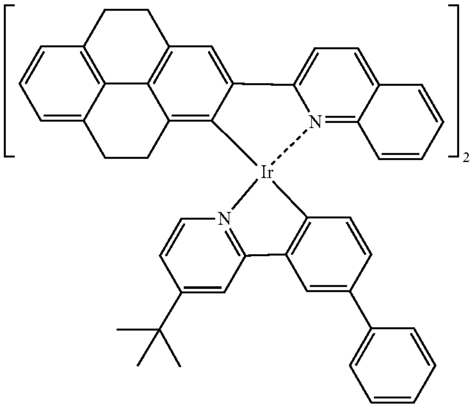
B4
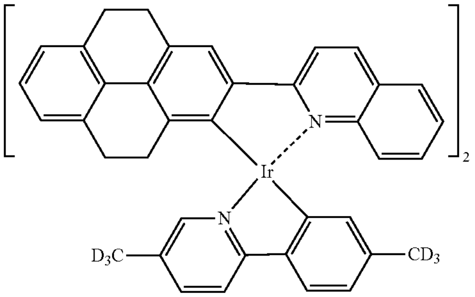
-continued
B5
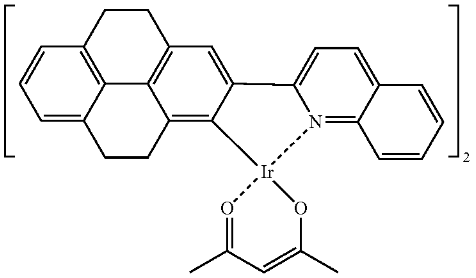
B6
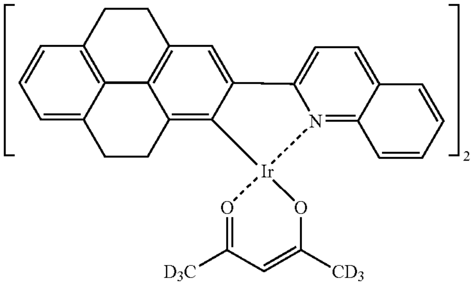
B7
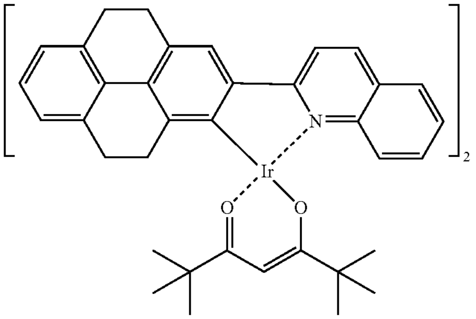
B8
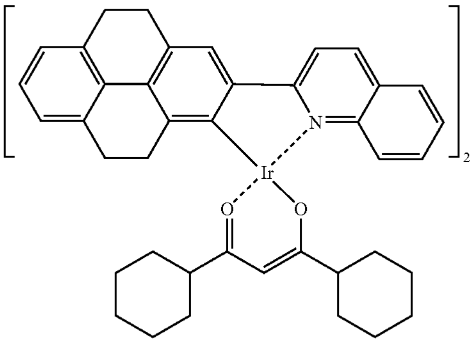

-continued
B9
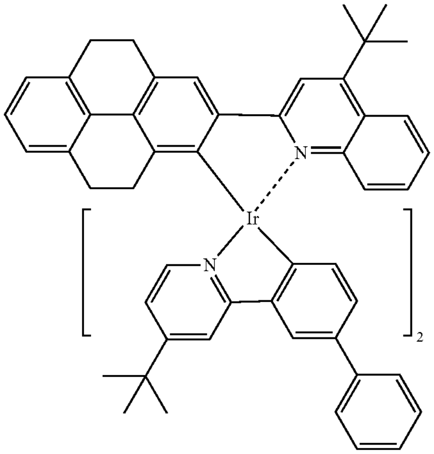
B10
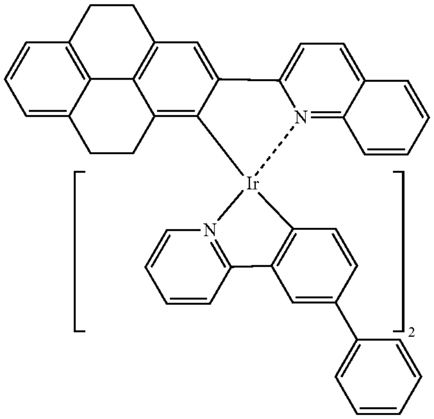
B11
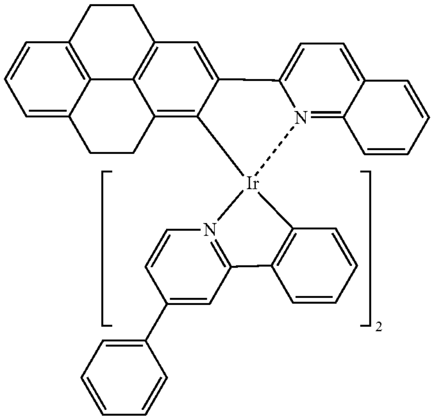
B12
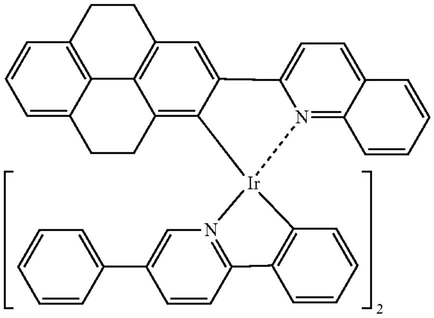
-continued
B13
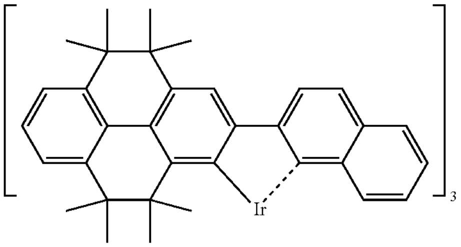
B14
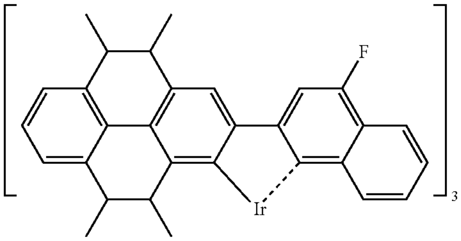
B15
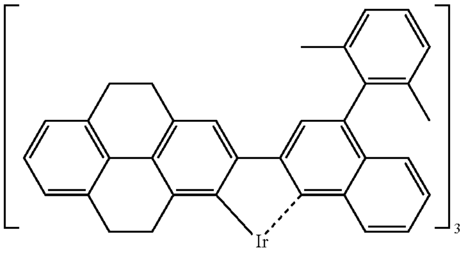
B16
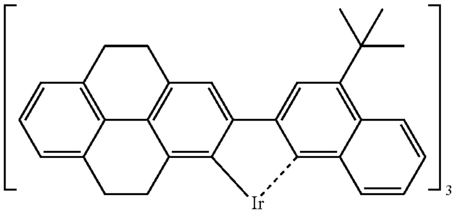
B17
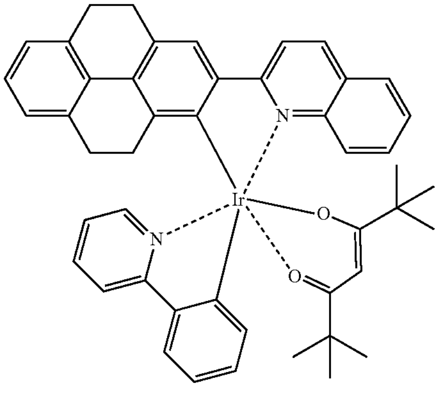

-continued
B18
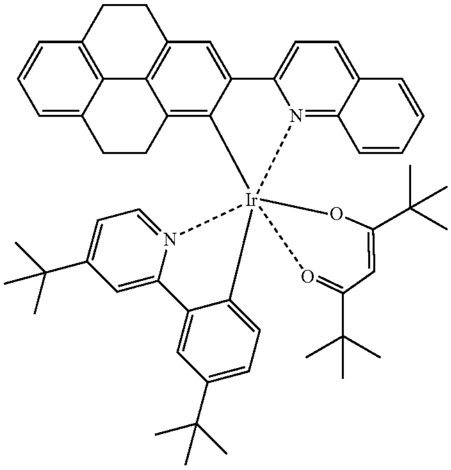
B19
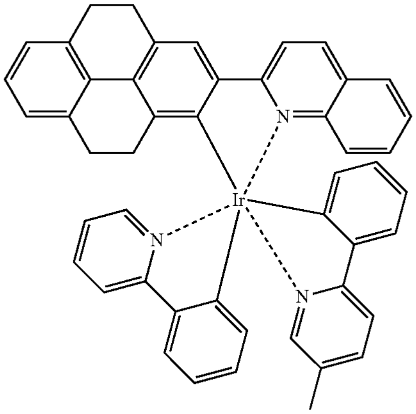
B20
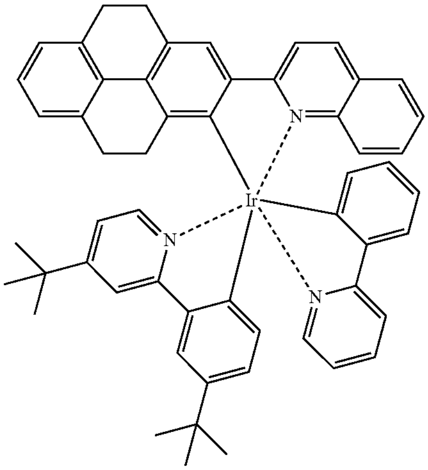
-continued
C1
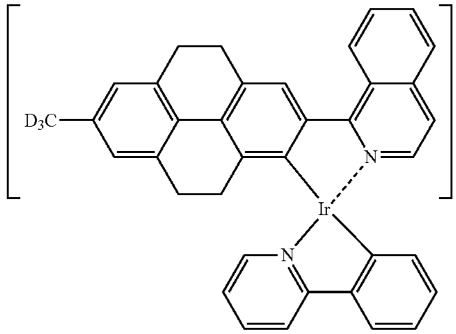
C2
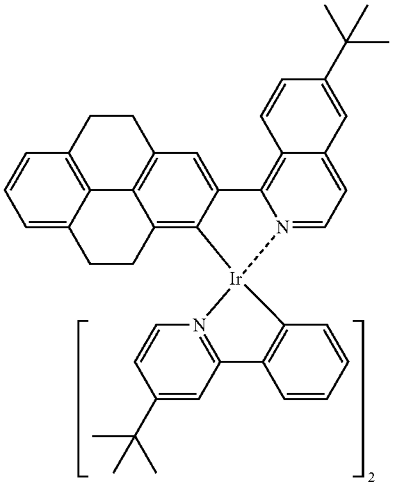
C3
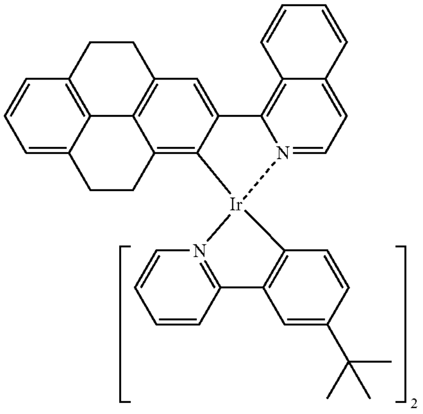
C4
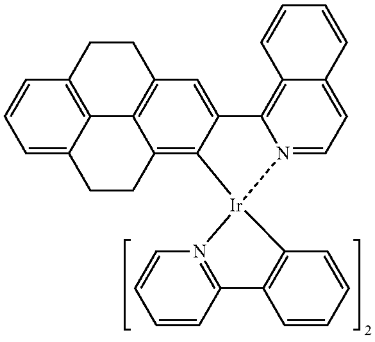

-continued
C5
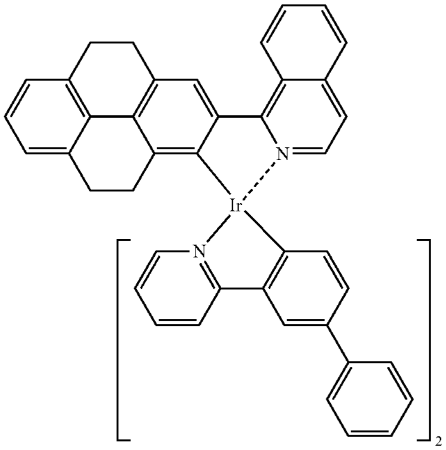
C6
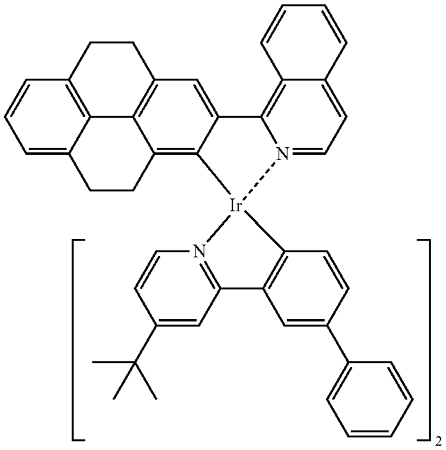
C7
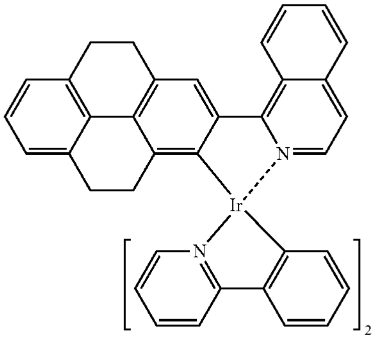
C8
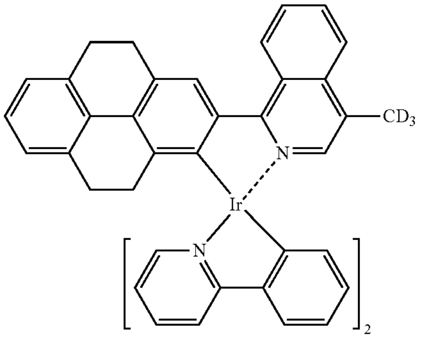
-continued
C9
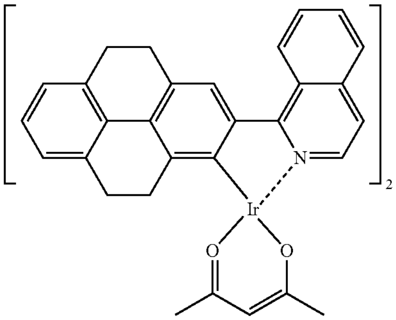
C10
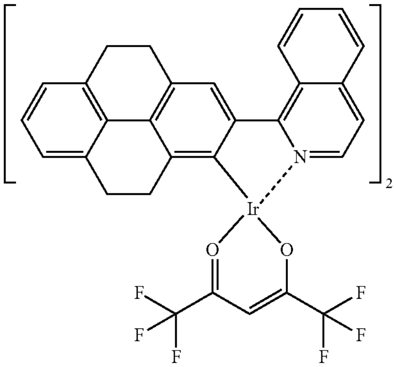
C11
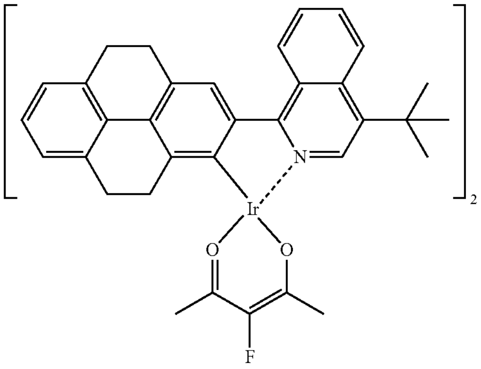
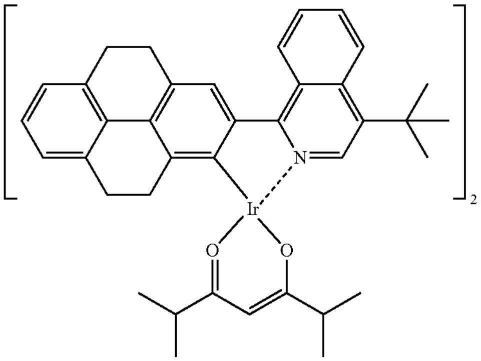

-continued
C13
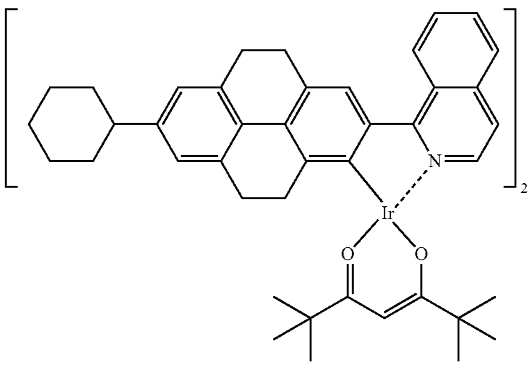
C14
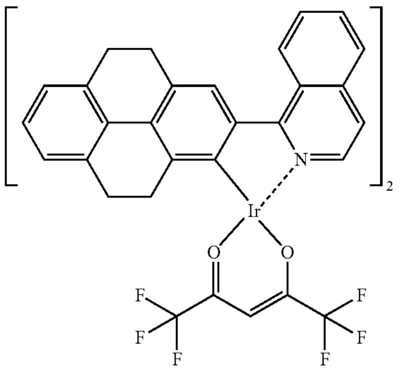
C15
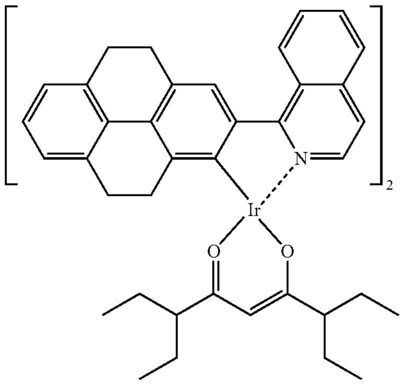
C16
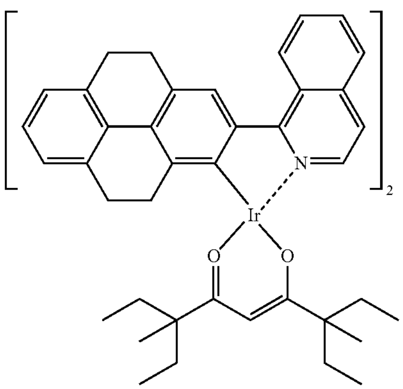
-continued
C17
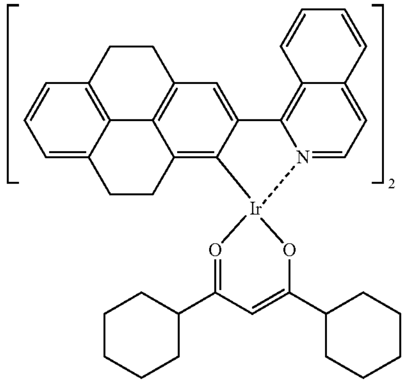
C18
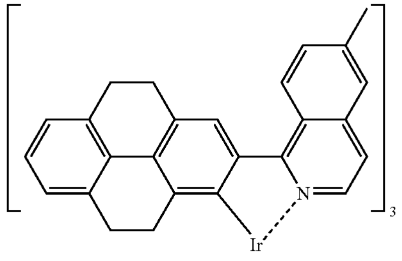
C19
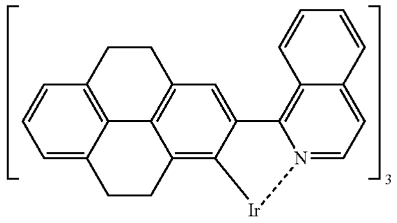
C20
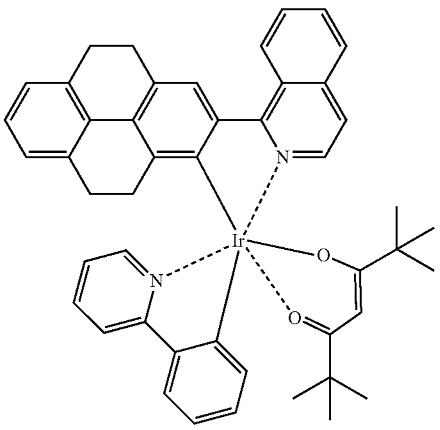

-continued
D1
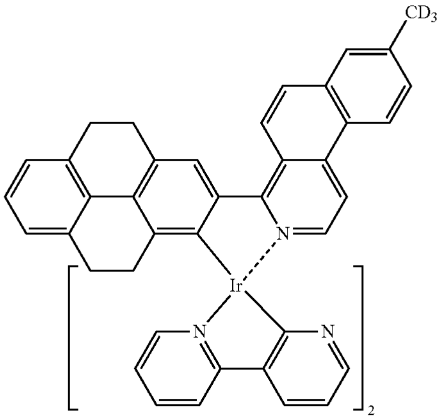
D2
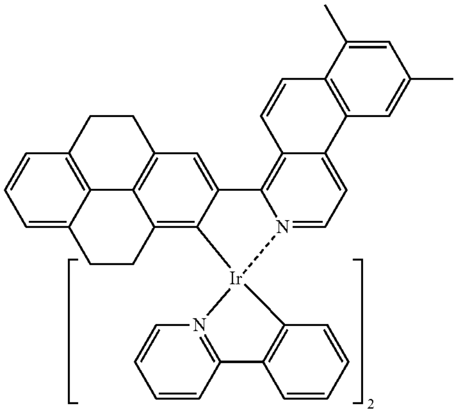
D3
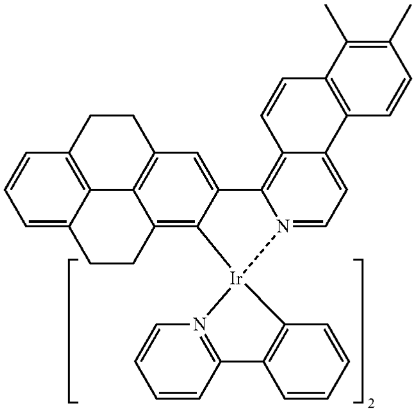
D4
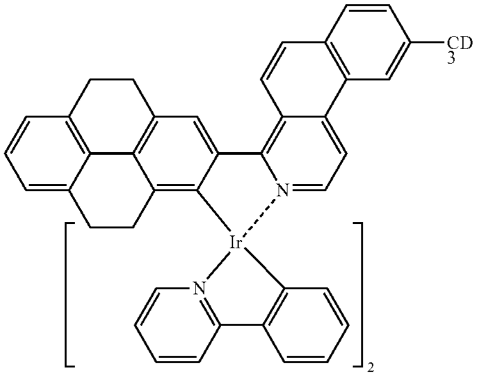
-continued
D5
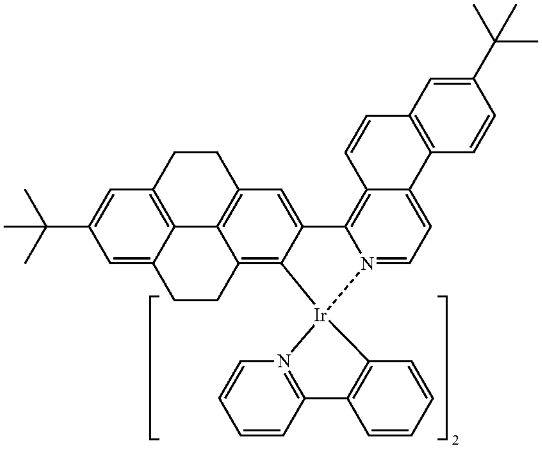
D6
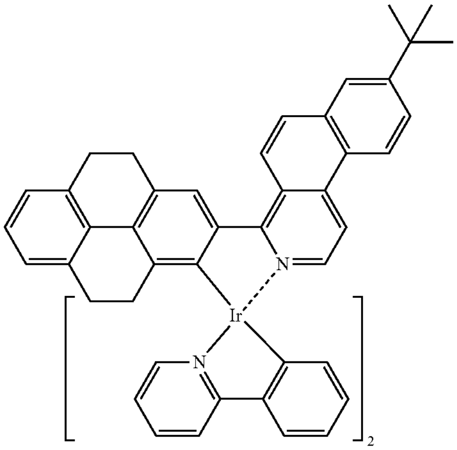
D7
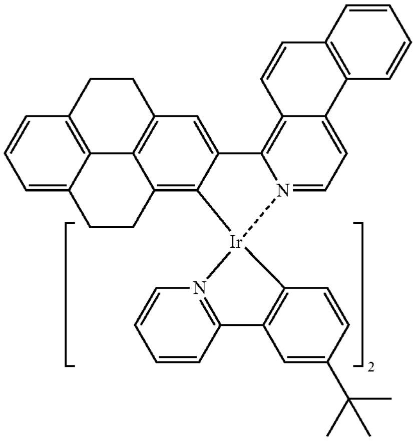

-continued
D8
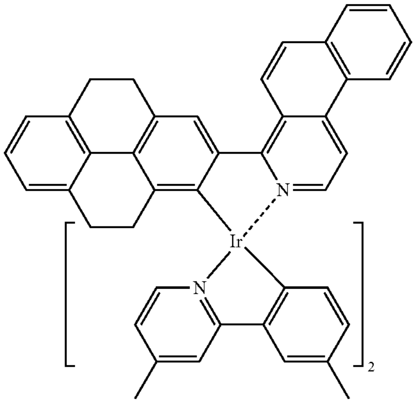
D9
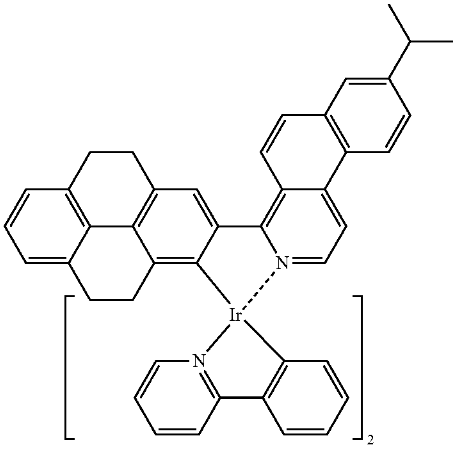
D10
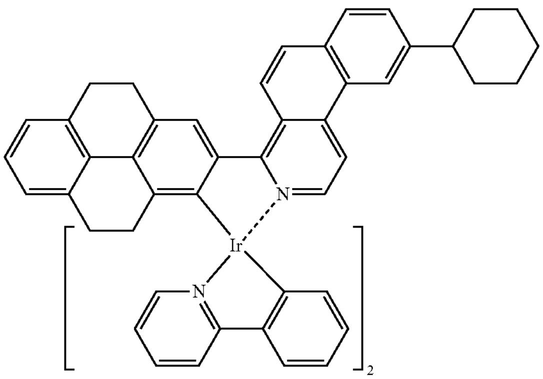
-continued
D11
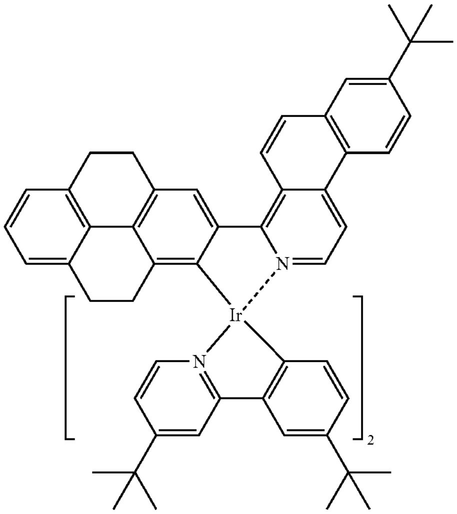
D12
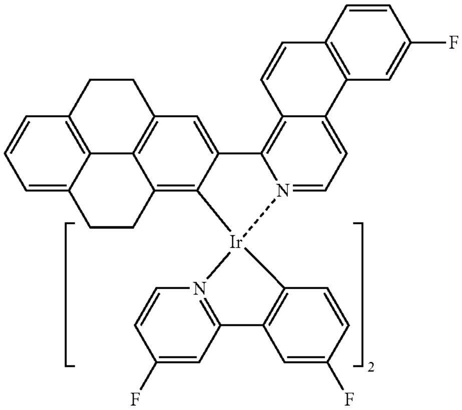
D13
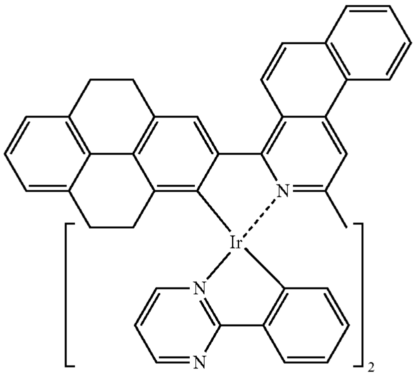

-continued
D14
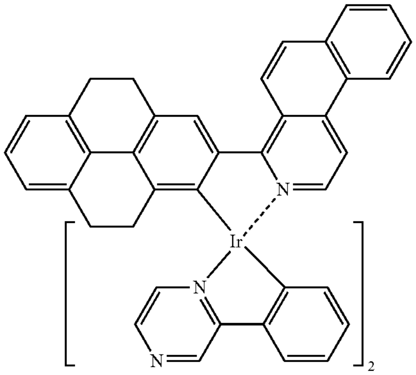
D15
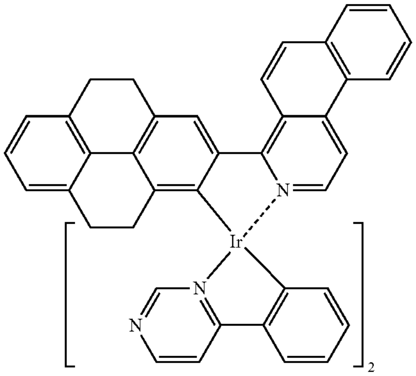
D16
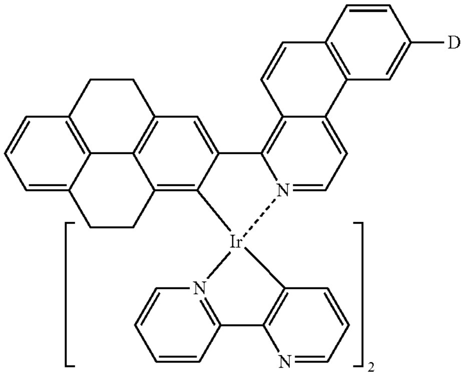
D17
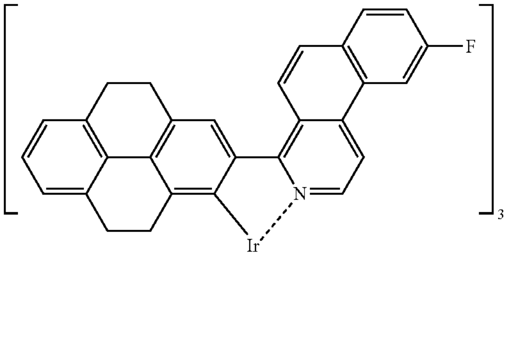
-continued
D18
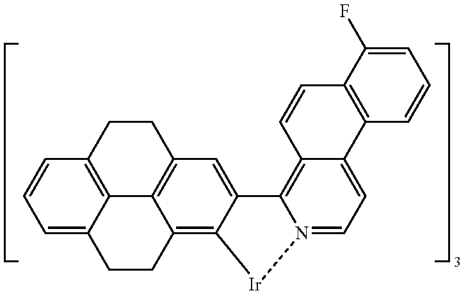
D19
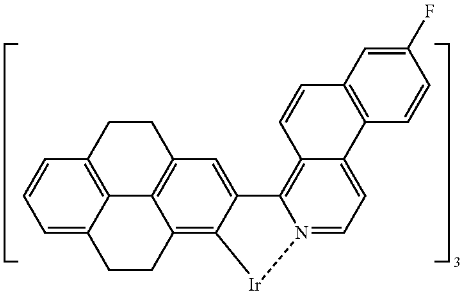
D20
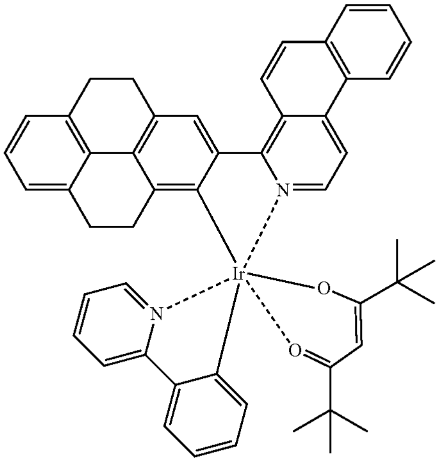
D21
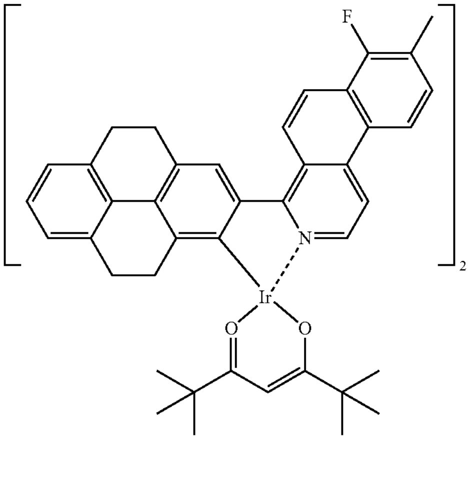

-continued
D22
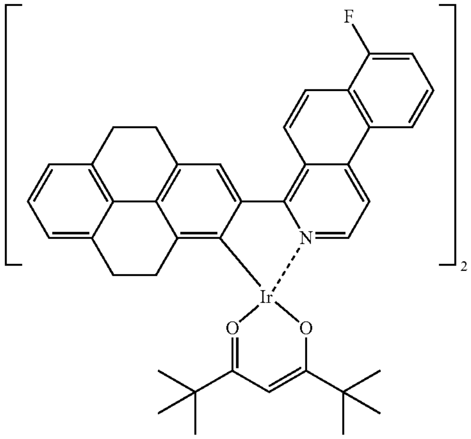
D23
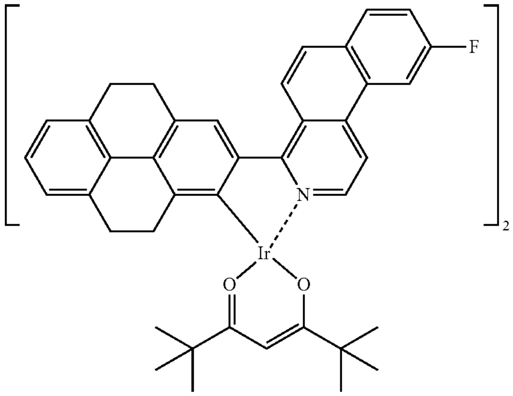
D24
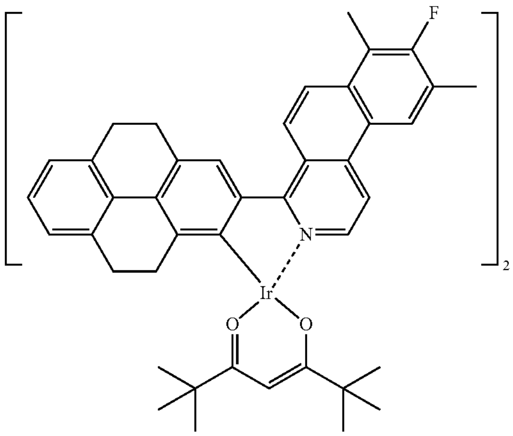
-continued
D25
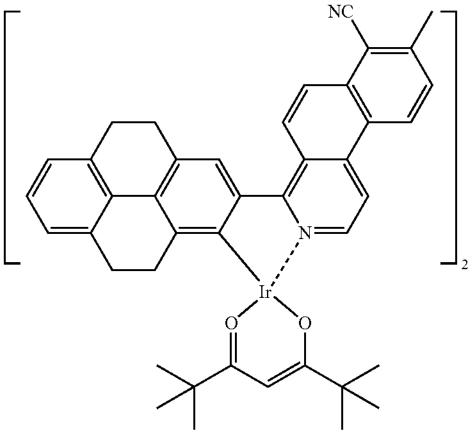
D26
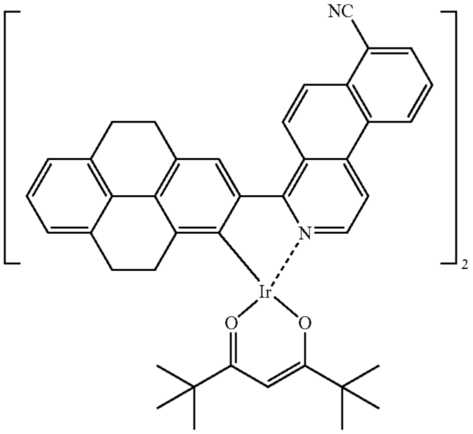
D27
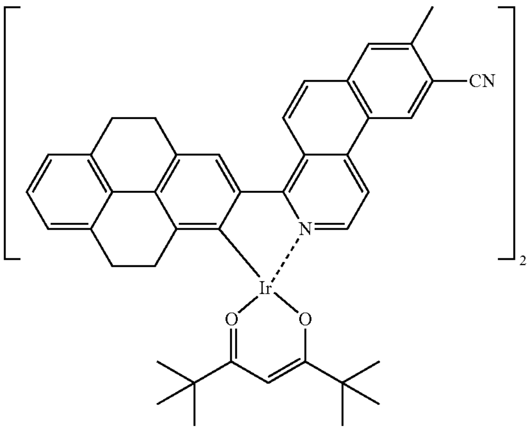

-continued
D28
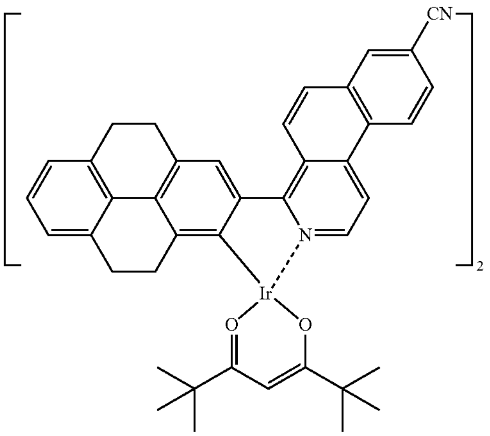
D29
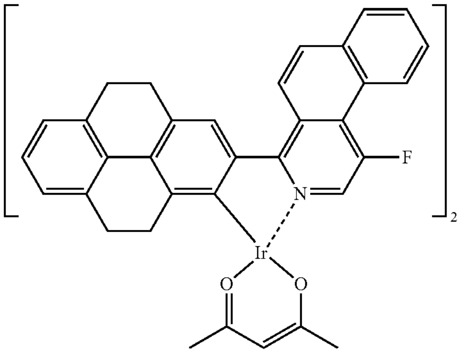
D30
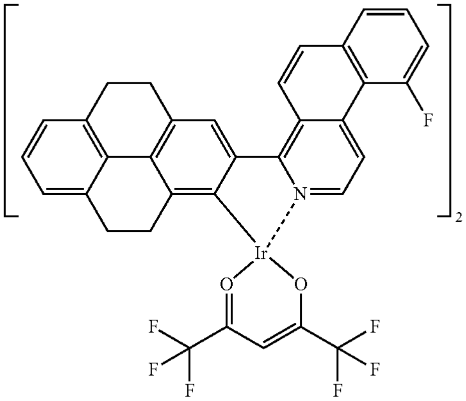
D31
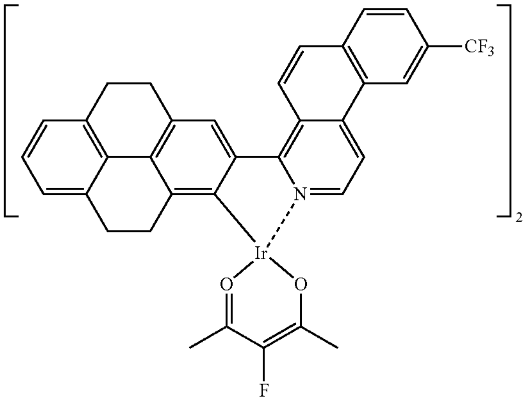
-continued
D32
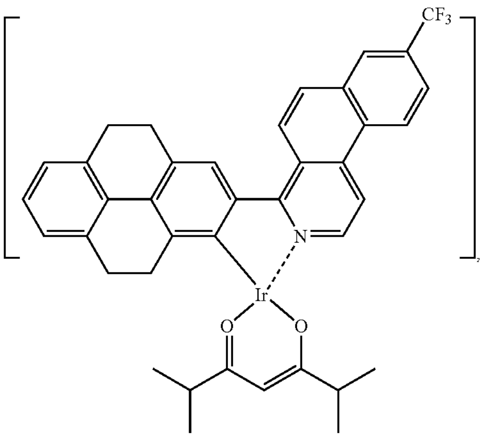
D33
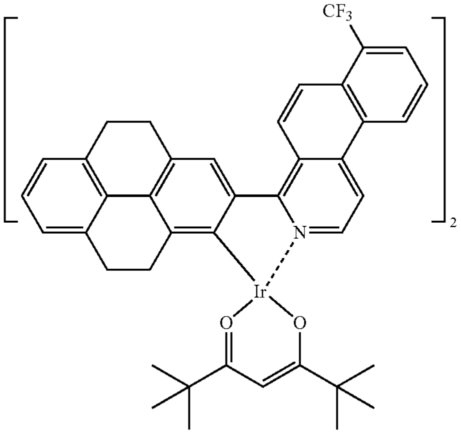
D34
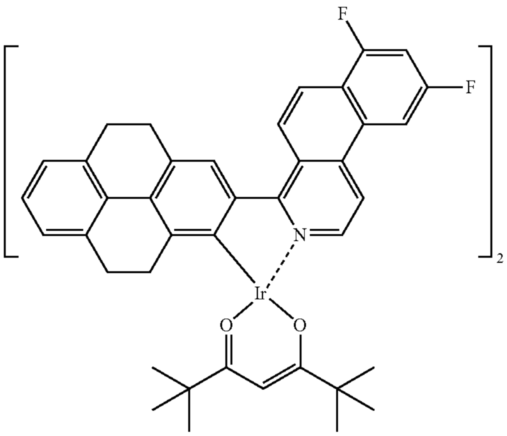

-continued
D35
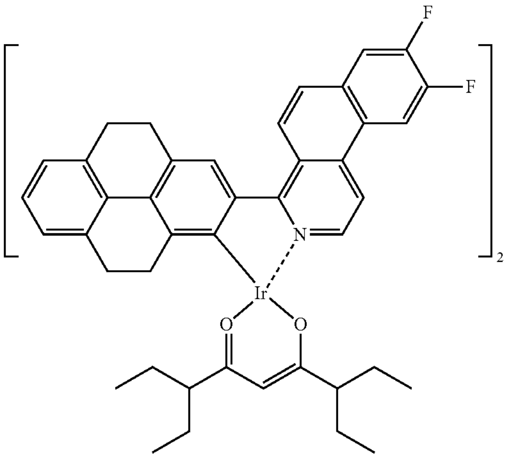
D36
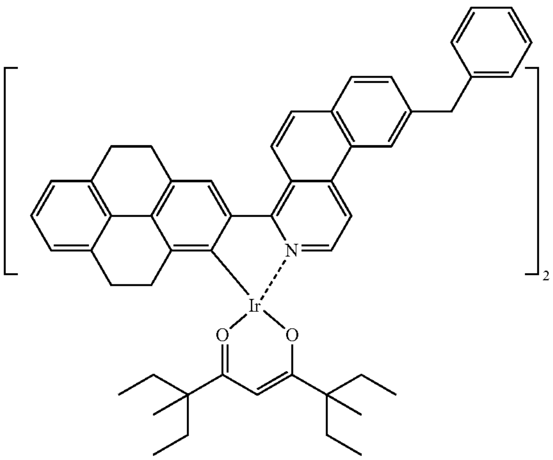
D37
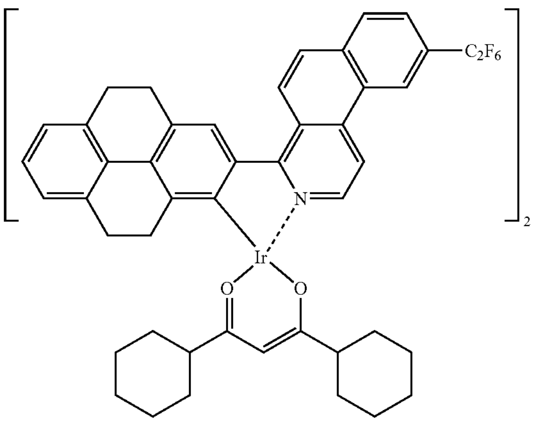
-continued
D38
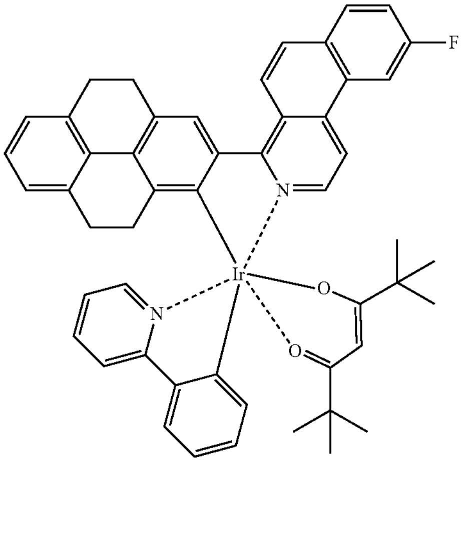
D39
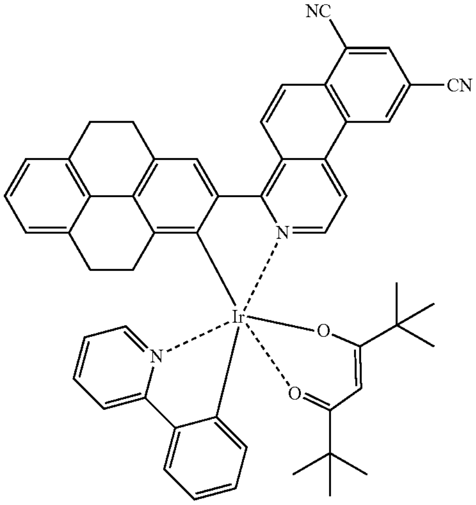
D40
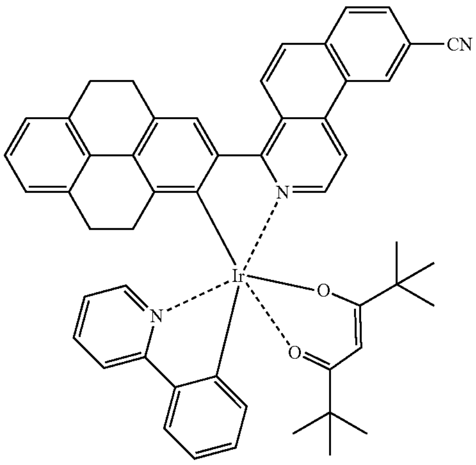

-continued
E1
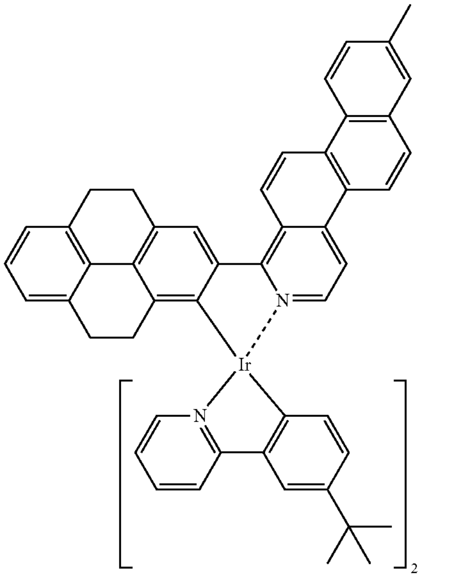
E2
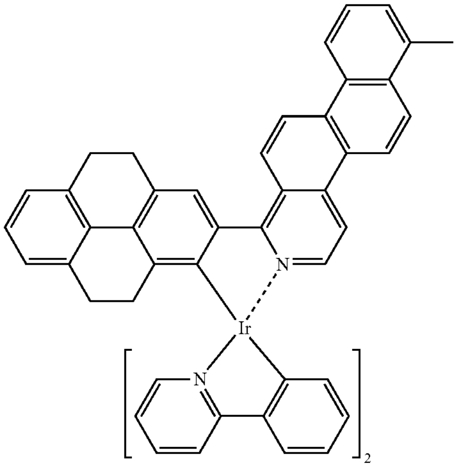
E3
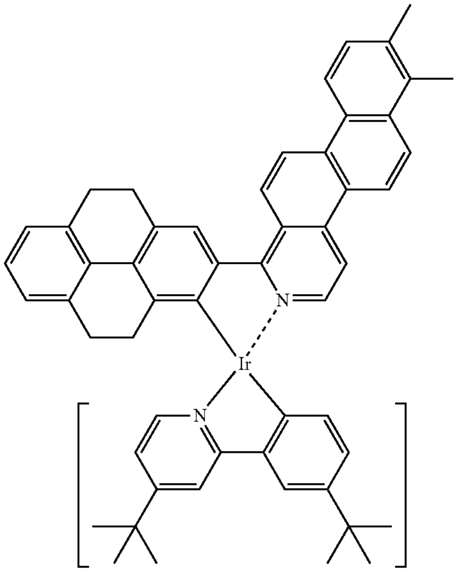
-continued
E4
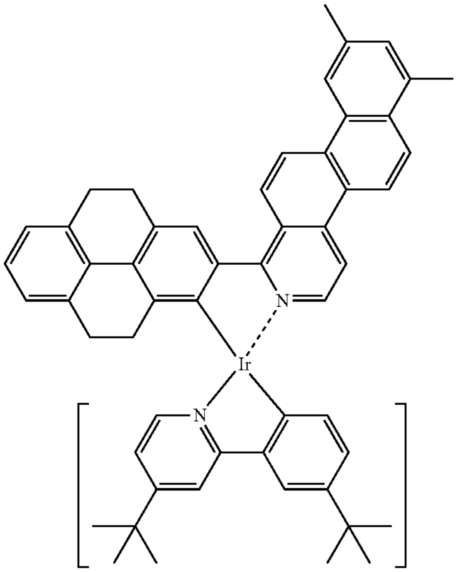
E5
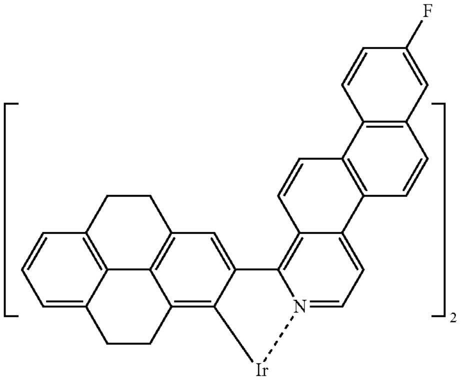
E6
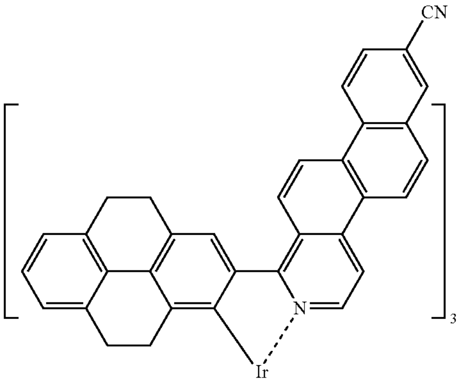

-continued
E7
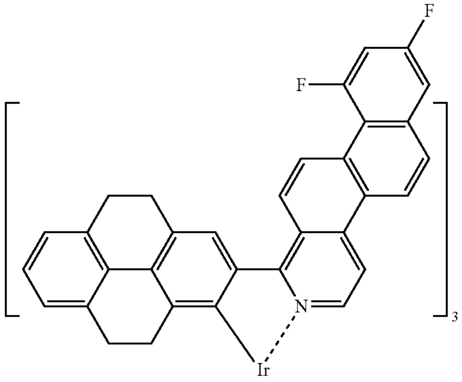
E8
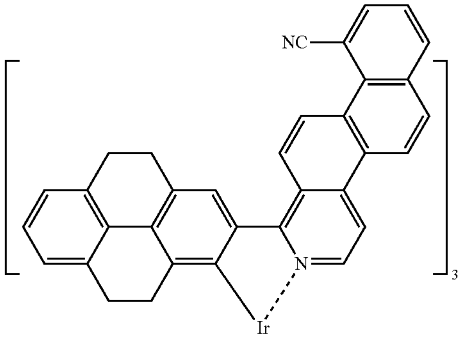
E9
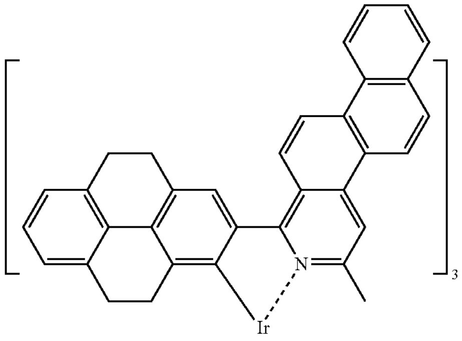
E10
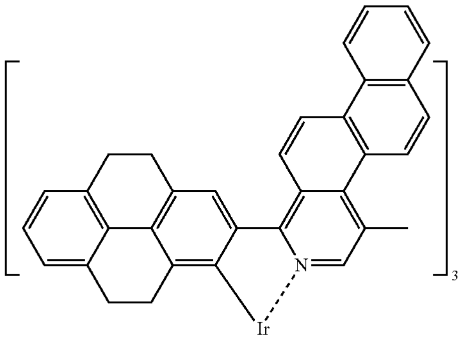
-continued
E11
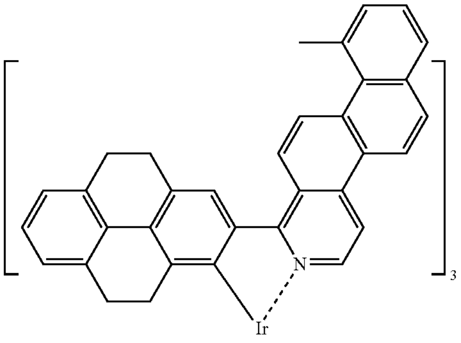
E12
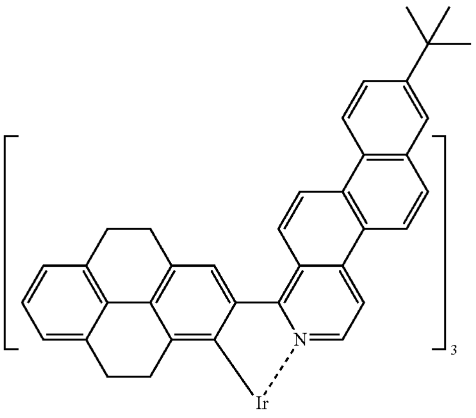
E13
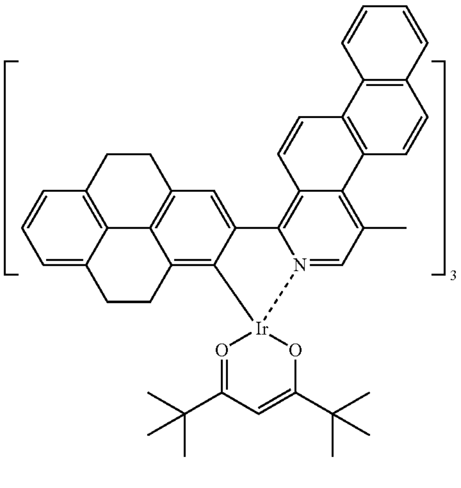

-continued
E14
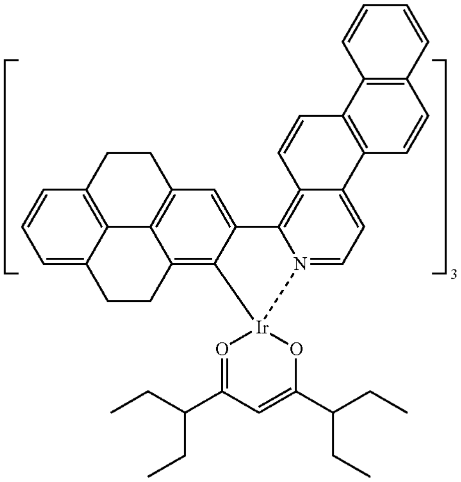
E15
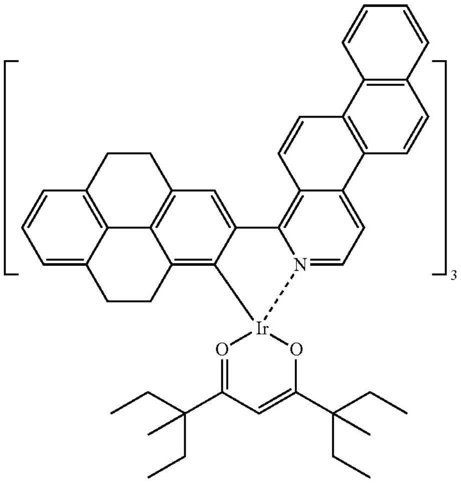
E16
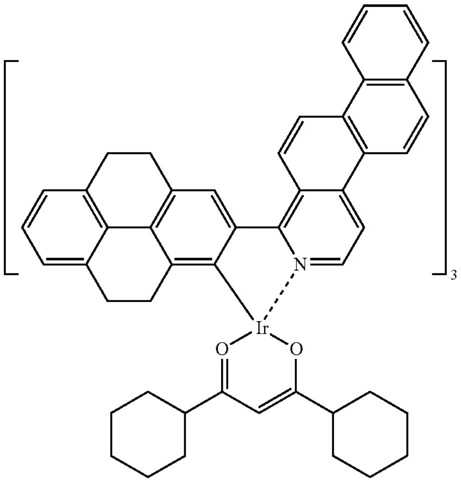
-continued
E17
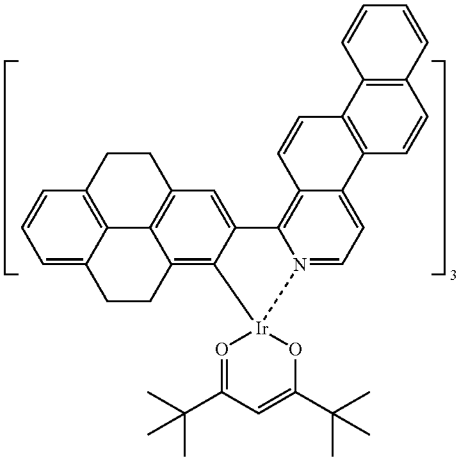
E18
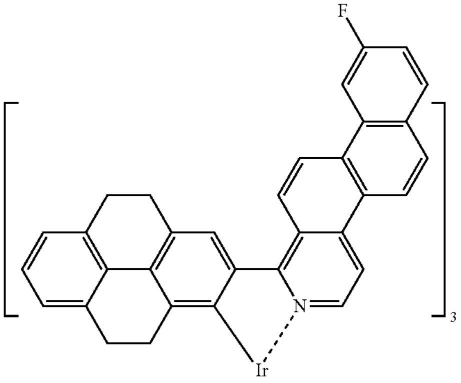
E19
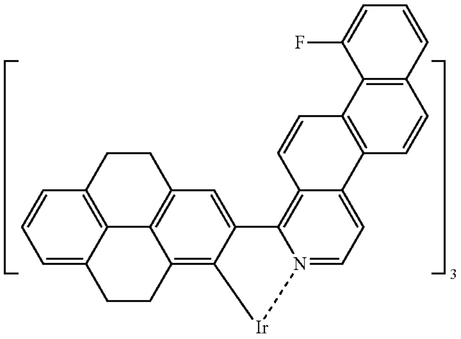

-continued

E20

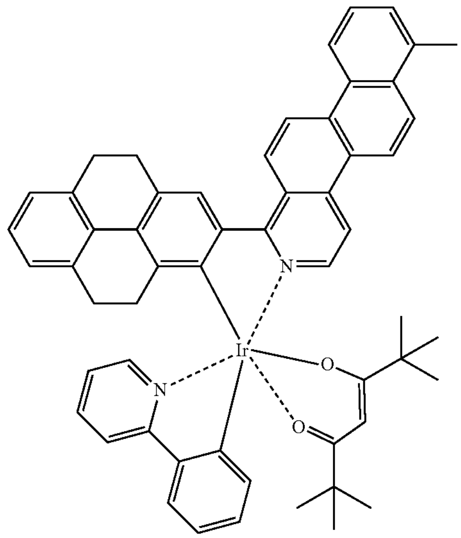

Among the above exemplary compounds, exemplary compounds (A1 to A40) belonging to group A are organic compounds represented by general formula [2] where the ring A is a pyridine ring, that is, organic compounds represented by general formula [2] where the ring A is represented by general formula [A-1]. Emission wavelengths of the exemplary compounds belonging to group A are wavelengths in the green to yellow region. Using these compounds can provide light-emitting elements in the green to yellow region. Therefore, compounds represented by general formula [2] where the ring A has a structure represented by general formula [A-1] are suitable as organic compounds for green light-emitting elements.

Among the above exemplary compounds, exemplary compounds (B1 to B20) belonging to group B are organic compounds represented by general formula [2] where the ring A is a quinoline ring, that is, organic compounds represented by general formula [2] where the ring A is represented by general formula [A-2]. Emission wavelengths of the exemplary compounds belonging to group B are wavelengths in the yellow to orange region. Using these compounds can provide light-emitting elements in the yellow to orange region.

Among the above exemplary compounds, exemplary compounds (C1 to C20) belonging to group C are organic compounds represented by general formula [2] where the ring A is an isoquinoline ring, that is, organic compounds represented by general formula [2] where the ring A is represented by general formula [A-3]. Emission wavelengths of the exemplary compounds belonging to group C are wavelengths in the orange to red region. Using these compounds can provide light-emitting elements in the orange to red region.

Among the above exemplary compounds, exemplary compounds (D1 to D40) belonging to group D are organic compounds represented by general formula [2] where the ring A is a benzoisoquinoline ring, that is, organic compounds represented by general formula [2] where the ring A is represented by general formula [A-4]. Emission wavelengths of the exemplary compounds belonging to group D are wavelengths in the orange to red region. Using these compounds can provide light-emitting elements in the orange to red region.

Among the above exemplary compounds, exemplary compounds (E1 to E20) belonging to group E are organic compounds represented by general formula [2] where the ring A is a naphthoisoquinoline ring, that is, organic compounds represented by general formula [2] where the ring A is represented by general formula [A-5]. Emission wavelengths of the exemplary compounds belonging to group E are wavelengths in the orange to red region. Using these compounds can provide light-emitting elements in the orange to red region.

Compounds represented by general formula [2] where the ring A has a structure represented by any one of general formulae [A-2] to [A-5] are suitable as organic compounds for red light-emitting elements. In particular, the ring A may have a structure represented by general formula [A-4]. This is because such a compound has an emission wavelength suitable for a red light-emitting element and exhibits properties excellent in terms of the balance with sublimability.

Organic Light-Emitting Element

Next, an organic light-emitting element according to an embodiment will be described.

Specific examples of element structures of the organic light-emitting element according to this embodiment include multilayer element structures in which electrode layers and an organic compound layer shown in (1) to (6) below are sequentially stacked on a substrate. That is, the organic light-emitting element of this embodiment at least includes a pair of electrodes, that is, a first electrode and a second electrode, and an organic compound layer disposed between the electrodes. One of the first electrode and the second electrode may be an anode, and the other may be a cathode. In any of the element structures, the organic compound layer necessarily includes a light-emitting layer containing a light-emitting material.

(1) Anode/light-emitting layer/cathode (2) Anode/hole transport layer/light-emitting layer/electron transport layer/cathode (3) Anode/hole transport layer/light-emitting layer/electron transport layer/electron injection layer/cathode (4) Anode/hole injection layer/hole transport layer/light-emitting layer/electron transport layer/cathode (5) Anode/hole injection layer/hole transport layer/light-emitting layer/electron transport layer/electron injection layer/cathode (6) Anode/hole transport layer/electron blocking layer/light-emitting layer/hole blocking layer/electron transport layer/cathode It should be noted that these exemplary element structures are merely basic element structures, and the element structure of the organic light-emitting element of the present disclosure is not limited thereto. For example, an insulating layer, an adhesive layer, or an interference layer may be disposed at the interface between an electrode and an organic compound layer. Alternatively, the electron transport layer or the hole transport layer may have a multilayered structure including two layers having different ionization potentials. The light-emitting layer may have a multilayered structure including two layers containing different light-emitting materials. That is, a first light-emitting layer that emits first light and a second light-emitting layer that emits second light may be disposed between the first electrode and the second electrode. If the first light and the second light have different colors and are converted into white light, for example, when they are combined, an organic light-emitting element that emits white light can be provided. Various other layer structures may be employed.

In this embodiment, the mode of extraction of light output from the light-emitting layer (element configuration) may be what is called a bottom-emission mode in which light is extracted from the substrate-side electrode or what is called a top-emission mode in which light is extracted from the side opposite the substrate. Alternatively, a double-side extraction mode in which light is extracted from the substrate side and the side opposite the substrate may also be employed.

Of the element structures shown in (1) to (6) above, the structure (6) may be employed because it includes both an electron blocking layer and a hole blocking layer. That is, (6) which includes an electron blocking layer and a hole blocking layer enables reliable trapping of both carriers, i.e., holes and electrons, in the light-emitting layer, and thus provides an organic light-emitting element that undergoes no carrier leakage and has high light emission efficiency.

The organic light-emitting element according to this embodiment contains the above-described organic compound represented by general formula [1] in the organic compound layer. The organic light-emitting element according to this embodiment may contain the above-described organic compound represented by general formula [1] in the light-emitting layer. The present disclosure in not limited to this configuration, and the organic compound represented by general formula [1] can be used as a constituent material of an organic compound layer other than the light-emitting layer that constitutes the organic light-emitting element according to this embodiment. Specifically, the organic compound may be used as a constituent material of, for example, the electron transport layer, the electron injection layer, the electron blocking layer, the hole transport layer, the hole injection layer, or the hole blocking layer.

In the organic light-emitting element according to this embodiment, when the organic compound represented by general formula [1] is contained in the light-emitting layer, the light-emitting layer may be a layer formed only of the organic compound represented by general formula [1]. Alternatively, the light-emitting layer may be a layer formed of the organic compound represented by general formula [1] and another compound, that is, a second organic compound. Here, when the light-emitting layer is a layer formed of the organic compound represented by general formula [1] and the other compound, the organic compound according to this embodiment may be used as a host (also referred to as a host material) or a guest (also referred to as a guest material) of the light-emitting layer. The organic compound may also be used as an assist material that can be contained in the light-emitting layer.

As used herein, the term "host" refers to a compound accounting for the largest mass proportion among the compounds constituting the light-emitting layer.

The term "guest" refers to a compound that accounts for a lower mass proportion than the host among the compounds constituting the light-emitting layer and that performs main light emission. The term "assist material" refers to a compound that accounts for a lower mass proportion than the host among the compounds constituting the light-emitting layer and that assists the light emission of the guest. The assist material is also referred to as a second host.

The host may be a material that has a higher LUMO level than the guest (a material having a LUMO level closer to the vacuum level). This allows electrons supplied to the host of the light-emitting layer to be efficiently transferred to the guest, thus improving the light emission efficiency. Furthermore, when the assist material is used as a compound different from the host and the guest, the host may be a material that has a higher LUMO level than the assist material (a material having a LUMO level closer to the vacuum level). This allows electrons supplied to the host of the light-emitting layer to be efficiently transferred to the assist material, thus enabling the assist material to perform exciton recombination. This enables efficient energy transfer to the guest.

When the energy (singlet energy) in the excited singlet state ($S_1$) of the host is $S_{h1}$, the energy (triplet energy) in the excited triplet state ($T_1$) of the host is $T_{h1}$, the energy in $S_1$ of the guest is $S_{g1}$, and the energy in $T_1$ of the guest is $T_{g1}$, $S_{h1}>S_{g1}$ may be satisfied, and $T_{h1}>T_{g1}$ may further be satisfied. Furthermore, when the energy in $S_1$ of the assist material is $S_{a1}$, and the energy in $T_1$ of the assist material is $T_{a1}$, $S_{a1}>S_{g1}$ may be satisfied, and $T_{a1}>T_{g1}$ may further be satisfied. Furthermore, $S_{h1}>S_{a1}>S_{g1}$ may be satisfied, and $T_{h1}>T_{a1}>T_{g1}$ may further be satisfied.

Here, when the organic compound represented by general formula [1] is used as a guest of the light-emitting layer, the concentration of the guest is preferably 1 mass % or more and 30 mass % or less, more preferably 5 mass % or more and 15 mass % or less, relative to the total mass of the light-emitting layer.

The present inventors have conducted various studies and found that when the organic compound represented by general formula [1] is used as a host or guest of the light-emitting layer, particularly, as a guest of the light-emitting layer, an organic light-emitting element having high light emission efficiency and high durability can be obtained.

When the organic light-emitting element according to this embodiment contains the organic compound represented by general formula [1] in the light-emitting layer, the following conditions may be satisfied regarding compounds contained in the light-emitting layer.

Two or more of the following conditions may be satisfied at the same time. Since the organic compound represented by general formula [1] may be used as a guest of the light-emitting layer as described above, the second organic compound may be a host of the light-emitting layer in the following conditions.

(3) The light-emitting layer contains the organic compound represented by general formula [1] and a second organic compound having an azine skeleton.

(4) The light-emitting layer contains the organic compound represented by general formula [1] and a second organic compound having at least one selected from the group consisting of a triphenylene structure, a phenanthrene structure, a chrysene structure, and a fluoranthene structure.

(5) The light-emitting layer contains the organic compound represented by general formula [1] and a second organic compound having at least one of a dibenzothiophene structure or a dibenzofuran structure.

(6) The light-emitting layer contains the organic compound represented by general formula [1] and a second organic compound having no sp3 carbon.

The above conditions will be described below.

(3) The Light-Emitting Layer Contains the Organic Compound Represented by General Formula [1] and a Second Organic Compound Having an Azine Skeleton.

The organic compound represented by general formula [1] is an organic compound having a tetrahydropyrene skeleton. This organic compound has a structure in which two electron-donating alkyl groups are introduced to a benzene ring coordinated to metallic Ir. Thus, the HOMO level is shallower (closer to the vacuum level) than when no electron-donating alkyl groups are introduced to the benzene ring coordinated to metallic Ir.

Thus, the second organic compound which forms the light-emitting layer together with the organic compound represented by general formula [1] may be a compound having a deep LUMO level. This is because when such a second organic compound is used, the organic compound represented by general formula [1] can perform transfer of holes injected from the hole transport layer to the light-emitting layer, and the second organic compound can perform transfer of electrons injected from the electron transport layer. As a result, carrier injection from adjacent layers to the light-emitting layer can be smoothened to prevent unnecessary charge accumulation. This can achieve low-voltage driving and improve element durability.

Here, the present inventors have found that a compound having an azine ring as a skeleton is suitable as a material having a deep LUMO level. Azine rings such as pyridine, pyrazine, pyrimidine, and triazine are electron-deficient heterocyclic rings. That is, a compound having such a structure can have a deep LUMO level.

On the other hand, the compound having an azine ring tends to have not only a deep LUMO level but also a deep HOMO level. If the HOMO level is excessively deep, the hole injectability from the hole transport layer to the light-emitting layer may decrease. Thus, in particular, the second organic compound may further have a carbazole skeleton which can suppress deepening of the HOMO level to the extent that the hole injectability can be retained. That is, in particular, the second organic compound may have a carbazole skeleton and an azine skeleton. By combining such a second organic compound with the organic compound represented by general formula [1], a light-emitting layer having good carrier injectability from the hole transport layer and the electron transport layer to the light-emitting layer while having a suitable HOMO-LUMO gap can be achieved.

An organic compound having an arylamine or carbazole skeleton alone without an azine ring has a shallow HOMO level and a shallow LUMO level. When such an organic compound is used as a second organic compound and combined with the organic compound represented by general formula [1], the whole light-emitting layer has a shallow HOMO level and a shallow LUMO level. Thus, electron injectability from the electron transport layer to the light-emitting layer may decrease. Specifically, for example, CBP (4,4'-bis(9H-carbazol-9-yl)biphenyl) is not suitable as a second compound used together with the organic compound represented by general formula [1].

(4) The Light-Emitting Layer Contains the Organic Compound Represented by General Formula [1] and a Second Organic Compound Having at Least One Selected from the Group Consisting of a Triphenylene Structure, a Phenanthrene Structure, a Chrysene Structure, and a Fluoranthene Structure.

The organic compound represented by general formula [1] is an organic compound having a tetrahydropyrene skeleton. As shown in FIG. 1, the tetrahydropyrene skeleton, in which two benzene rings are bonded to each other in a direction away from metallic Ir, has high planarity although not as high as that of a pyrene skeleton.

Thus, the second organic compound used in combination with the organic compound represented by general formula [1] may have a highly planar structure including an aromatic ring. This is because when the second organic compound has a highly planar structure, the second organic compound can approach the organic compound represented by general formula [1] due to the interaction between highly planar moieties of these organic compounds. More specifically, the planar moiety of the second organic compound readily approaches the tetrahydropyrene moiety of the organic compound represented by general formula [1]. Thus, the intermolecular distance between the organic compound represented by general formula [1] and the second organic compound can be short.

Here, triplet energy used for phosphorescent emission of an organic light-emitting element is known to undergo energy transfer through the Dexter mechanism. The Dexter mechanism is a mechanism in which energy transfer occurs upon intermolecular contact. That is, when the intermolecular distance between the host and the guest is short, energy transfer from the host to the guest is carried out efficiently.

When a highly planar organic compound is used as the second organic compound, the intermolecular distance between the organic compound represented by general formula [1] and the second organic compound is short, and energy transfer between the two compounds through the Dexter mechanism occurs more efficiently. More specifically, when the second organic compound is used as a host, the efficiency of energy transfer from the second organic compound to the organic compound represented by general formula [1] improves. As a result, an organic light-emitting element that exhibits light emission with high efficiency can be provided.

Here, the highly planar structure specifically refers to a triphenylene structure, a phenanthrene structure, a chrysene structure, and a fluoranthene structure. In particular, the second organic compound may have a triphenylene structure from the viewpoint of planarity. When a compound having at least one of these structures is used as the second organic compound and combined with the organic compound represented by general formula [1], a light-emitting element having higher efficiency can be provided.

(5) The Light-Emitting Layer Contains the Organic Compound Represented by General Formula [1] and a Second Organic Compound Having at Least One of a Dibenzothiophene Structure or a Dibenzofuran Structure.

Figure 2:
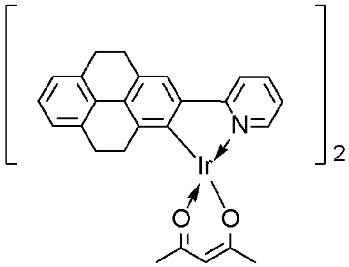
FIG. 2 shows the structure, HOMO, and LUMO of an exemplary compound.
Figure 2:
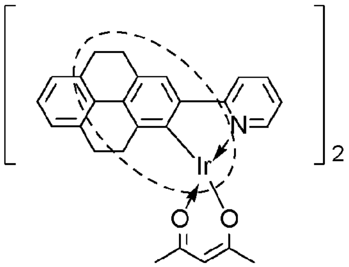
Figure 2:
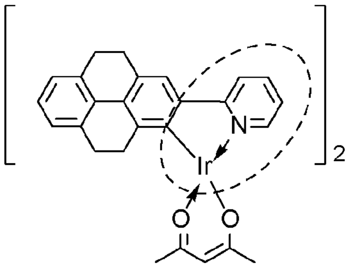

The organic compound represented by general formula [1] is an organic compound including a ligand having a tetrahydropyrene skeleton. Thus, as shown in FIG. 2, the HOMO region formed by the ligand and metallic Ir has a characteristic molecular orbital in which conjugation does not extends to an end of the tetrahydropyrene moiety.

In the case of this molecular orbital of HOMO, the end portion of the tetrahydropyrene skeleton is left as an unoccupied orbital, and thus the hole transportability is lower than in the case where conjugation extends to the end portion of the tetrahydropyrene skeleton.

To compensate this hole transportability, the second organic compound used in combination with the organic compound represented by general formula [1] may be a compound having a skeleton with high hole transportability. The skeleton with high hole transportability refers to a skeleton rich in unshared electron pairs and having strong electron-donating properties. Specific examples include skeletons having electron-donating nitrogen atoms, such as carbazole described in (3) above, and skeletons having chalcogen atoms rich in unshared electron pairs, such as a dibenzothiophene structure and a dibenzofuran structure.

Of these, the second organic compound that can be suitably used with the organic compound represented by general formula [1] may have at least one skeleton selected from a dibenzothiophene structure and a dibenzofuran structure. The skeletons of a dibenzothiophene structure and a dibenzofuran structure are less likely to have an extremely shallow HOMO, and thus can control the hole-electron carrier balance and is suitable as a skeleton for compensating the hole transportability of the organic compound represented by general formula [1]. In particular, the second organic compound may have a dibenzothiophene structure rich in unshared electron pairs.

(6) The Light-Emitting Layer Contains the Organic Compound Represented by General Formula [1] and a Second Organic Compound Having No sp3 Carbon.

As described in (4) above, when the intermolecular distance between the organic compound represented by general formula [1] and a second organic compound is short, the light-emitting properties of the organic light-emitting element can be improved. When the second organic compound is a material having no sp3 carbon, the intermolecular distance between the second organic compound and the organic compound represented by general formula [1] can be shorter.

When sp3 carbon is present, the intermolecular distance between the organic compound represented by general formula [1] and the second organic compound becomes longer due to hydrophobic interaction and steric hindrance caused by an alkyl group. By contrast, when no sp3 carbon is present, the hydrophobic interaction and steric hindrance due to an alkyl group will not occur, thus causing no increase in intermolecular distance to thereby achieve a short intermolecular distance between the second organic compound and the organic compound represented by general formula [1]. As a result, the light-emitting properties of the organic light-emitting element can be improved.

Specific examples of second organic compounds according to this embodiment, more specifically, specific examples of compounds suitable as host materials are shown below. However, the present disclosure is not limited thereto.

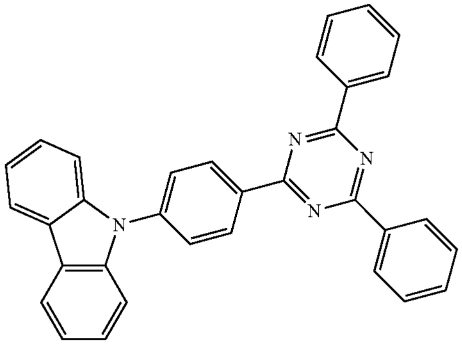

AA1

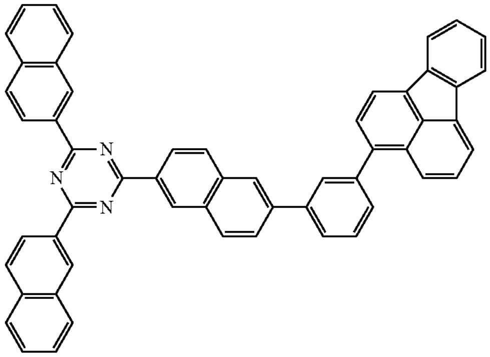

AA2

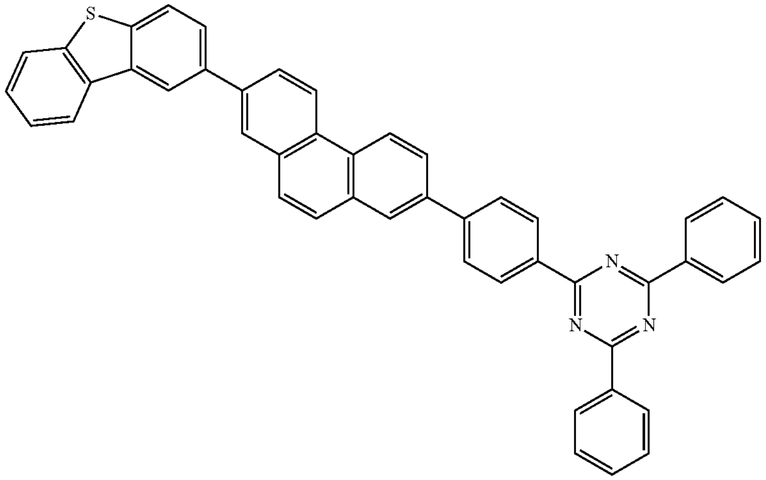

AA3

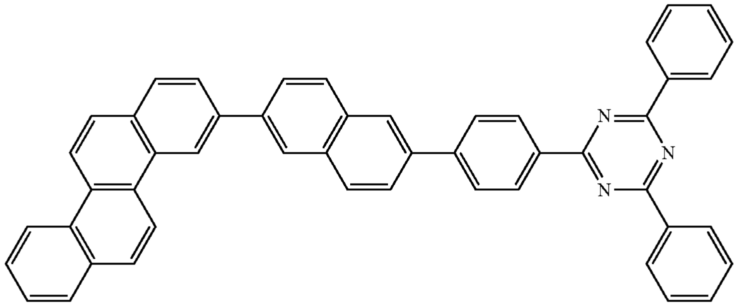

AA4

-continued
AA5
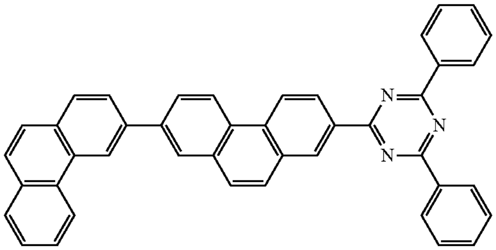
AA6
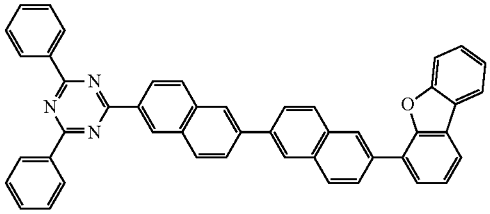
AA7
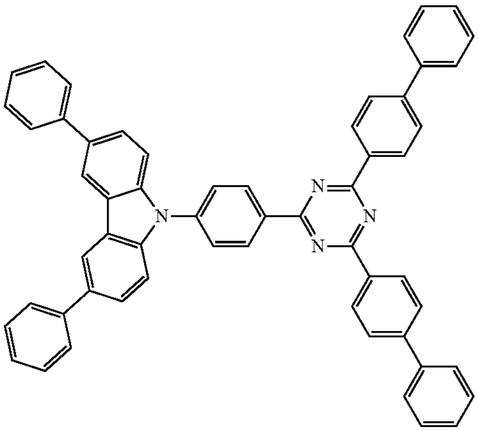
AA8
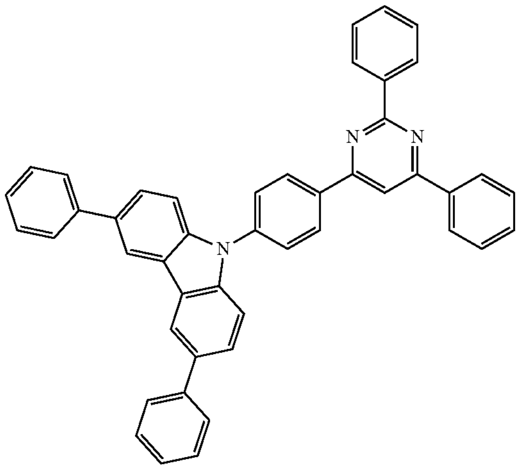
AA9
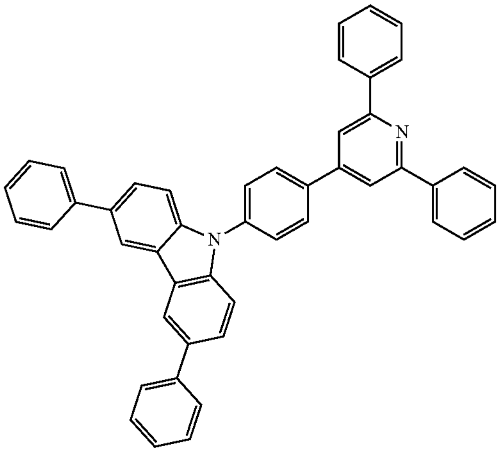
AA10
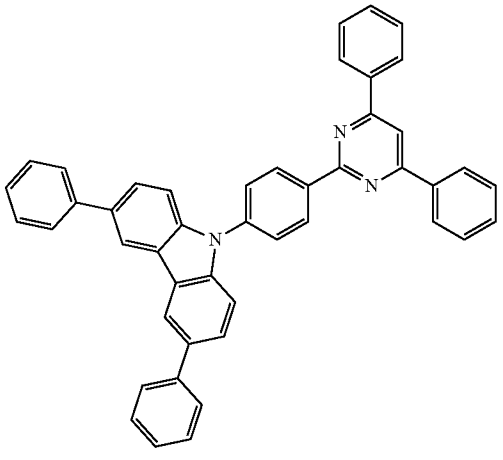
AA11
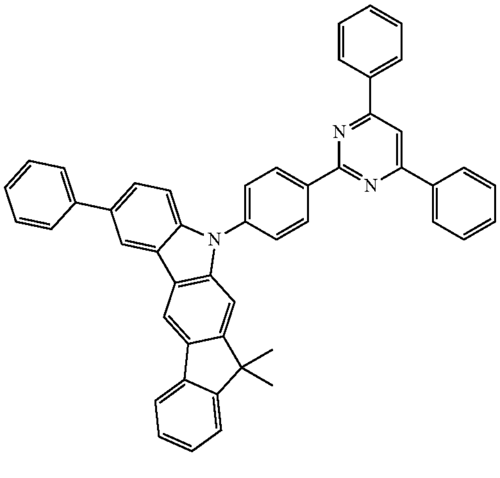
AA12.
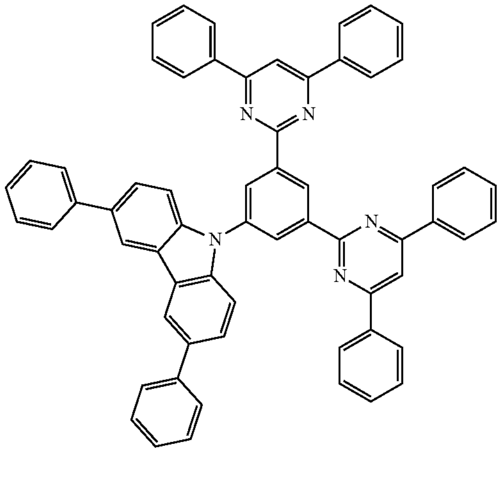

-continued
AA13
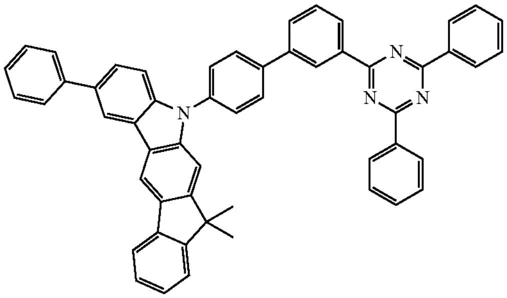
AA14
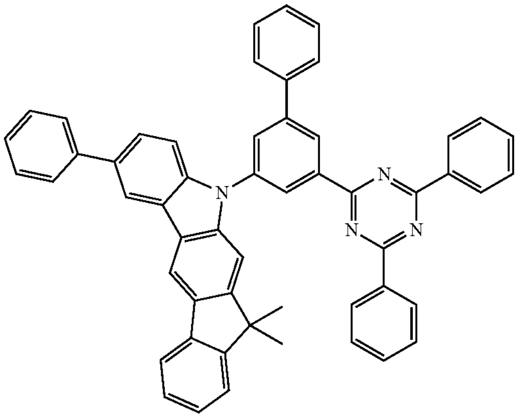
AA15
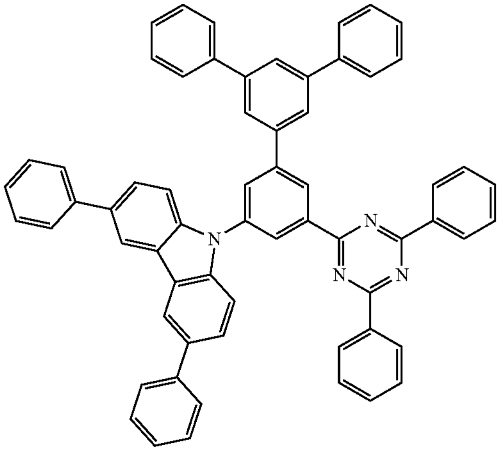
AA16
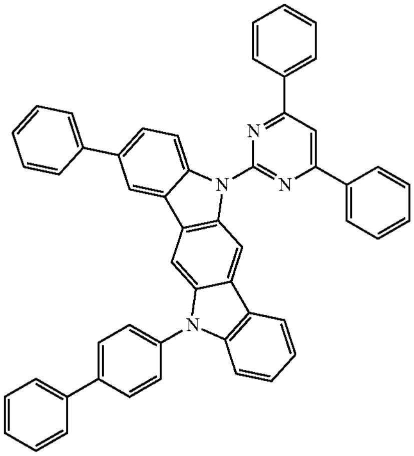
AA17
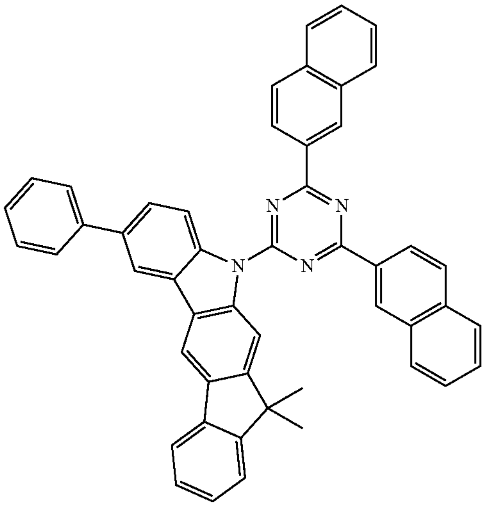
AA18
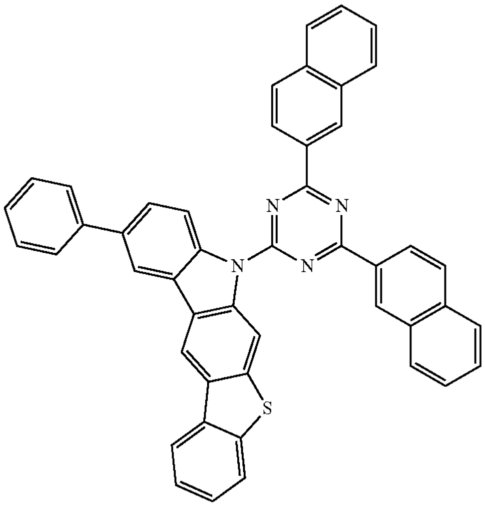

-continued
AA19
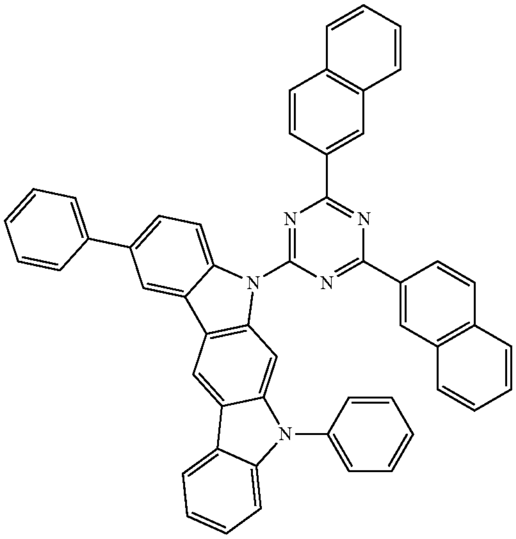
AA20
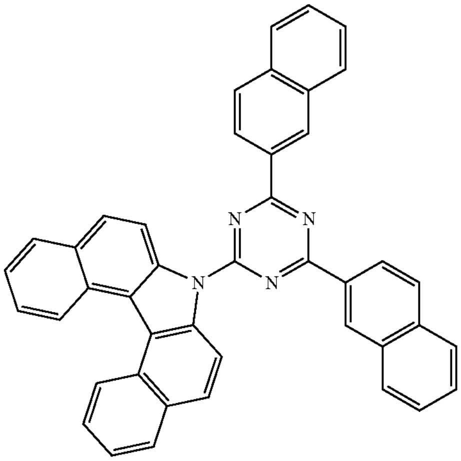
AA21
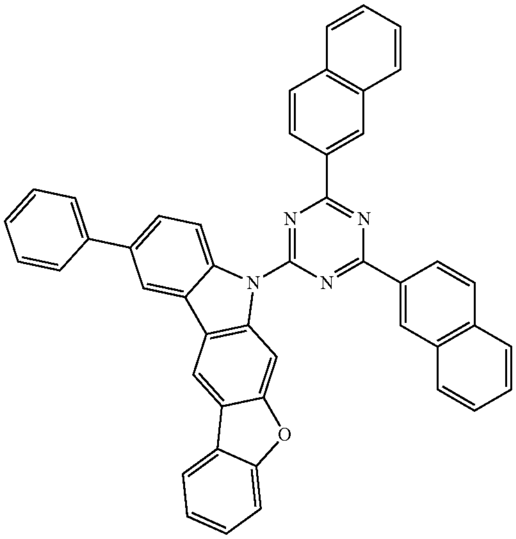
BB1
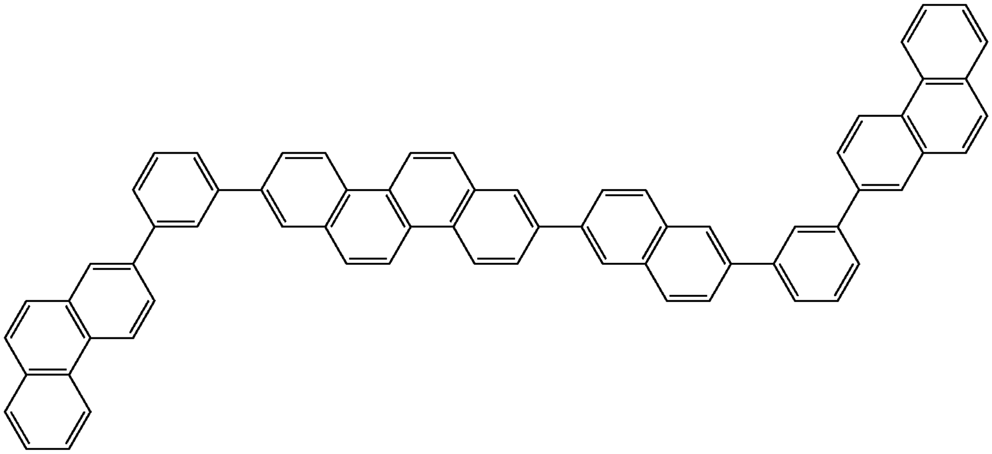

-continued
BB2
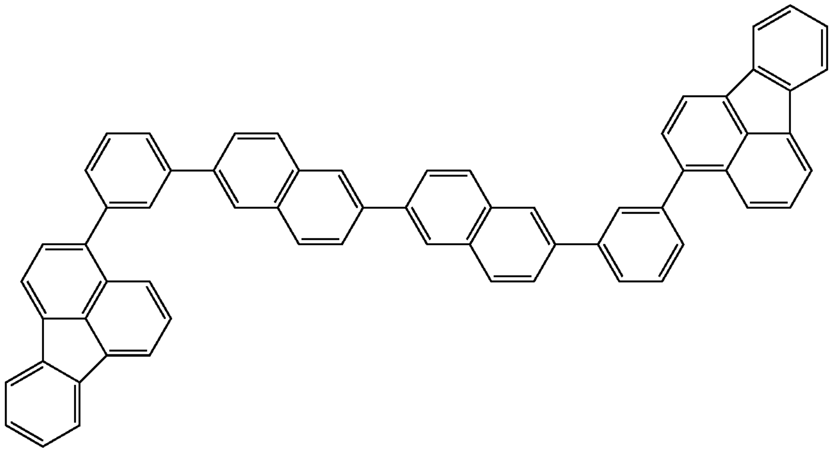
BB3
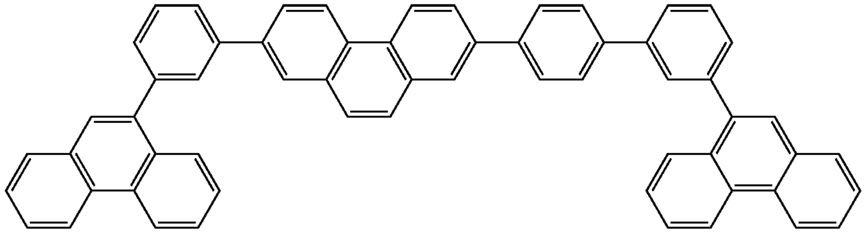
BB4
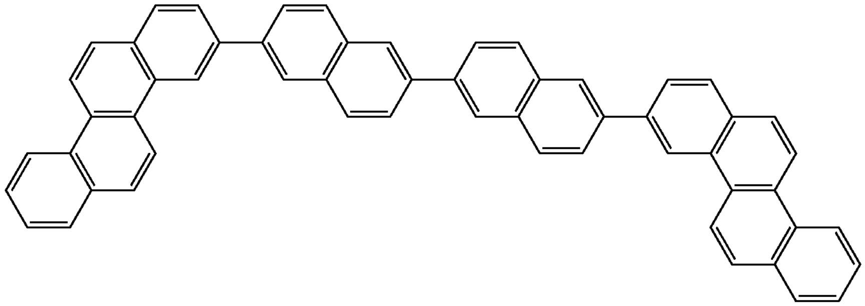
BB5
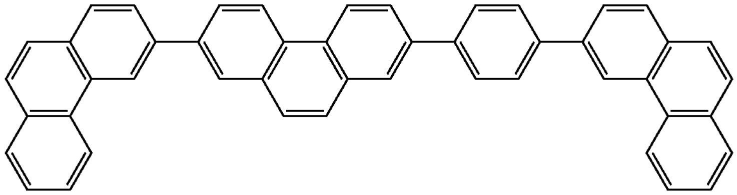
BB6
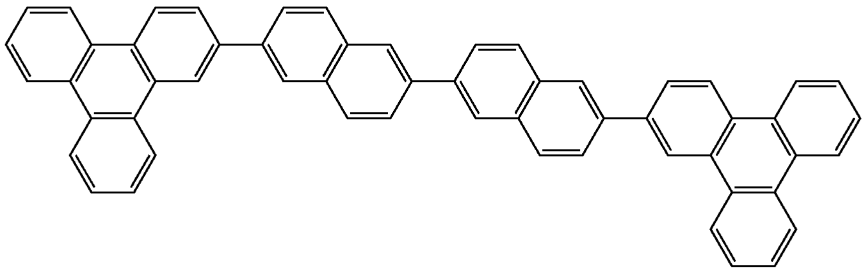

-continued
BB7
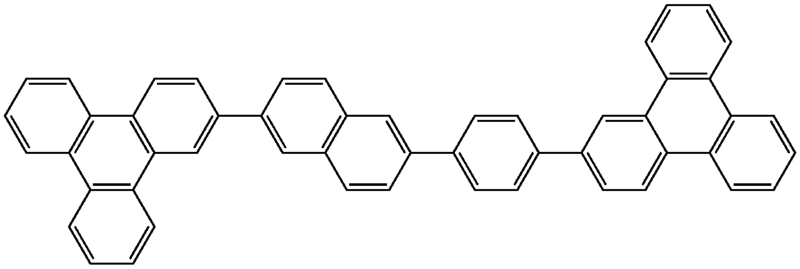
BB8
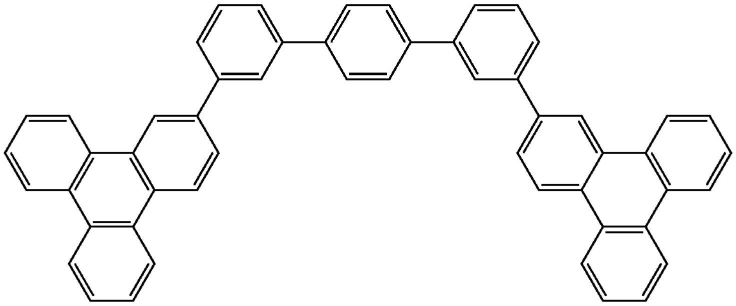
BB9
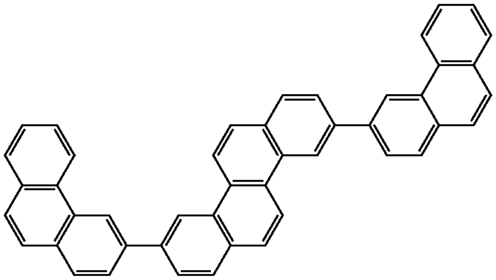
BB10
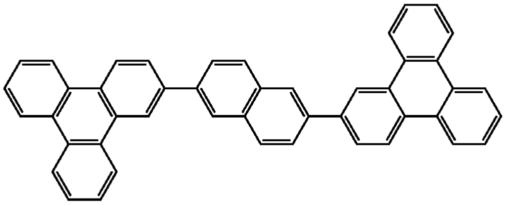
BB11
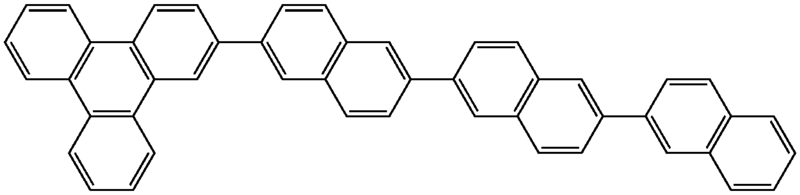
BB12
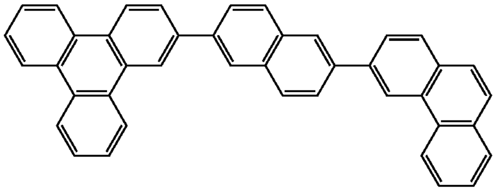
BB13
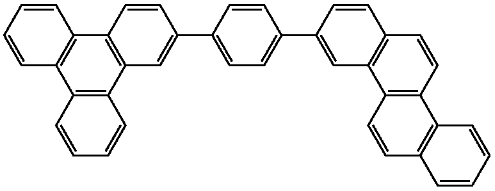
BB14
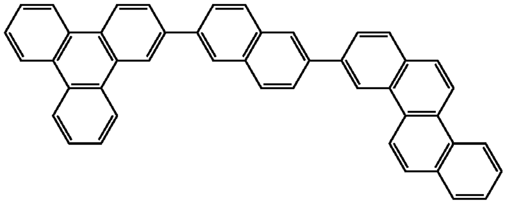
BB15
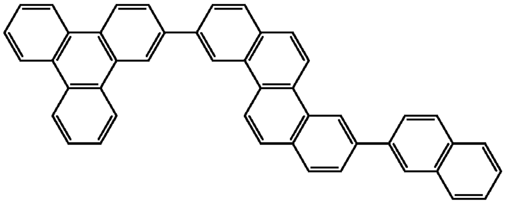

-continued
BB16
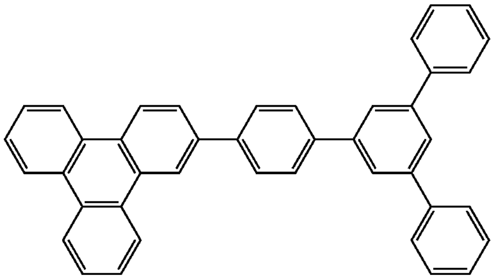
BB17
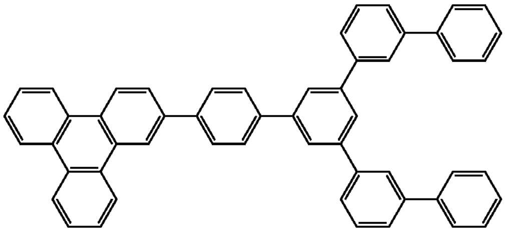
BB18
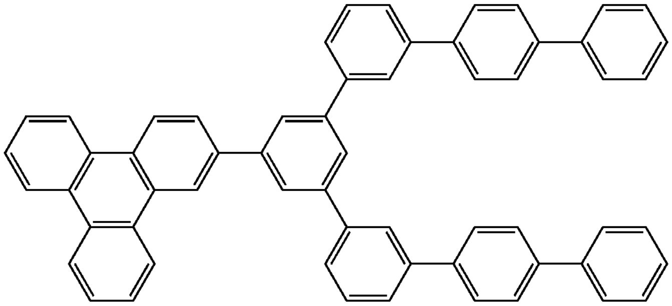
BB19
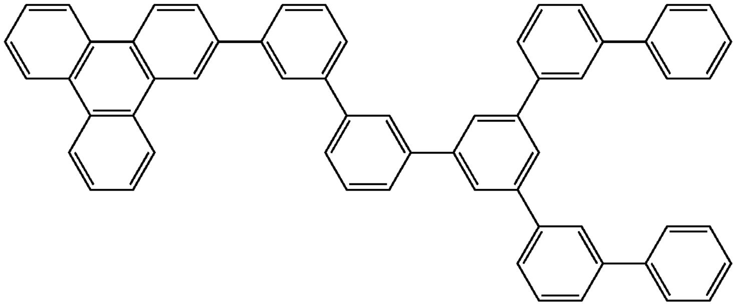
BB20
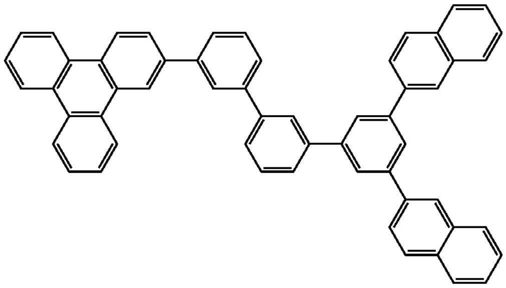
BB21
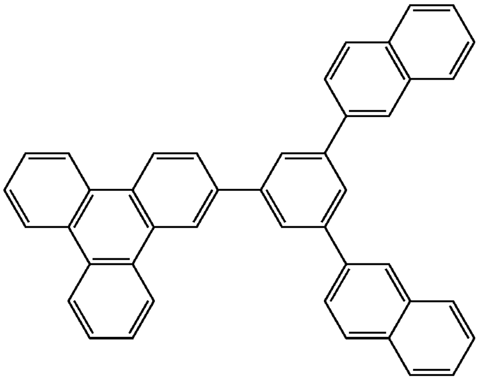

-continued
BB22
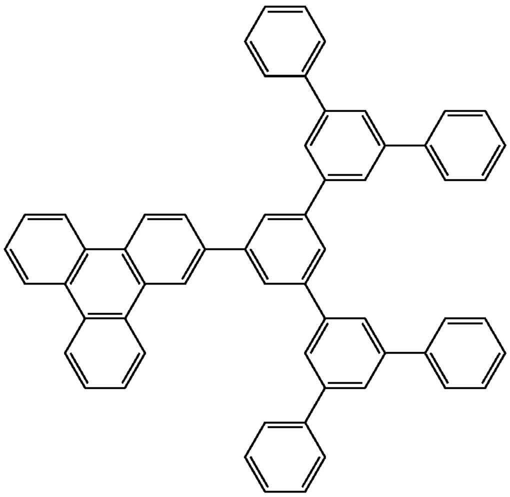
BB23
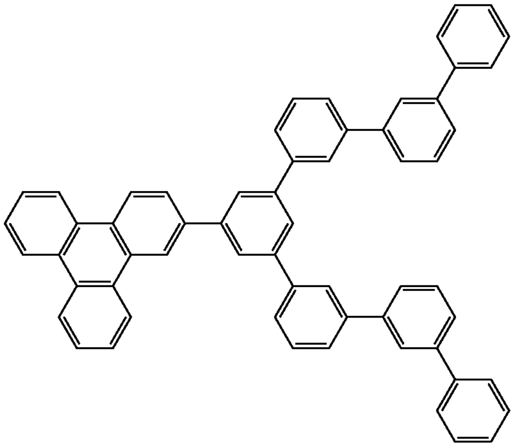
BB24
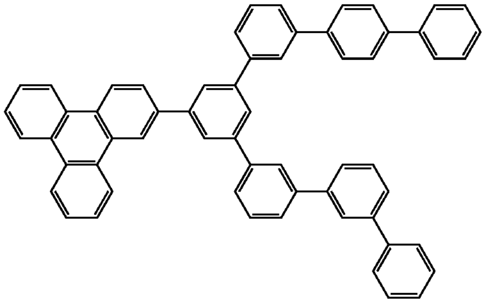
BB25
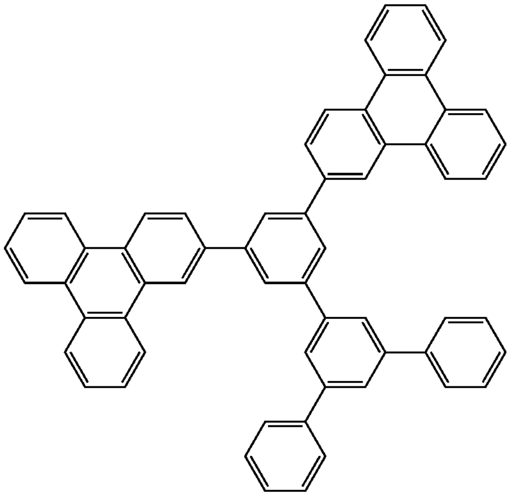
BB26
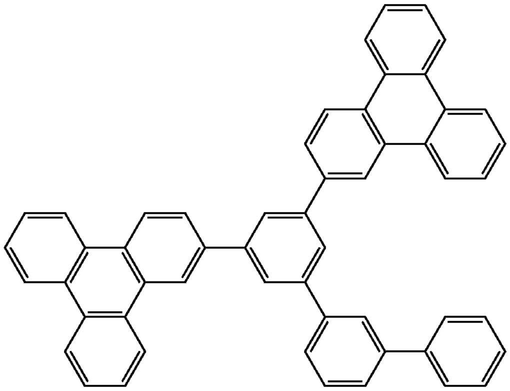
BB27
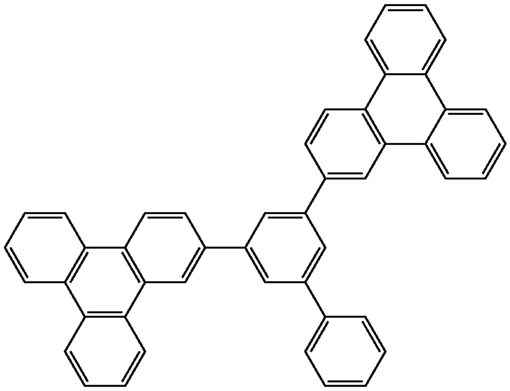

-continued
BB28
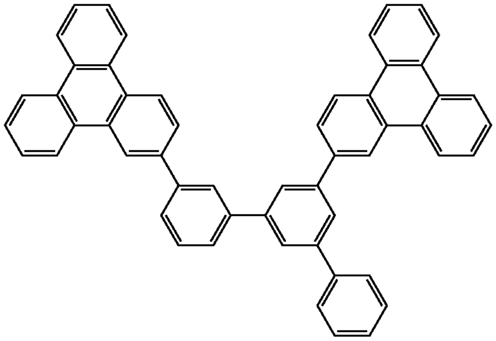
BB29
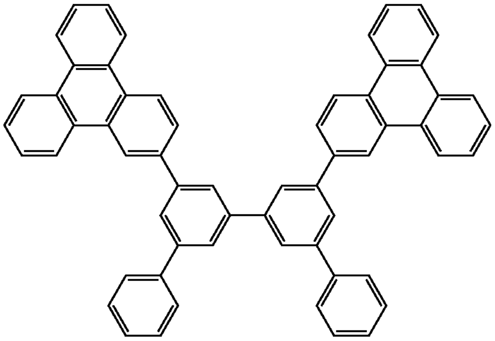
BB30
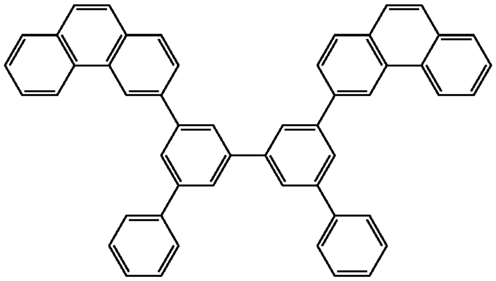
BB31
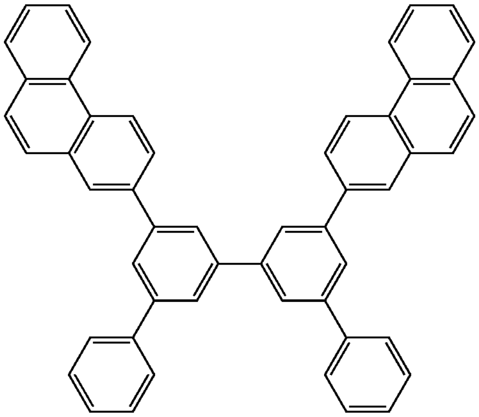
BB32
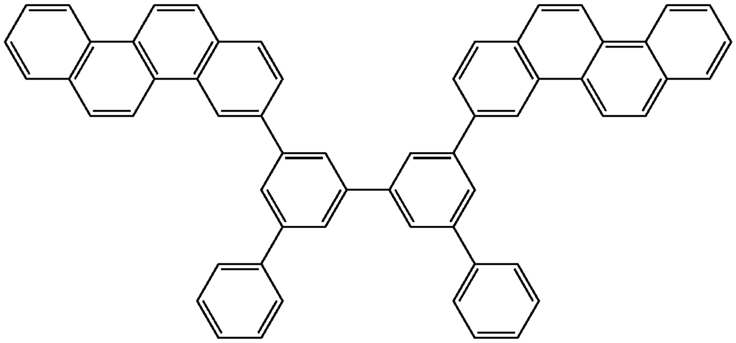
BB33
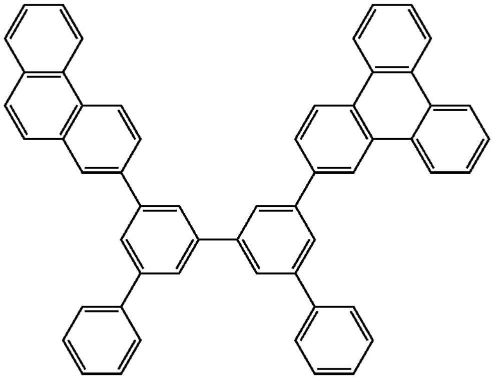
BB34
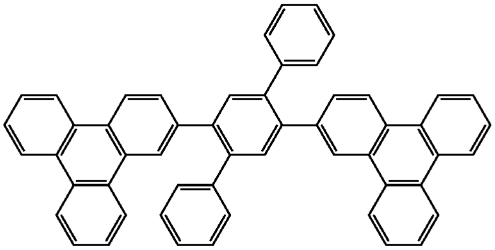

-continued
BB35
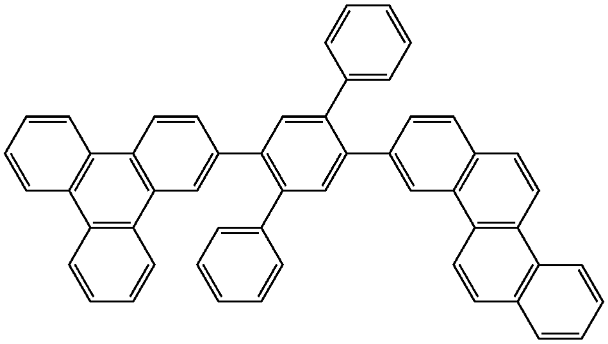
BB36
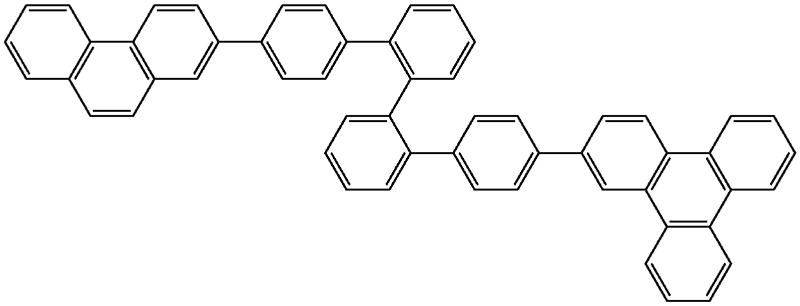
BB37
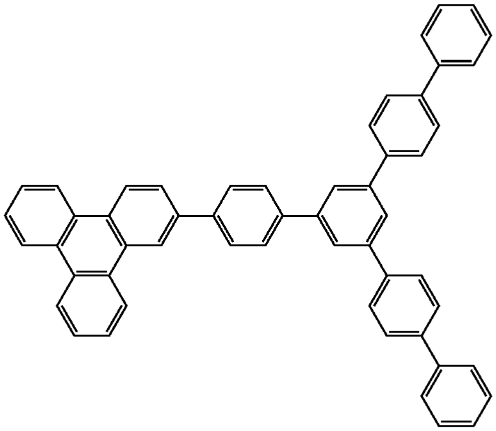
BB38
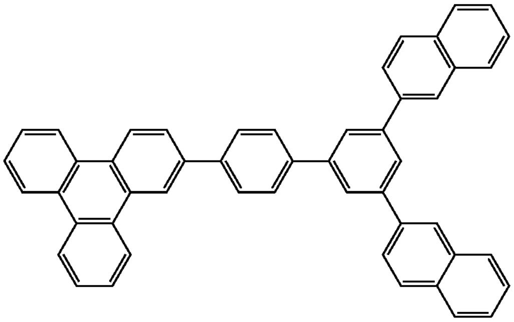
BB39
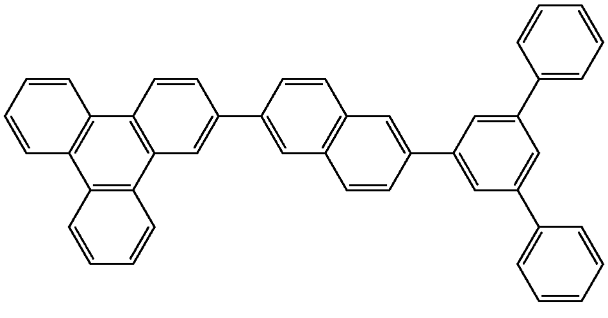

-continued
BB40
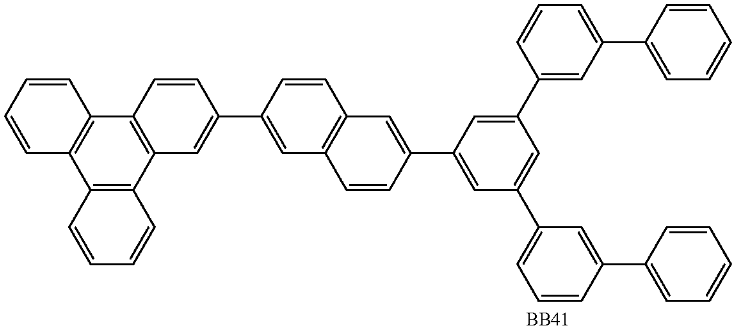
BB41
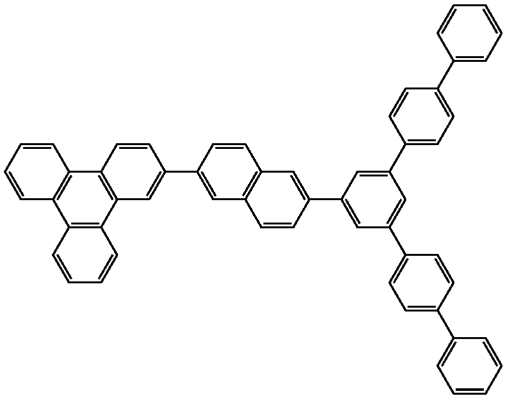
BB42
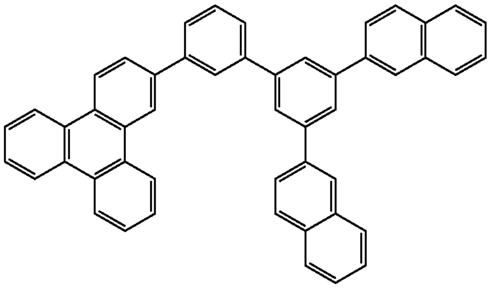
CC1
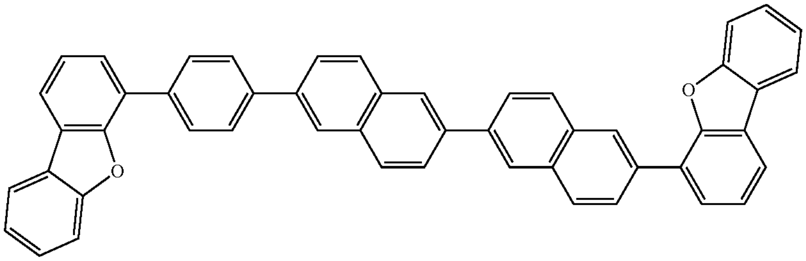
CC2
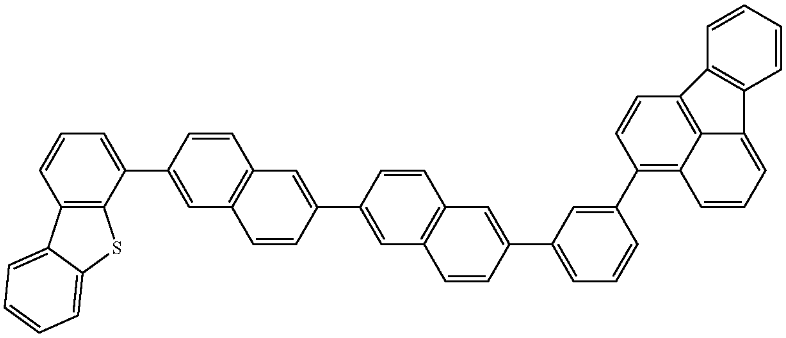

-continued
CC3
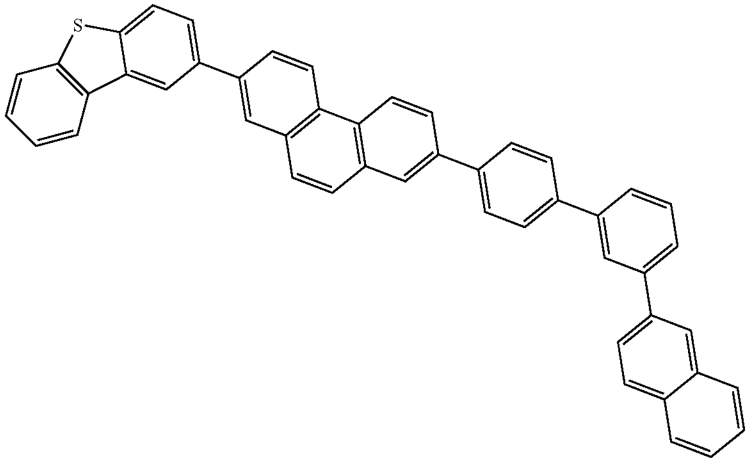
CC4
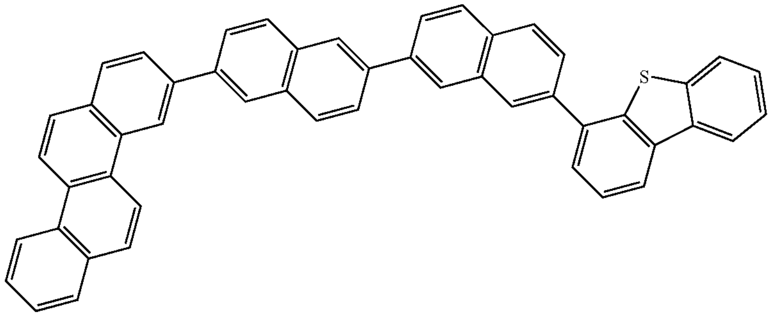
CC5
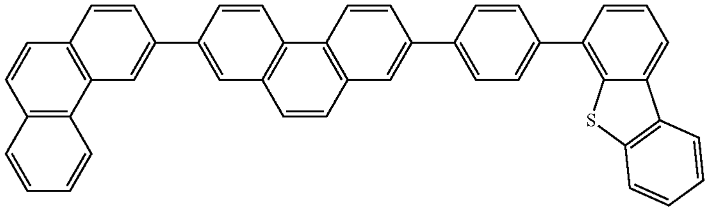
CC6
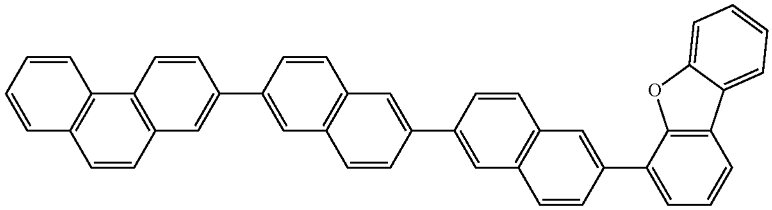
CC7
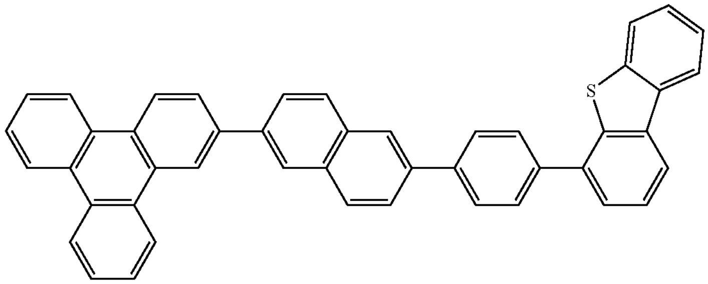

-continued
CC8
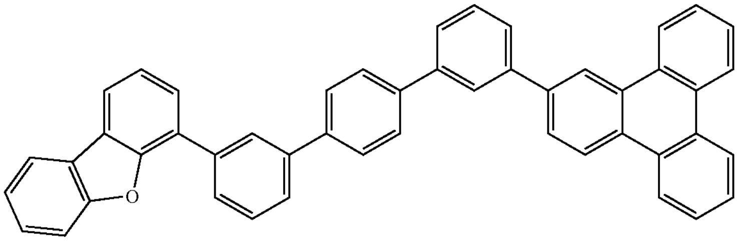
CC9
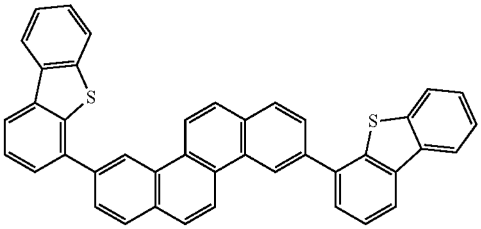
CC10
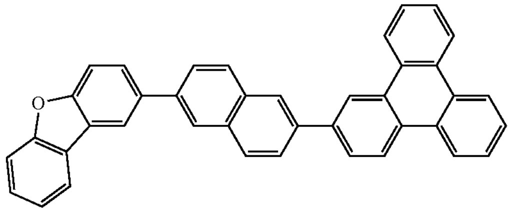
CC11
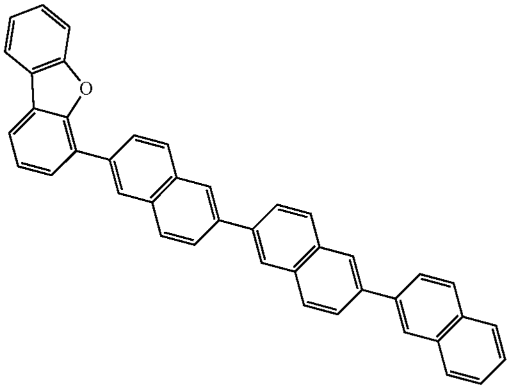
CC12
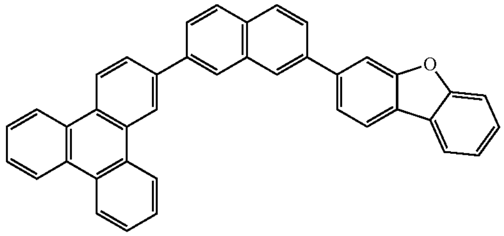
CC13
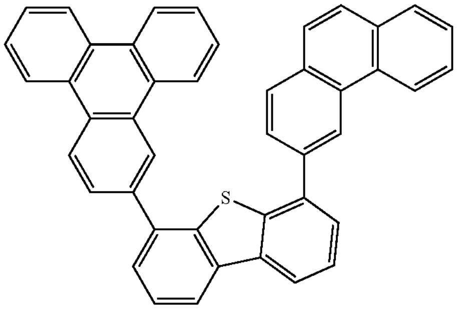
CC14
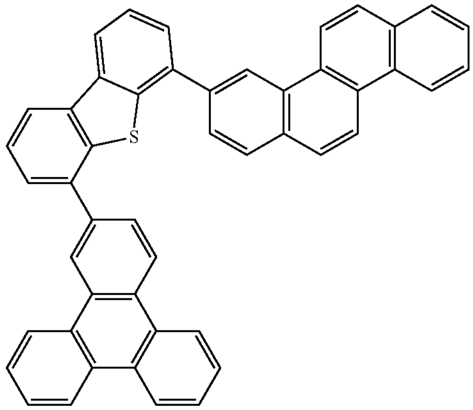
CC15
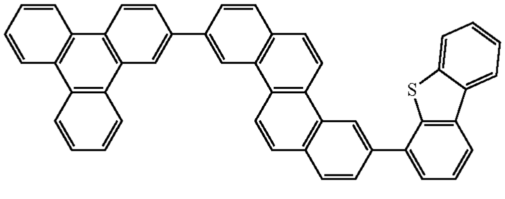
CC16
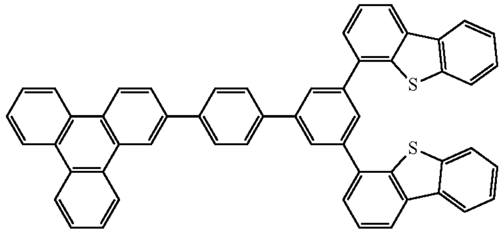

-continued

CC17

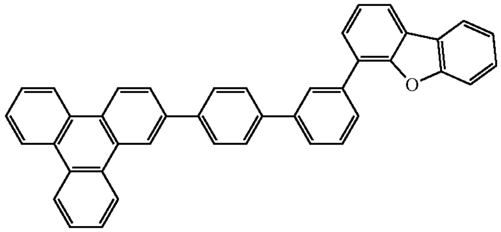

CC18

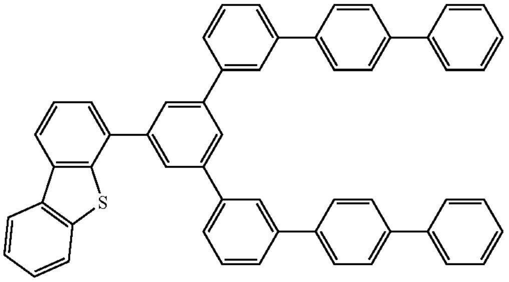

CC19

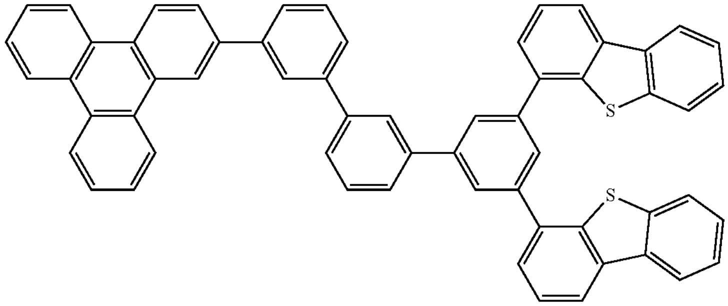

CC20

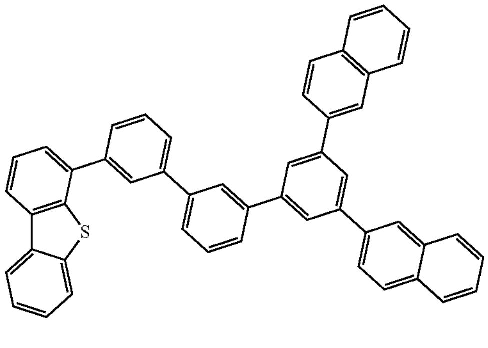

CC21

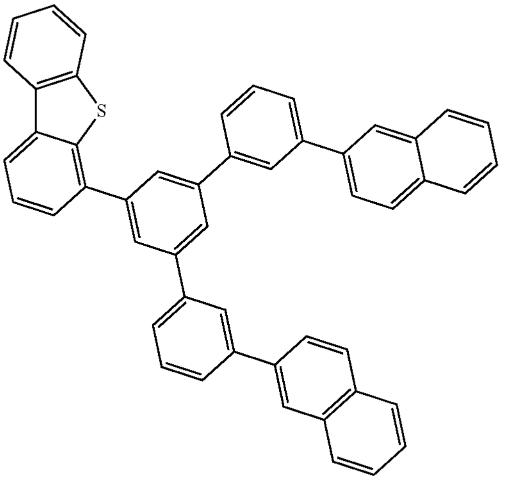

Among the above compounds, exemplary compounds (AA1 to AA21) belonging to group AA are compounds each having an azine ring as a skeleton. Thus, these compounds each have a deep HOMO level and provide a small HOMO-LUMO gap when combined with the organic compound represented by general formula [1]. Consequently, these compounds can each form a good light-emitting layer together with the organic compound represented by general formula [1] and can each provide an organic light-emitting element having a low drive voltage and high durability.

Among the above compounds, exemplary compounds (BB1 to BB42) belonging to group BB are compounds each having, as a skeleton, at least one selected from the group consisting of a triphenylene structure, a phenanthrene structure, a chrysene structure, and a fluoranthene structure and having no sp3 carbon. Thus, when each of these compounds is combined with the organic compound represented by general formula [1] to form a layer, the intermolecular distance between the two compounds can be short. As a result, intermolecular energy transfer, more specifically, energy transfer from the second organic compound to the compound represented by general formula [1] can be carried out with high efficiency, and light emission efficiency can be improved. Of these compounds, in particular, compounds having a triphenylene structure, specifically, BB6 to BB8, BB10 to BB29, and BB34 to BB42 may be used because they have particularly high planarity.

Among the above compounds, exemplary compounds (CC1 to CC21) belonging to group CC are compounds each having, as a skeleton, either a dibenzothiophene structure or a dibenzofuran structure and having no sp3 carbon. Thus, when each of these compounds is combined with the organic compound represented by general formula [1] to form a light-emitting layer, a good balance between HOMO and LUMO is provided. As a result, a good carrier balance can be achieved, and an organic light-emitting element having high light emission efficiency can be provided. Of these compounds, in particular, compounds having a dibenzothiophene structure, specifically, CC2 to CC5, CC7, CC9, CC13 to CC16, and CC18 to CC21 may be used from the viewpoint of carrier balance.

Other Compounds

Examples of other compounds that can be used in the organic light-emitting element of this embodiment will be given below.

As a hole injection/transport material suitable for use in the hole injection layer and the hole transport layer, a material that facilitates injection of holes from the anode and that have so high hole mobility that enables injected holes to be transported to the light-emitting layer may be used. To prevent deterioration of film quality, such as crystallization, in the organic light-emitting element, a material having high a glass-transition temperature may be used. Examples of low-molecular-weight and high-molecular-weight materials having hole injection/transport properties include triarylamine derivatives, arylcarbazole derivatives, phenylenediamine derivatives, stilbene derivatives, phthalocyanine derivatives, porphyrin derivatives, poly(vinylcarbazole), poly(thiophene), and other conductive polymers. These hole injection/transport materials are also suitable for use in the electron blocking layer.

Non-limiting specific examples of compounds usable as hole injection/transport materials are shown below.

HT1

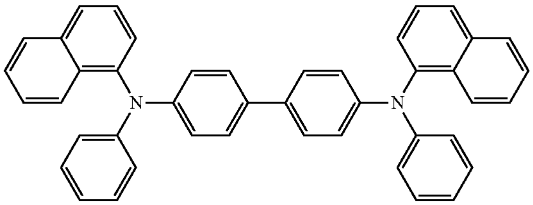

HT2

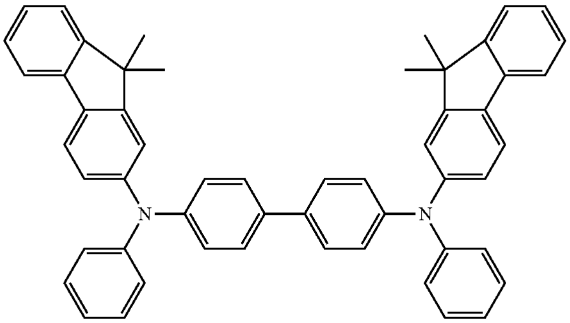

HT3

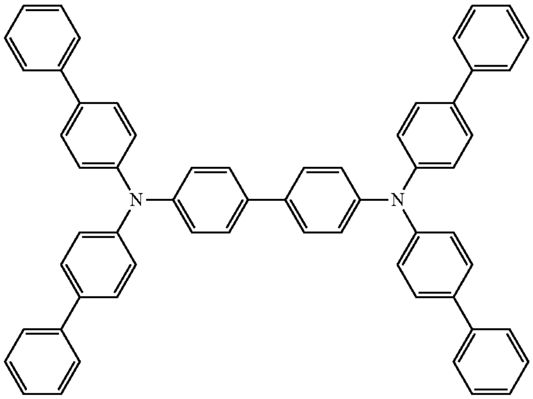

HT4

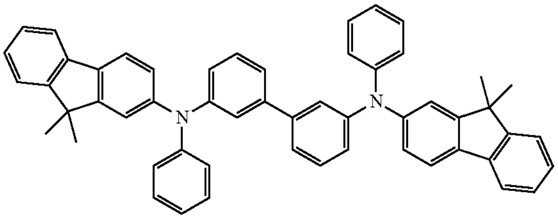

HT5

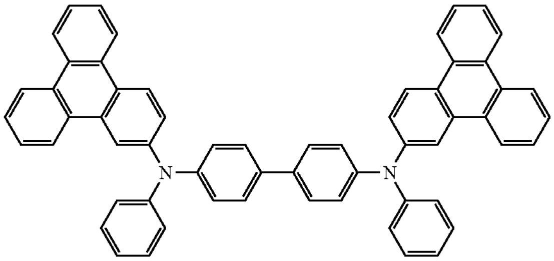

HT6

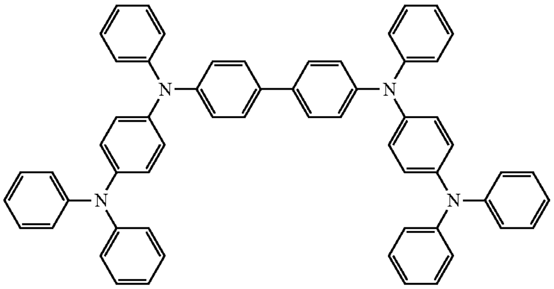

-continued
HT7
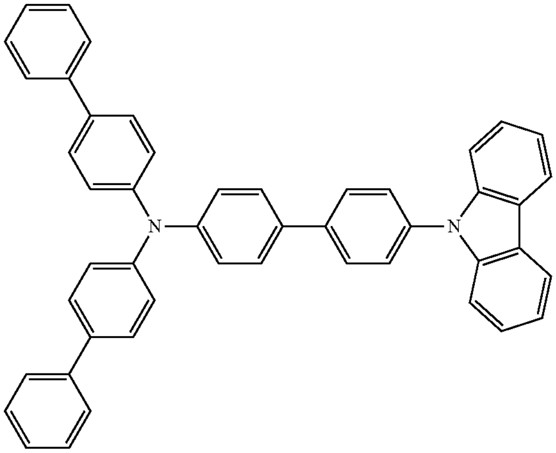
HT8
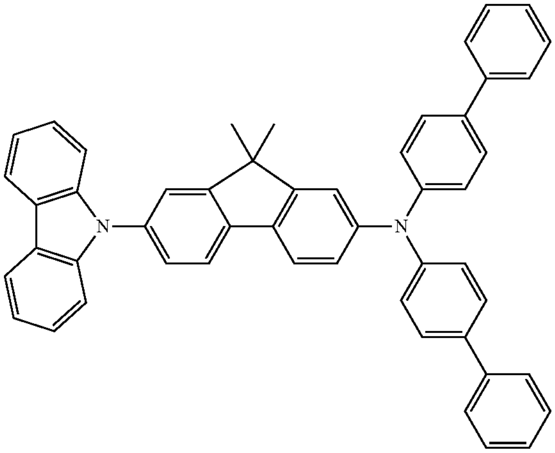
HT9
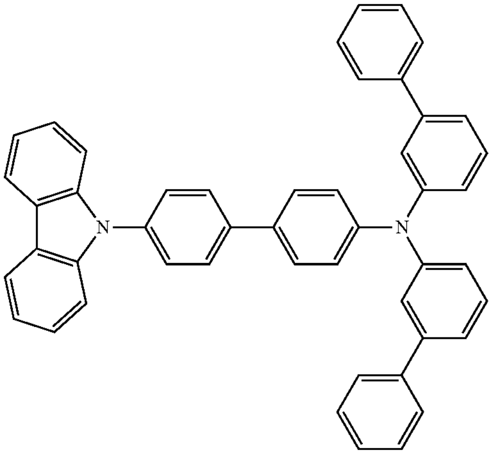
HT10
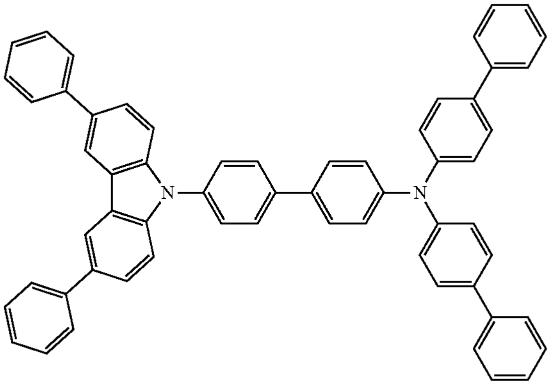
HT11
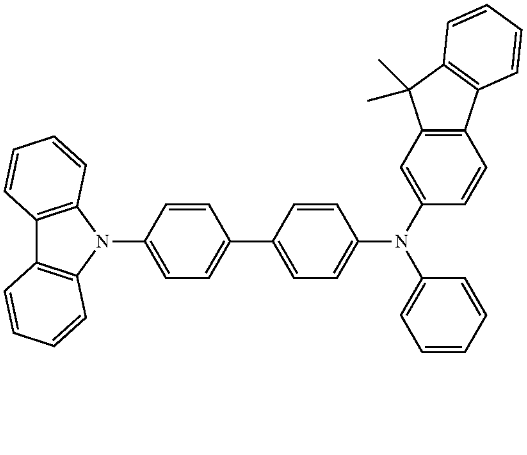
HT12
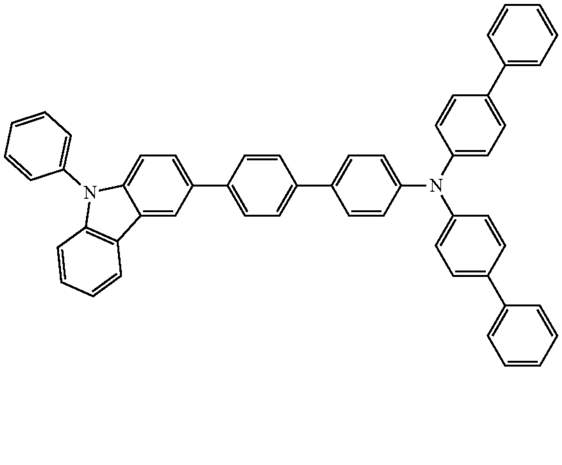

-continued
HT13
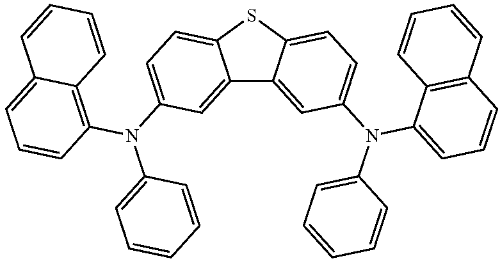
HT14
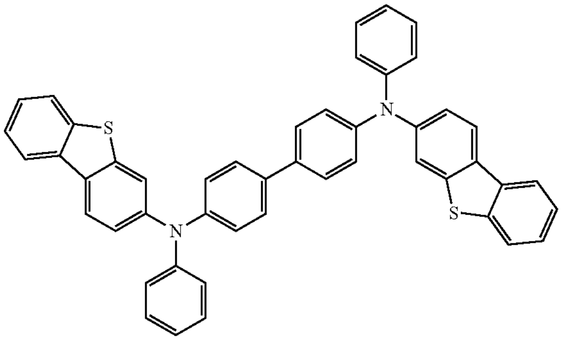
HT15
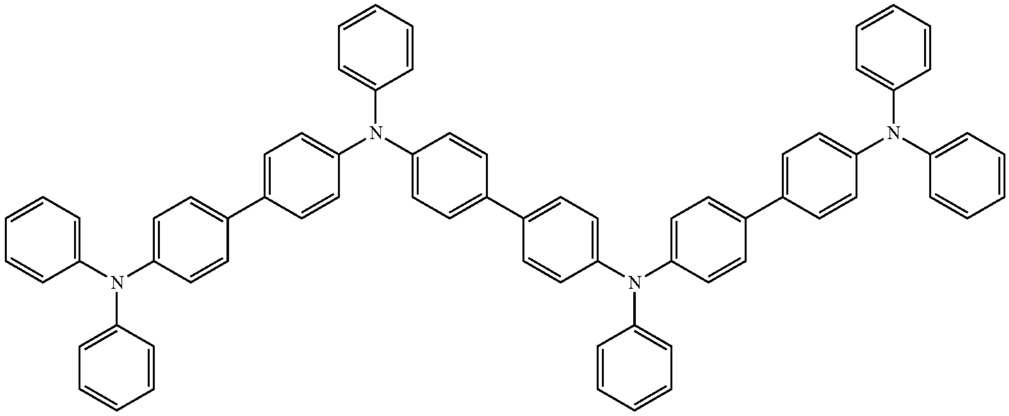
HT16
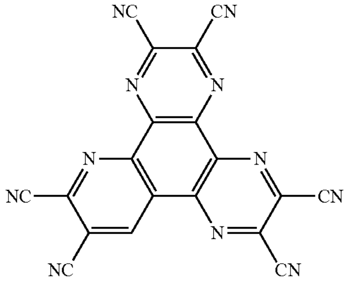
HT17
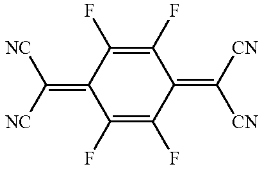
HT18
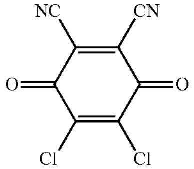
HT19
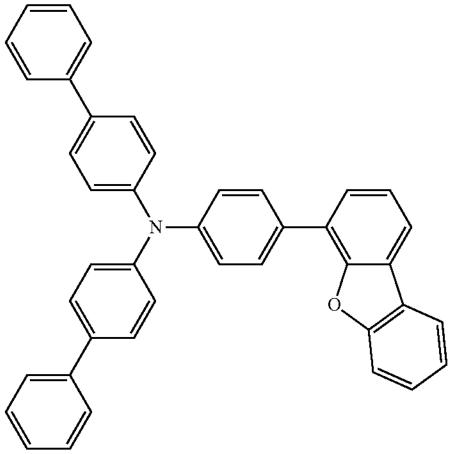

Examples of light-emitting materials mainly contributing to the light-emitting function include, in addition to the organic compound represented by general formula [1], fused-ring compounds (e.g., fluorene derivatives, naphthalene derivatives, pyrene derivatives, perylene derivatives, tetracene derivatives, anthracene derivatives, and rubrene), quinacridone derivatives, coumarin derivatives, stilbene derivatives, organic aluminum complexes such as tris(8-quinolinolato)aluminum, iridium complexes, platinum complexes, rhenium complexes, copper complexes, europium complexes, ruthenium complexes, and polymer derivatives such as poly(phenylenevinylene) derivatives, poly(fluorene) derivatives, and poly(phenylene) derivatives.

Non-limiting specific examples of compounds usable as light-emitting materials are shown below.

BD1

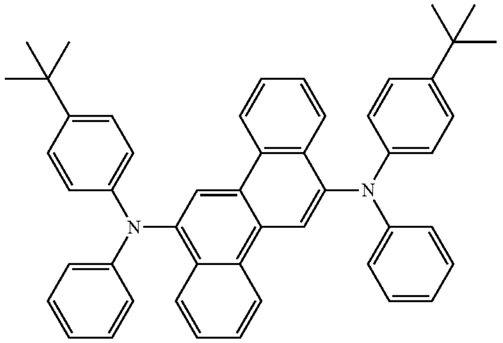

BD2

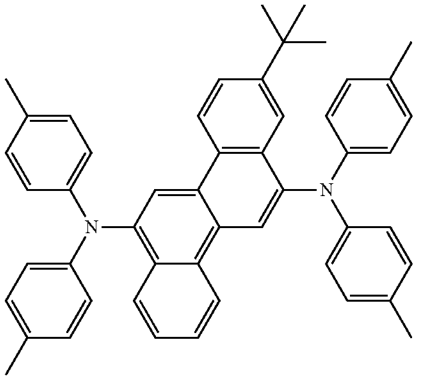

BD3

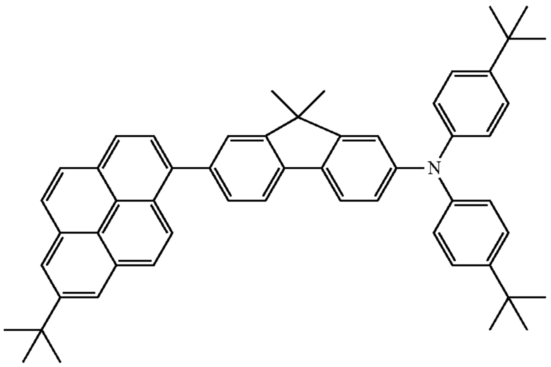

-continued

BD4

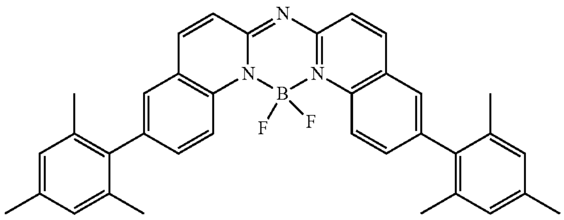

BD5

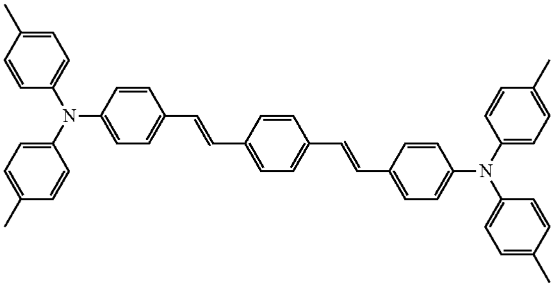

BD6

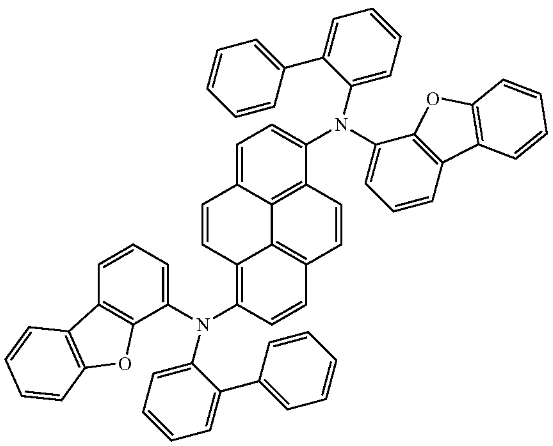

RD7

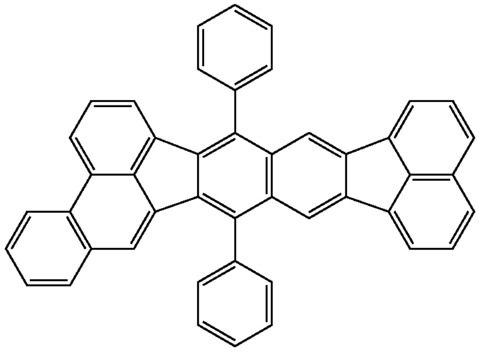

-continued
RD8
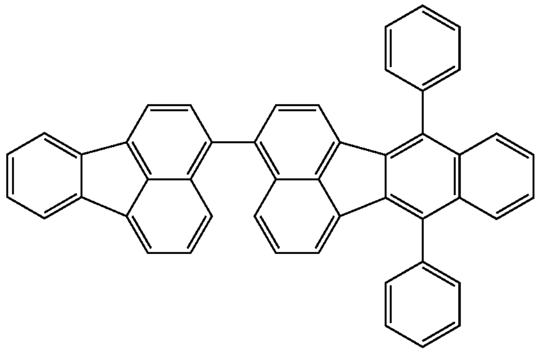
BD9
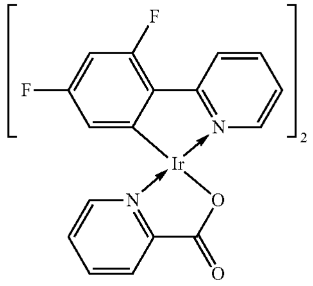
BD10
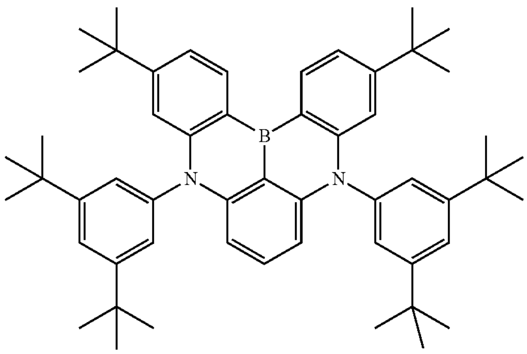
GD1
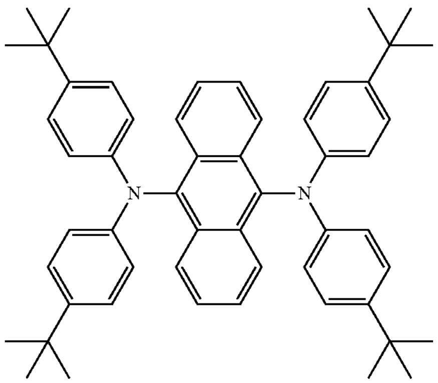
-continued
GD2
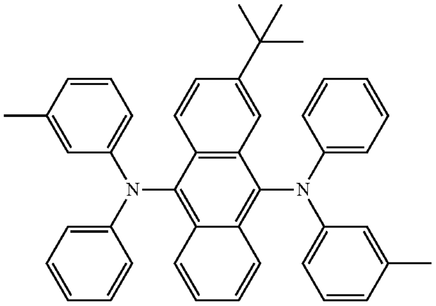
GD3
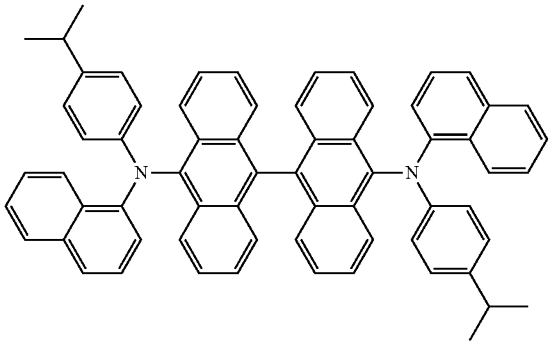
GD4
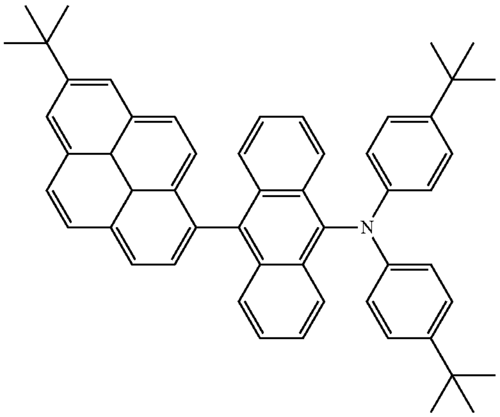
GD5
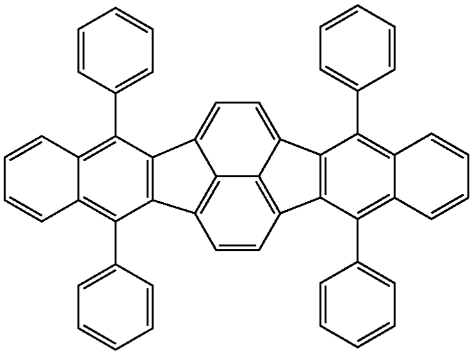

-continued
GD6
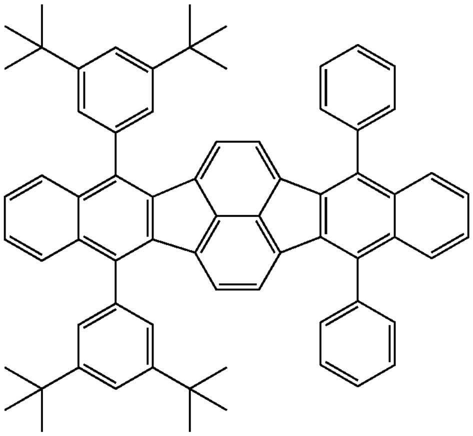
GD7
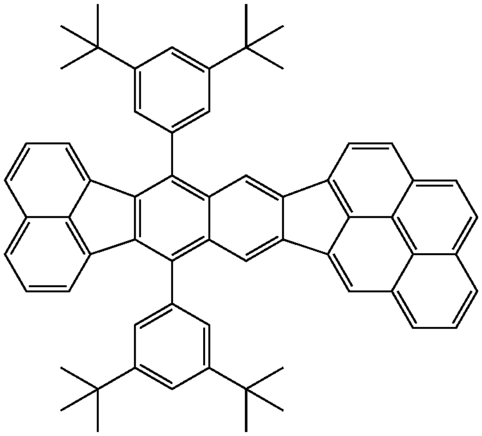
GD8
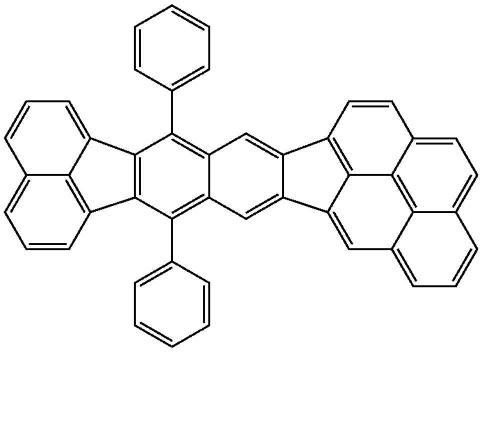
-continued
GD9
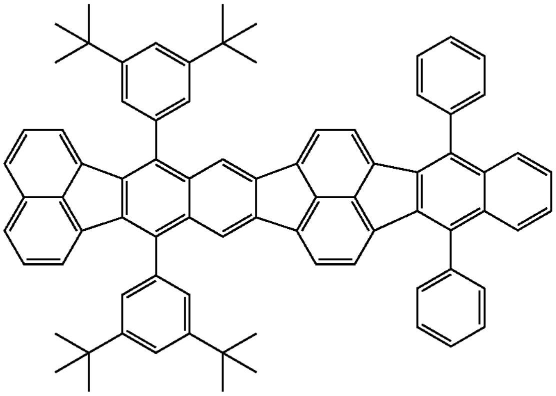
GD10
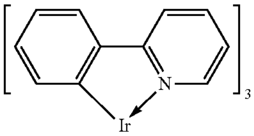
GD11
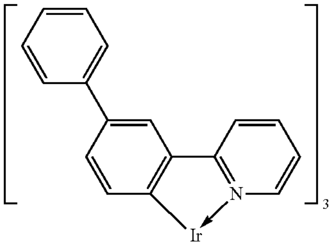
GD12
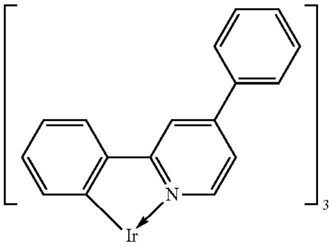
GD13
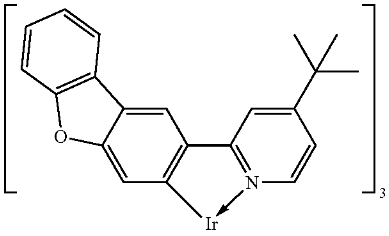

GD14
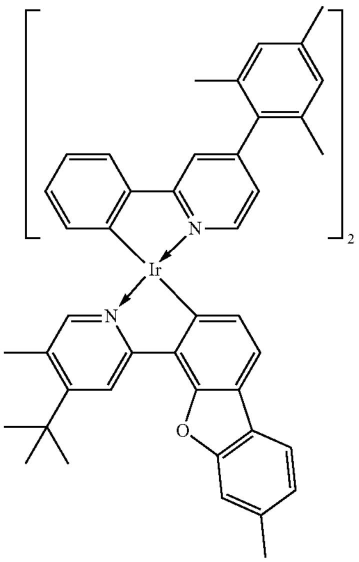
GD15
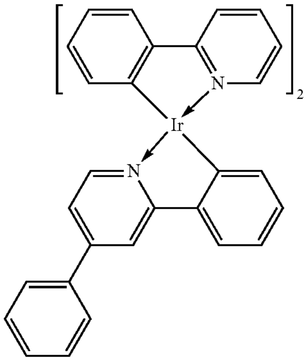
RD1
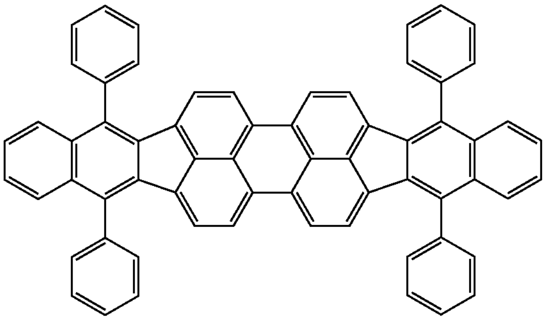
RD2
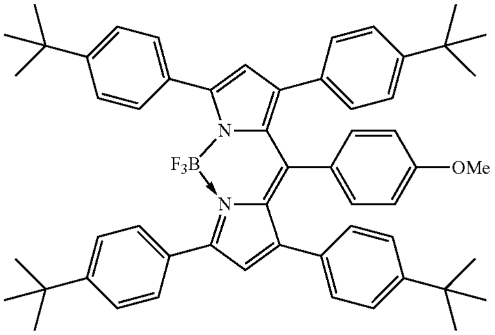
RD3
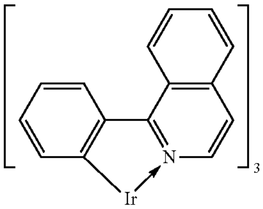
RD4
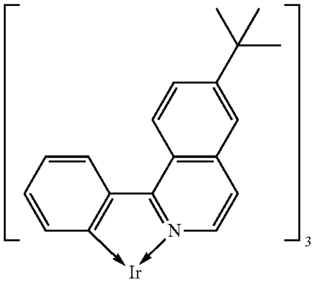
RD5
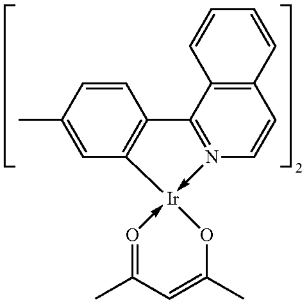
RD6
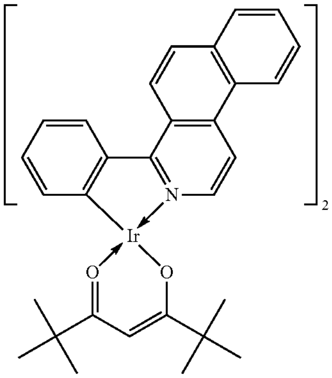
RD7
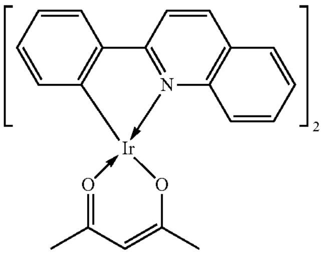

-continued

RD8

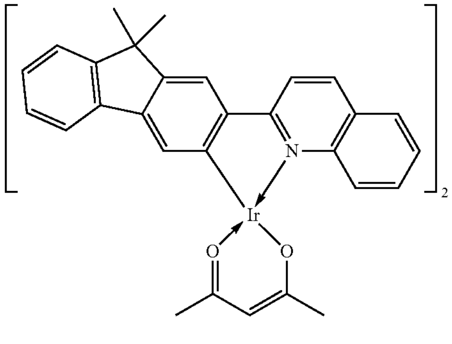

RD9

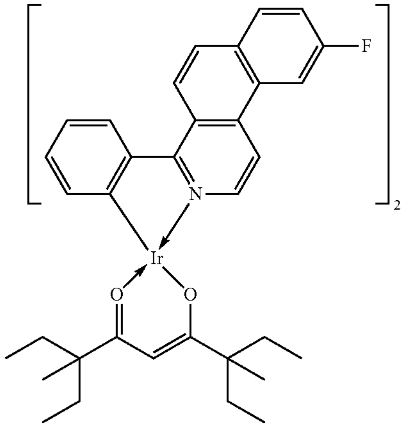

-continued

RD10

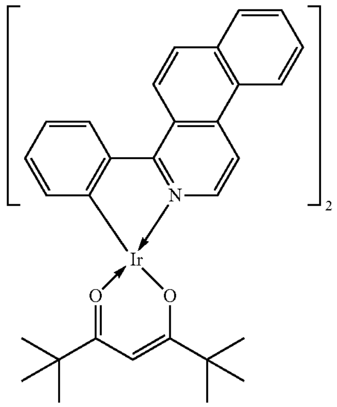

Examples of light-emitting-layer host or assist materials contained in the light-emitting layer include, in addition to the above-described materials belonging to group AA, group BB, and group CC, aromatic hydrocarbon compounds and derivatives thereof, carbazole derivatives, dibenzofuran derivatives, dibenzothiophene derivatives, organic aluminum complexes such as tris(8-quinolinolato)aluminum, and organic beryllium complexes.

As an assist material, a compound having a xanthone skeleton, a thioxanthone skeleton, or a benzophenone skeleton, which provides a deep LUMO level (far from the vacuum level) similarly to the azine skeleton, may be used. Specifically, EM28 to EM31 given below may be used.

Non-limiting specific examples of compounds usable as host or assist materials contained in the light-emitting layer are shown below.

EM1

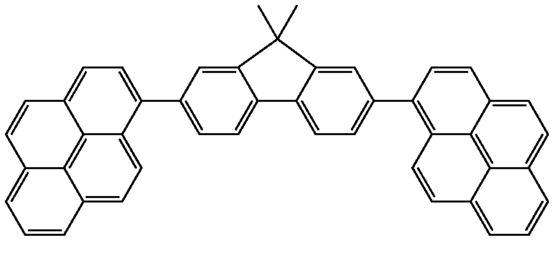

EM2

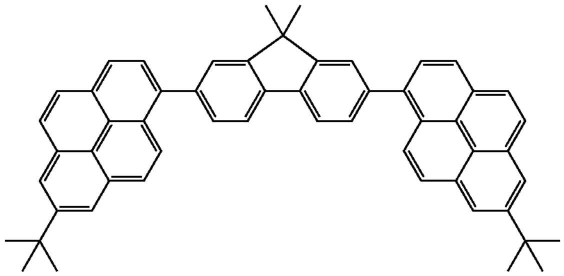

EM3

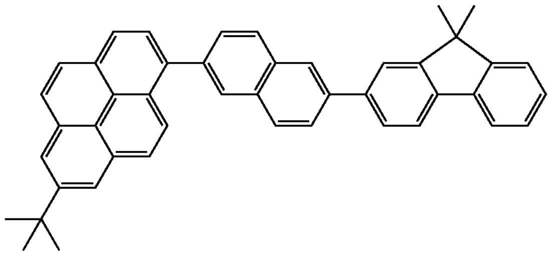

EM4

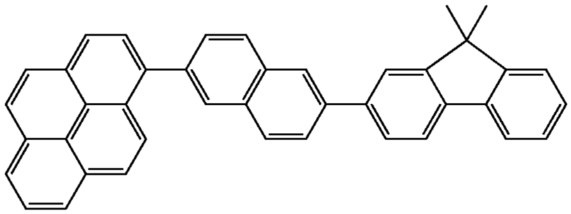

-continued
EM5
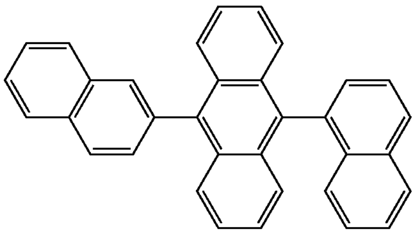
EM6
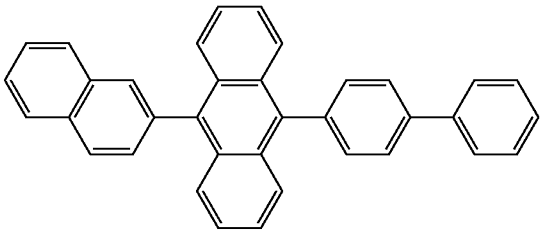
EM7
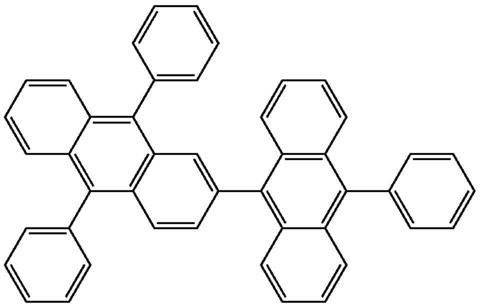
EM8
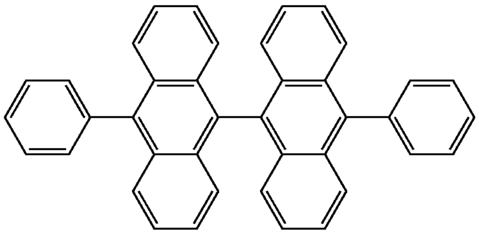
EM9
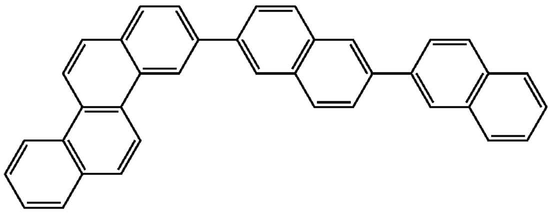
EM10
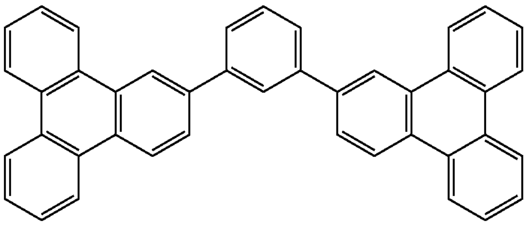
EM11
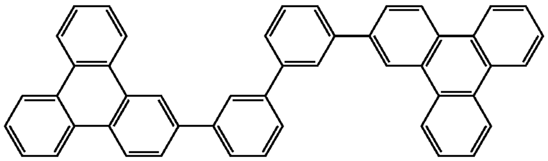
EM12
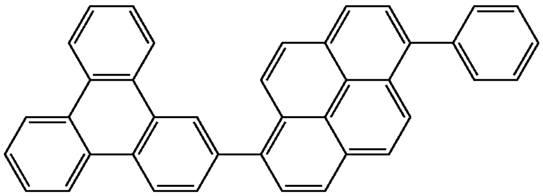
EM13
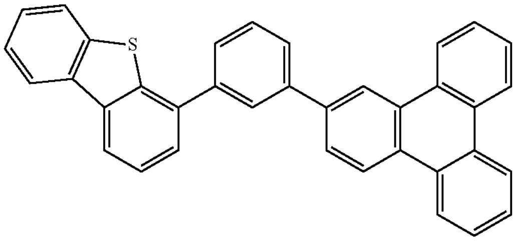
EM14
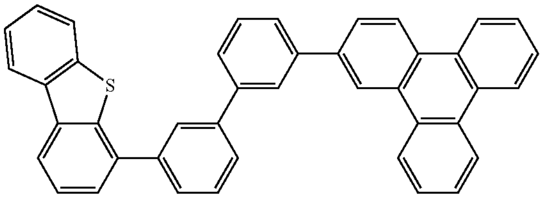
EM15
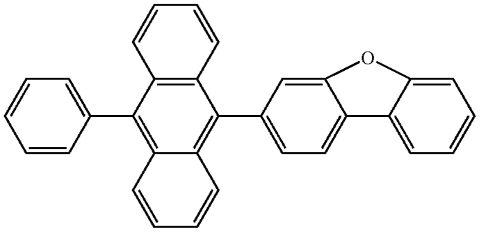

-continued
EM16
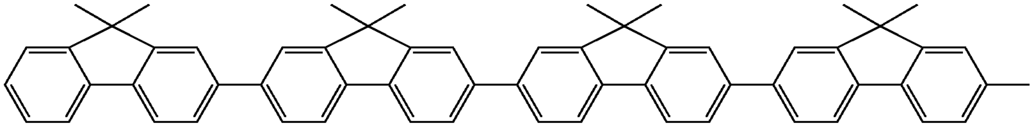
EM17
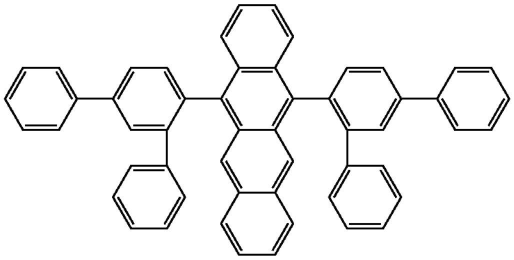
EM18
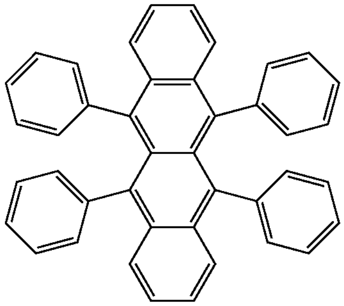
EM19
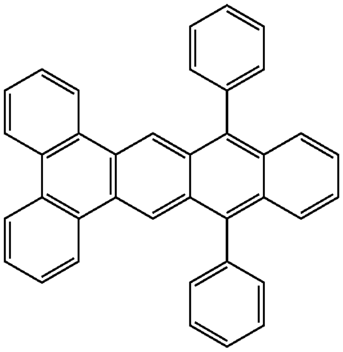
EM20
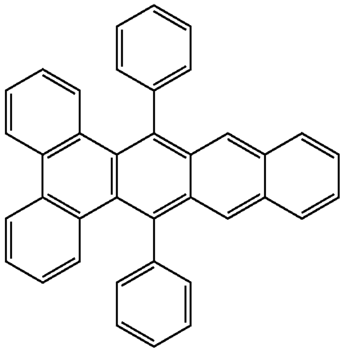
EM21
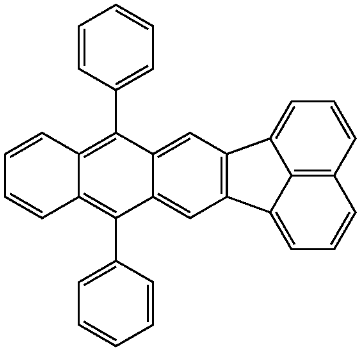
EM22
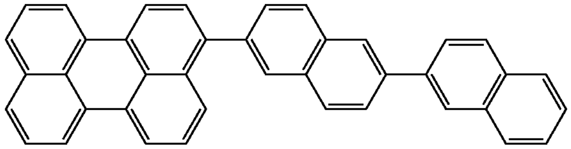
EM23
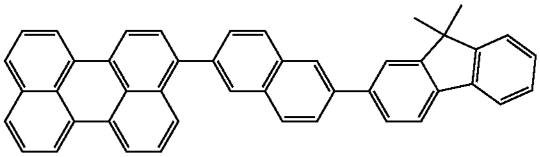
EM24
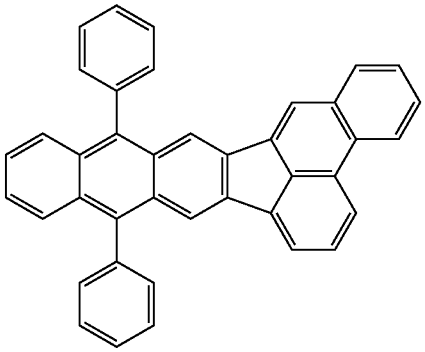

-continued
EM25
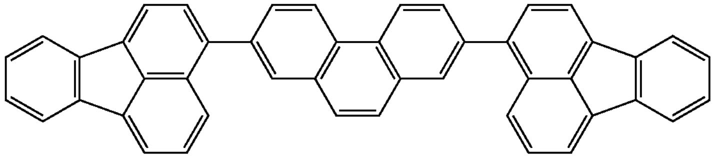
EM26
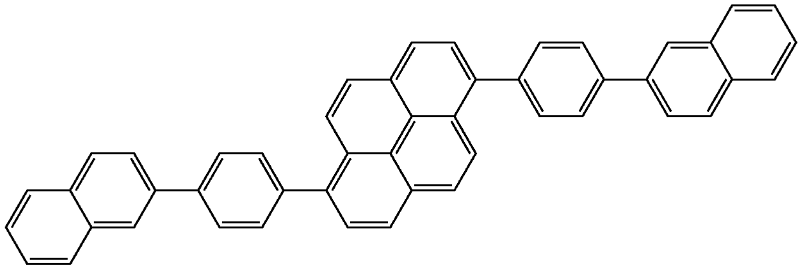
EM27
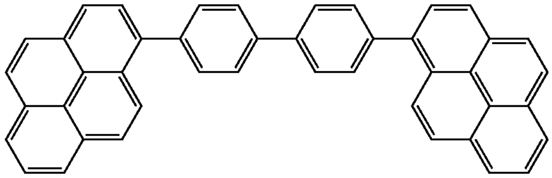
EM28
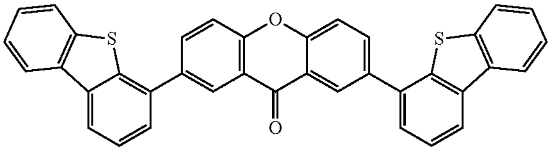
EM29
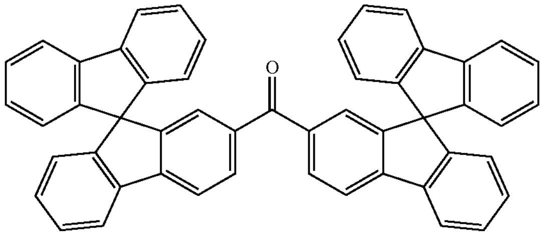
EM30
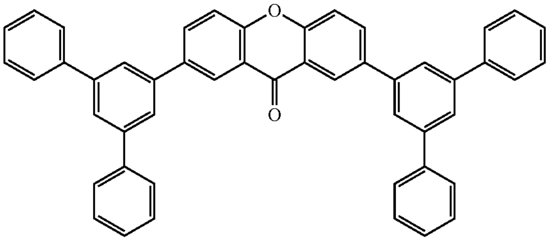
EM31
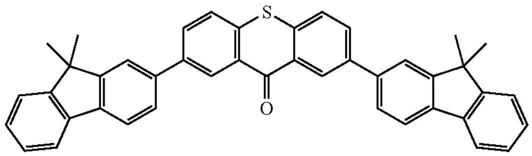
EM32
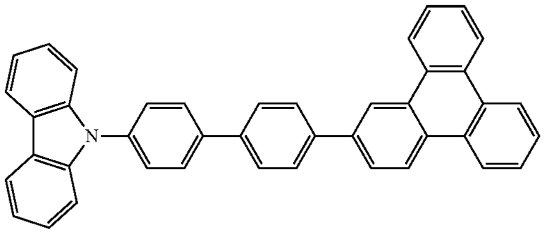
EM33
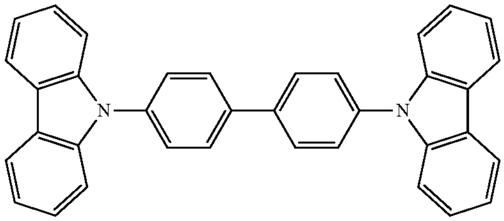
EM34
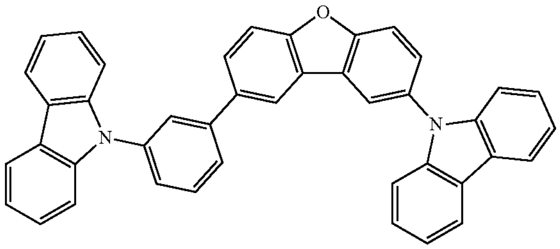

-continued

EM35

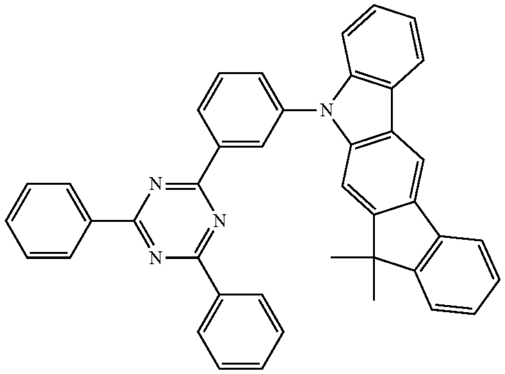

EM36

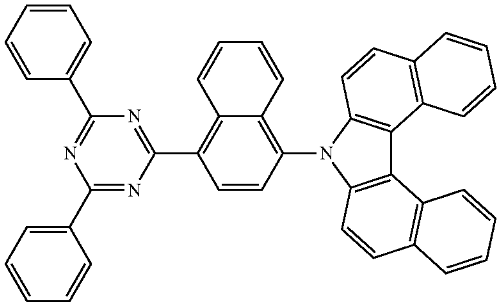

EM37

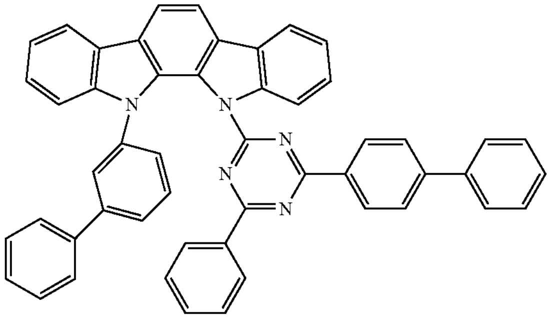

EM38

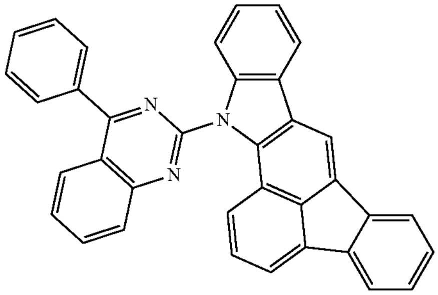

EM39

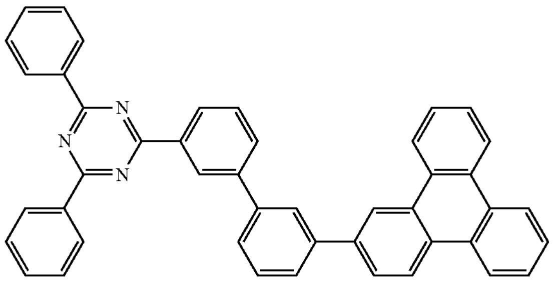

EM40

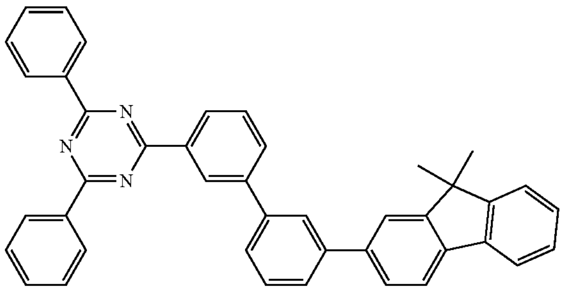

Any electron transport material capable of transporting electrons injected from the cathode to the light-emitting layer can be freely selected in consideration of, for example, the balance with the hole mobility of a hole transport material. Examples of materials capable of transporting electrons include oxadiazole derivatives, oxazole derivatives, pyrazine derivatives, triazole derivatives, triazine derivatives, quinoline derivatives, quinoxaline derivatives, phenanthroline derivatives, organic aluminum complexes, and fused-ring compounds (e.g., fluorene derivatives, naphthalene derivatives, chrysene derivatives, and anthracene derivatives). These electron transport materials are also suitable for use for the hole blocking layer.

Non-limiting specific examples of compounds usable as electron transport materials are shown below.

ET1

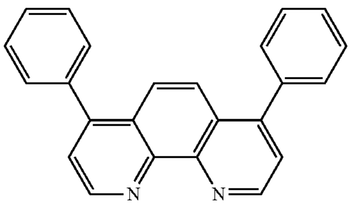

-continued
ET2
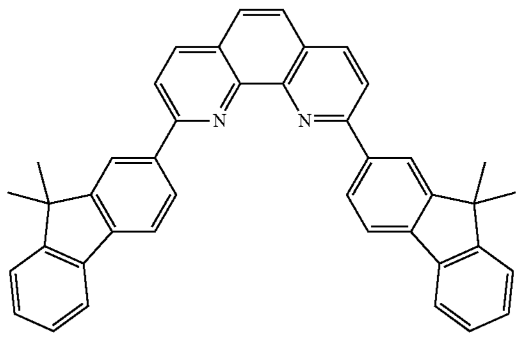
ET3
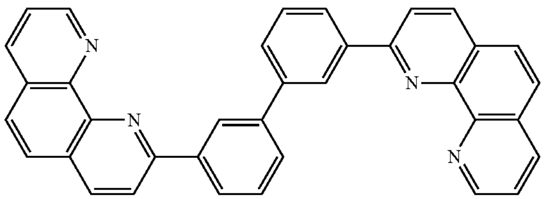
ET4
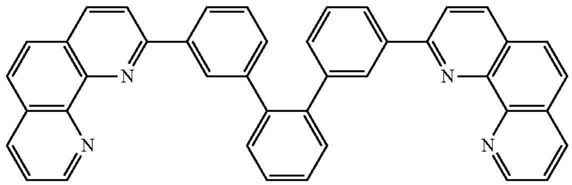
ET5
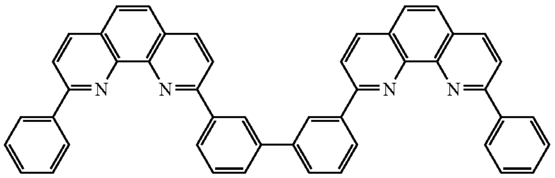
ET6
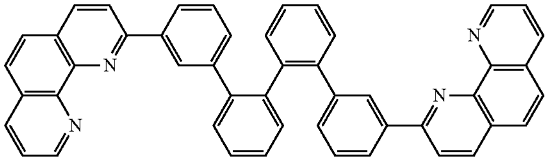
ET7
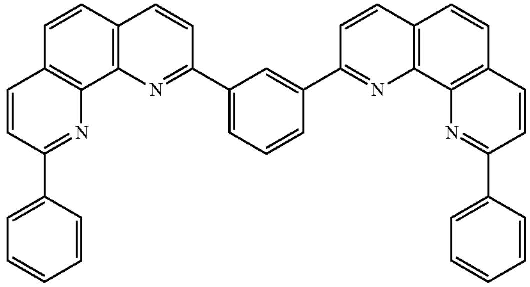
-continued
ET8
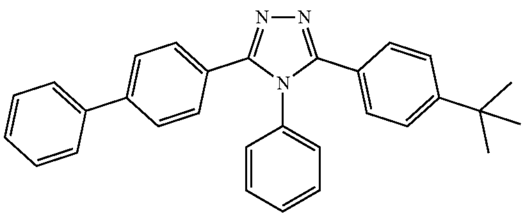
ET9
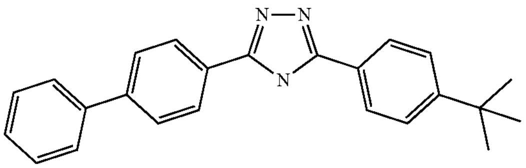
ET10
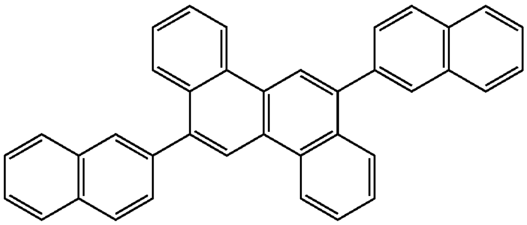
ET11
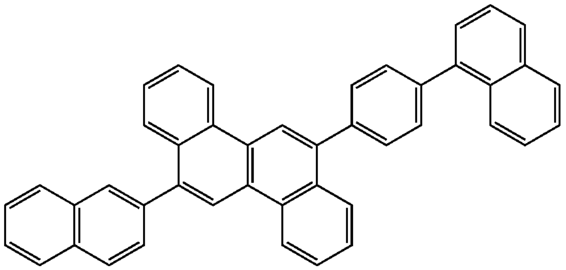
ET12
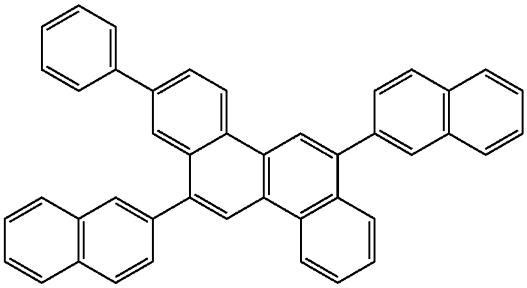
ET13
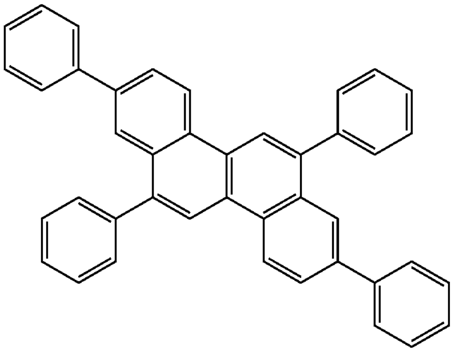

ET14
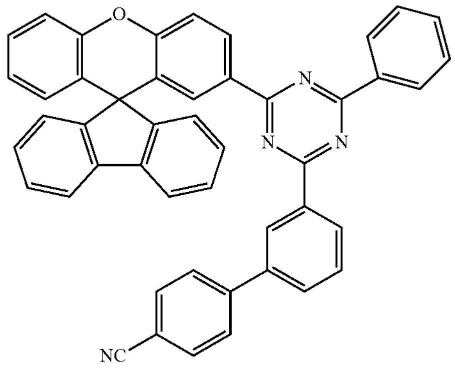
ET15
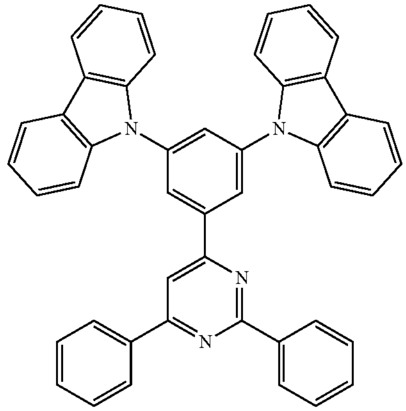
ET16
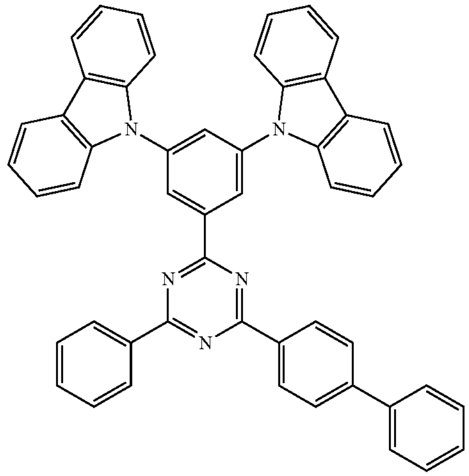
ET17
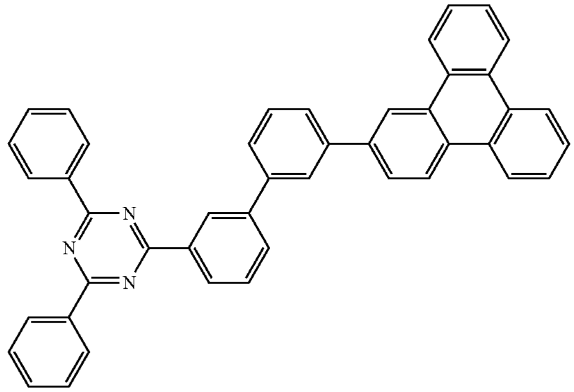
ET18
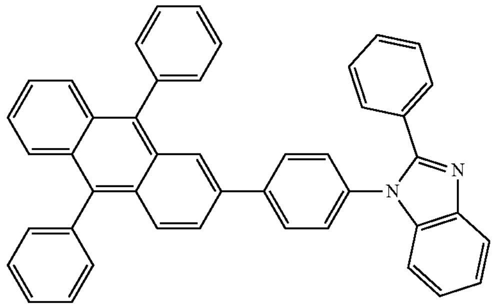
ET19
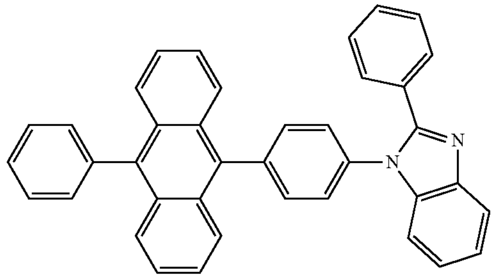
ET20
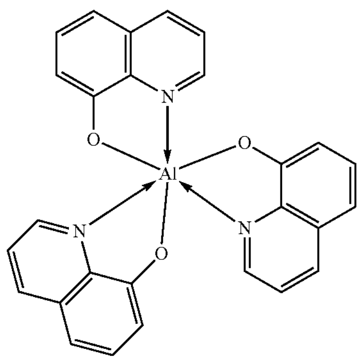

-continued

ET21

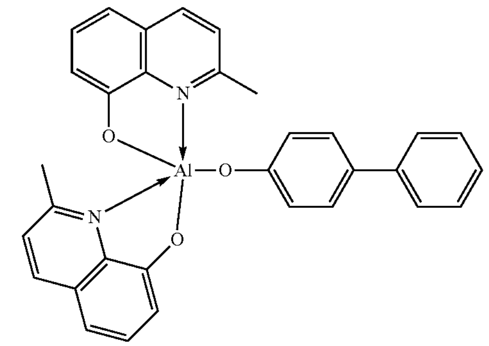

ET22

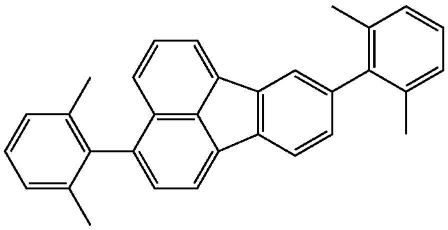

ET23

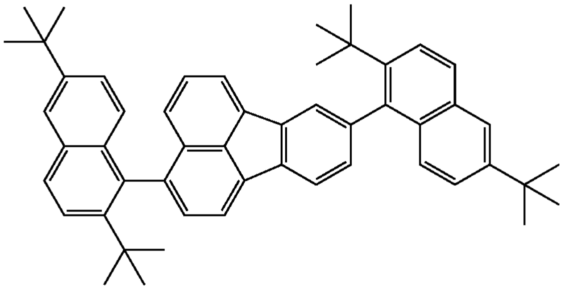

ET24

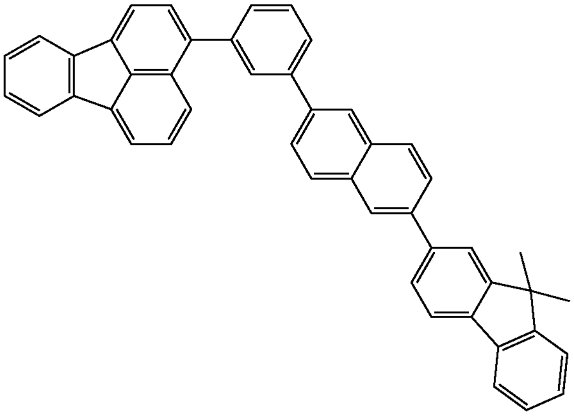

-continued

ET25

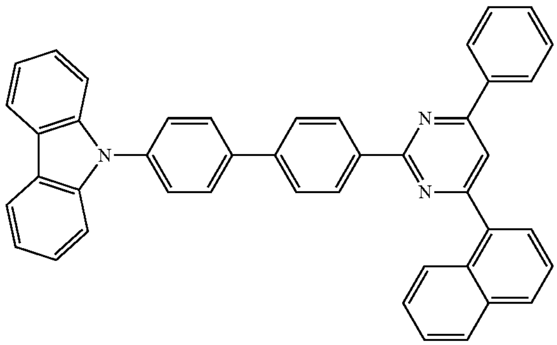

ET26

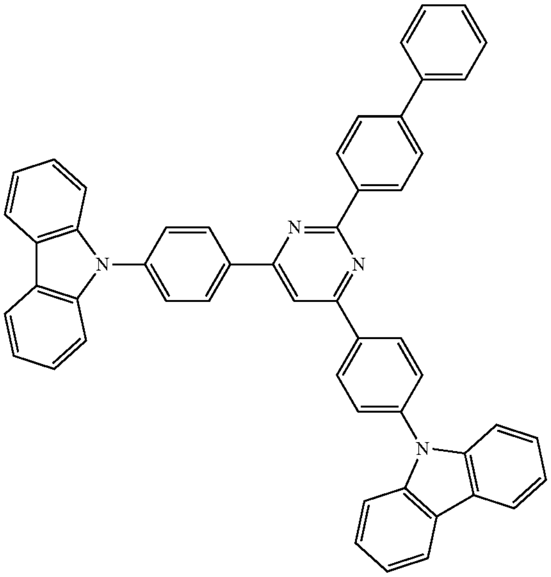

ET27

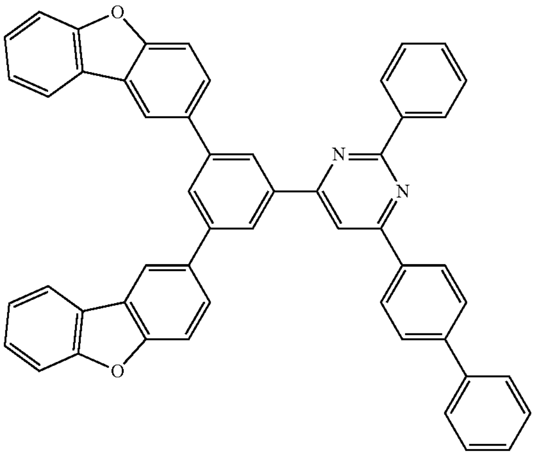

Hereinafter, constituent members other than the organic compound layer that constitute the organic light-emitting element of this embodiment will be described. The organic light-emitting element may be provided by forming the first electrode, the organic compound layer, and the second electrode on the substrate. One of the first electrode and the second electrode is an anode, and the other is a cathode. A protective layer, a color filter, and the like may be disposed on the second electrode. When the color filter is disposed, a planarization layer may be disposed between the protective layer and the color filter. The planarization layer may be composed of an acrylic resin or the like.

The substrate may be made of quartz, glass, silicon, resin, metal, or the like. A switching element such as a transistor and a wire may be disposed on the substrate, and an insulating layer may be disposed thereon. The insulating layer may be made of any material as long as contact holes can be formed in order to provide electrical connection between the anode and the wire and the anode can be insulated from wires to which the anode is not connected. For example, resins such as polyimide, silicon oxide, and silicon nitride can be used.

The constituent material for the anode desirably has as high a work function as possible. For example, elemental metals such as gold, platinum, silver, copper, nickel, palladium, cobalt, selenium, vanadium, and tungsten, mixtures containing these metals, alloys of these metals, and metal oxides such as tin oxide, zinc oxide, indium oxide, indium tin oxide (ITO), and indium zinc oxide can be used. Conductive polymers such as polyaniline, polypyrrole, and polythiophene can also be used. These electrode materials may be used alone or in combination of two or more. The anode may be composed of a single layer or a plurality of layers. When the anode is used as a reflection electrode, chromium, aluminum, silver, titanium, tungsten, molybdenum, an alloy thereof, or a laminate thereof can be used, for example. When the anode is used as a transparent electrode, a transparent conductive layer made of an oxide such as indium tin oxide (ITO) or indium zinc oxide can be used, but these materials are non-limiting examples. Photolithography can be used for anode formation.

The constituent material for the cathode desirably has a low work function. Examples of such materials include alkali metals such as lithium; alkaline earth metals such as calcium; elemental metals such as aluminum, titanium, manganese, silver, lead, and chromium; and mixtures containing these elemental metals. Alloys of these elemental metals can also be used. For example, magnesium-silver, aluminum-lithium, aluminum-magnesium, silver-copper, and zinc-silver can be used. Metal oxides such as indium tin oxide (ITO) can also be used. These electrode materials may be used alone or in combination of two or more. The cathode may be composed of a single layer or a plurality of layers. In particular, silver is preferably used, and a silver alloy is more preferred to suppress aggregation of silver. As long as aggregation of silver can be suppressed, the content ratio in the alloy is not limited, and may be 1:1, for example.

The cathode is not particularly limited, and may be formed as a conductive oxide layer of ITO or the like to provide a top-emission element or may be formed as a reflection electrode of aluminum (A1) or the like to provide a bottom-emission element. The cathode may be formed by any method. For example, DC and AC sputtering methods may be used because these methods provide good film coverage and readily reduce resistance.

After the cathode is formed, a protective layer may be disposed. For example, by bonding a glass plate provided with a moisture absorbent to the cathode, permeation of water and the like into the organic compound layer can be suppressed, and the occurrence of a display failure can be suppressed. In another embodiment, a passivation film made of silicon nitride or the like may be disposed on the cathode to suppress permeation of water and the like into the organic compound layer. For example, the protective layer may be formed in such a manner that after the formation of the cathode, the resultant is conveyed to another chamber without breaking the vacuum, and a silicon nitride film having a thickness of 2 μm is formed by chemical-vapor deposition (CVD). After the film formation by CVD, atomic layer deposition (ALD) may be performed to form a protective layer.

Color filters may be disposed on pixels. For example, color filters sized to fit pixels may be disposed on another substrate and bonded to a substrate provided with the organic light-emitting element. Alternatively, color filters may be patterned by photolithography on a protective layer made of silicon oxide or the like.

The organic compound layers (e.g., the hole injection layer, the hole transport layer, the electron blocking layer, the light-emitting layer, the hole blocking layer, the electron transport layer, and the electron injection layer) constituting the organic light-emitting element according to this embodiment are formed by any of the following methods. Specifically, a dry process such as vacuum deposition, ion plating, sputtering, or plasma deposition can be used to form the organic compound layers. Instead of the dry process, a wet process in which a solution in an appropriate solvent is applied by a known coating method (e.g., spin coating, dipping, casting, the LB technique, or an ink jet method) to form a layer can also be used. When the layers are formed, for example, by vacuum deposition or solution coating, the layers are unlikely to undergo crystallization or the like and are highly stable over time. When a coating method is used for film formation, an appropriate binder resin can be used in combination to form a film. Examples of the binder resin include, but are not limited to, polyvinylcarbazole resins, polycarbonate resins, polyester resins, ABS resins, acrylic resins, polyimide resins, phenol resins, epoxy resins, silicone resins, and urea resins. The binder resins may be used alone as a homopolymer or copolymer or may be used as a mixture of two or more. In addition, known additives such as plasticizers, antioxidants, and UV absorbers may optionally be used in combination.

Apparatus Including Organic Light-Emitting Element

The organic light-emitting element according to this embodiment can be used as a constituent member of a display apparatus or an illumination apparatus. Other applications include an exposure light source in an electrophotographic image-forming apparatus, a backlight in a liquid crystal display apparatus, and a light-emitting apparatus including a white light source with a color filter.

The display apparatus may be an image information processing apparatus including an image input unit that receives image information from an area CCD, a linear CCD, a memory card, or the like, an information-processing unit that processes the input information, and a display unit that displays the input image. The display apparatus includes a plurality of pixels, and at least one of the plurality of pixels may include the organic light-emitting element according to this embodiment and a transistor connected to the organic light-emitting element. In this case, the substrate may be a semiconductor substrate made of silicon or the like, and the transistor may be a MOSFET formed on the substrate.

The display unit of an image pickup apparatus or an ink-jet printer may have a touch panel function. The touch panel function may be activated by any system, such as an infrared system, an electrostatic capacitive system, a resistive film system, or an electromagnetic induction system. The display apparatus may also be used in a display unit of a multifunctional printer.

Next, a display apparatus according to an embodiment will be described with reference to the drawings.

Figure 3A:
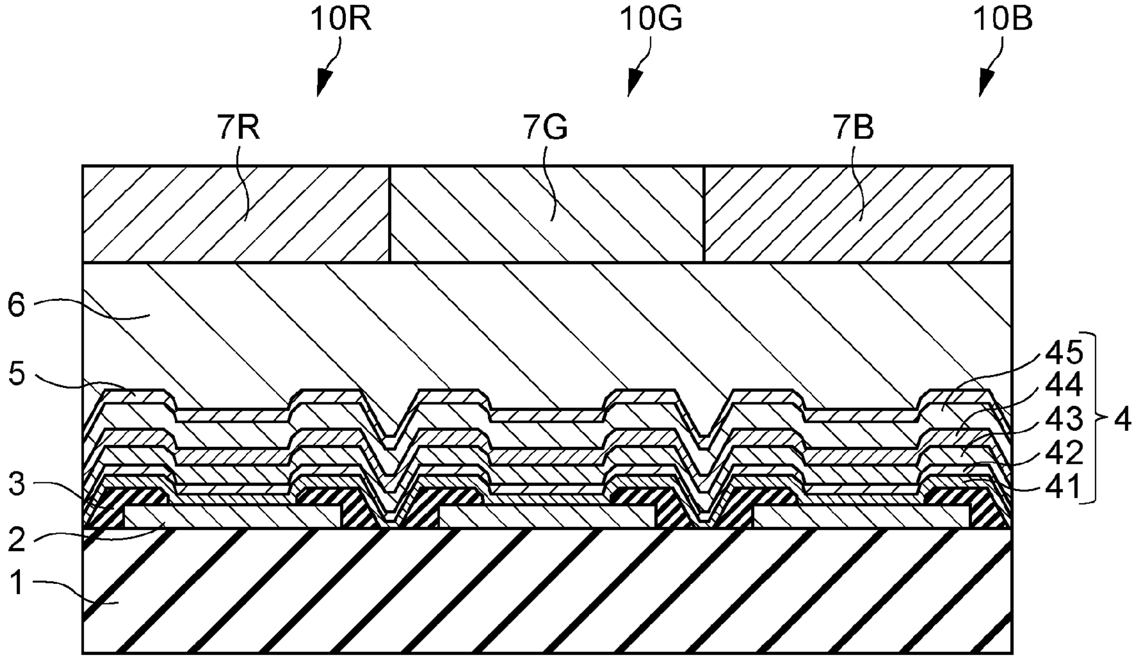
FIG. 3A is a schematic sectional view illustrating an example of a pixel of a display apparatus according to an embodiment of the present disclosure.
Figure 3B:
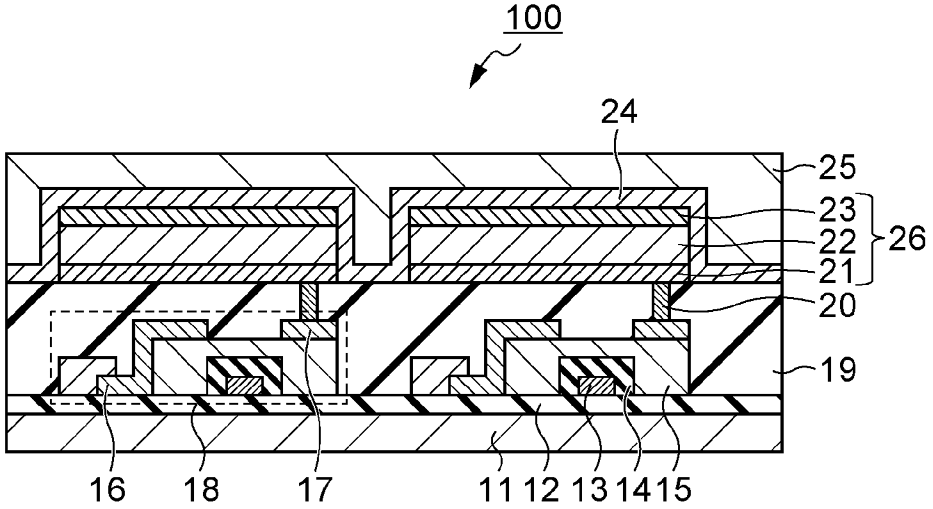
FIG. 3B is a schematic sectional view of an example of a display apparatus including an organic light-emitting element according to an embodiment of the present disclosure.

FIGS. 3A and 3B are schematic sectional views each illustrating an example of a display apparatus including an organic light-emitting element and a transistor connected to the organic light-emitting element. The transistor is an example of an active element. The transistor may be a thin film transistor (TFT).

FIG. 3A is an example of a pixel that is a component of the display apparatus according to this embodiment. The pixel has subpixels 10. The subpixels are divided into subpixels 10R, 10G, and 10B according to their light emission. The emission color may be differentiated by the wavelength of light emitted from a light-emitting layer. Alternatively, light emitted from the subpixels may be selectively transmitted through a color filter or the like or subjected to color conversion by a color filter or the like. Each subpixel includes, on an interlayer insulating layer 1, a reflective electrode 2 serving as a first electrode, an insulating layer 3 that covers the edge of the reflective electrode 2, an organic compound layer 4 that covers the first electrode and the insulating layer, a transparent electrode 5, a protective layer 6, and a color filter 7.

The interlayer insulating layer 1 may include a transistor and a capacitor element below or inside the interlayer insulating layer 1.

The transistor and the first electrode may be electrically connected to each other through a contact hole (not illustrated) or the like.

The insulating layer 3 is also referred to as a bank or a pixel-separating film. The insulating layer 3 is disposed so as to cover the edge of the first electrode and surround the first electrode. A portion in which the insulating layer is not disposed is in contact with the organic compound layer 4 and serves as a light-emitting region.

The organic compound layer 4 includes a hole injection layer 41, a hole transport layer 42, a first light-emitting layer 43, a second light-emitting layer 44, and an electron transport layer 45.

The second electrode 5 may be a transparent electrode, a reflective electrode, or a semitransparent electrode.

The protective layer 6 reduces permeation of water into the organic compound layer. Although the protective layer is illustrated as a single layer, it may be constituted by a plurality of layers. The layers may be constituted by an inorganic compound layer and an organic compound layer.

The color filter 7 is divided into color filters 7R, 7G, and 7B according to their color. The color filter may be formed on a planarizing film (not illustrated). A resin protective layer (not illustrated) may be disposed on the color filter. The color filter may be formed on the protective layer 6. The color filter may be bonded after being formed on a counter substrate such as a glass substrate.

A display apparatus 100 in FIG. 3B includes an organic light-emitting element 26 and a TFT 18, which is an example of the transistor. An insulating layer 12 is disposed on a substrate 11 made of glass, silicon, or the like. An active element such as the TFT 18 is disposed on the insulating layer 12, and the active element is constituted by a gate electrode 13, a gate insulating film 14, and a semiconductor layer 15.

The TFT 18 includes the semiconductor layer 15, a drain electrode 16, and a source electrode 17. An insulating film 19 is disposed over the TFT 18. An anode 21 constituting the organic light-emitting element 26 and the source electrode 17 are connected to each other through a contact hole 20.

The electrodes (the anode 21 and a cathode 23) included in the organic light-emitting element 26 and the electrodes (the source electrode 17 and the drain electrode 16) included in the TFT need not necessarily be electrically connected to each other in the manner illustrated in FIG. 3B. It is only required that either the anode 21 or the cathode 23 be electrically connected to either the source electrode 17 or the drain electrode 16 of the TFT 18.

Although an organic compound layer 22 is illustrated as a single layer in the display apparatus 100 in FIG. 3B, the organic compound layer 22 may be constituted by a plurality of layers. A first protective layer 25 and a second protective layer 24 for suppressing deterioration of the organic light-emitting element are disposed over the cathode 23.

Although a transistor is used as a switching element in the display apparatus 100 in FIG. 3B, another switching element such as a metal-insulator-metal (MIM) element may be used instead.

The transistor used in the display apparatus 100 in FIG. 3B may not only be a thin-film transistor including an active layer on an insulating surface of a substrate but also a transistor obtained using a single-crystal silicon wafer. The active layer may be formed of, for example, single-crystal silicon, non-single-crystal silicon such as amorphous silicon or microcrystalline silicon, or a non-single-crystal oxide semiconductor such as indium zinc oxide or indium gallium zinc oxide. The thin-film transistor is also referred to as a TFT element.

The transistor included in the display apparatus 100 in FIG. 3B may be formed in a substrate such as a Si substrate. The phrase "formed in a substrate" means producing a transistor by processing a substrate itself, such as a Si substrate. That is, having a transistor in a substrate can also mean that the substrate and the transistor are integrally formed.

The organic light-emitting element according to this embodiment has an emission luminance that is controlled by a TFT, which is an example of a switching element. When a plurality of the organic light-emitting elements are disposed in a plane, an image can be displayed with different emission luminances. The switching element according to this embodiment need not necessarily be a TFT and may be a transistor formed of low-temperature polysilicon or an active matrix driver formed on a substrate such as a Si substrate. The phrase "on a substrate" can be replaced with "in a substrate". Whether a transistor is provided in the substrate or a TFT is used is chosen depending on the size of the display unit. For example, when the display unit has a size of about 0.5 inches, the organic light-emitting element may be disposed on a Si substrate.

Figure 4:
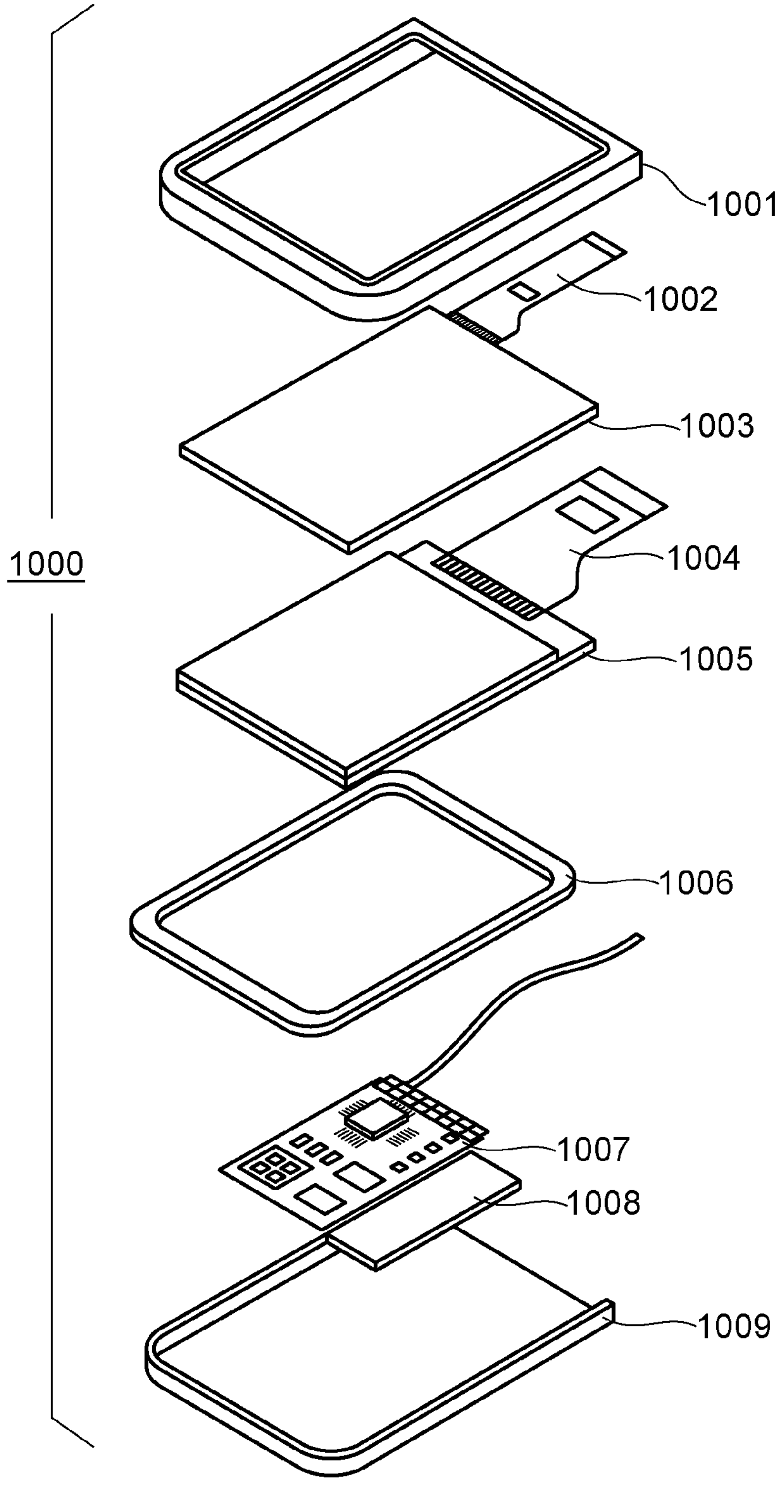
FIG. 4 schematically illustrates an example of a display apparatus according to an embodiment of the present disclosure.

FIG. 4 schematically illustrates an example of a display apparatus according to this embodiment. A display apparatus 1000 may include an upper cover 1001, a lower cover 1009, and a touch panel 1003, a display panel 1005, a frame 1006, a circuit substrate 1007, and a battery 1008 disposed between the upper cover 1001 and the lower cover 1009. Flexible print circuits (FPCs) 1002 and 1004 are connected to the touch panel 1003 and the display panel 1005, respectively. A transistor is printed on the circuit substrate 1007. The battery 1008 may be omitted if the display apparatus is not a mobile device. When the display apparatus is a mobile device, the battery 1008 may be disposed in another position.

The display apparatus according to this embodiment may be used as a display unit of an image pickup apparatus that includes an optical unit including a plurality of lenses and an image pickup element that receives light that has passed through the optical unit. The image pickup apparatus may include a display unit that displays information acquired by the image pickup element. The display unit may be exposed to the outside of the image pickup apparatus or disposed in a viewfinder. The image pickup apparatus may be a digital camera or a digital camcorder. The image pickup apparatus may be referred to as a photoelectric conversion apparatus.

Figure 5A:
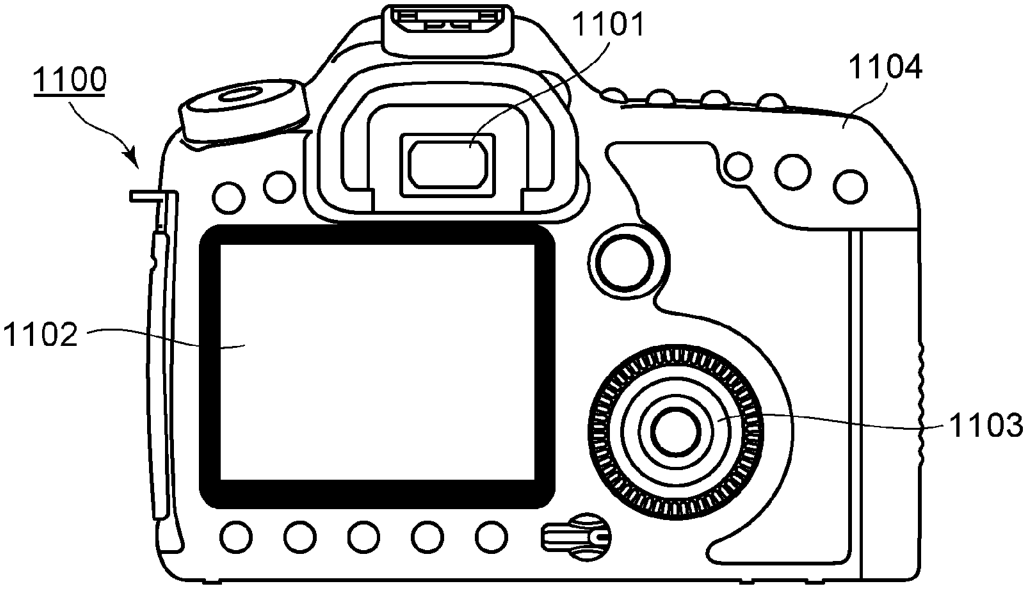
FIG. 5A schematically illustrates an example of an image pickup apparatus according to an embodiment of the present disclosure.

FIG. 5A schematically illustrates an example of an image pickup apparatus according to this embodiment. An image pickup apparatus 1100 may include a viewfinder 1101, a rear display 1102, an operation unit 1103, and a housing 1104. The viewfinder 1101 may include the display apparatus according to this embodiment. In this case, the display apparatus may display not only an image to be captured but also environmental information, image capturing instructions, and the like. The environmental information may be, for example, the intensity of external light, the direction of external light, the moving speed of a photographic subject, and the possibility that the photographic subject is hidden by an object.

Since the timing appropriate for capturing an image is only a moment, the information is desirably displayed as quickly as possible. Thus, the display apparatus including the organic light-emitting element according to this embodiment may be used. This is because the organic light-emitting element has a high response speed. The display apparatus including the organic light-emitting element is more suitable for use than such apparatuses and liquid crystal display apparatuses that are required to have a high display speed.

The image pickup apparatus 1100 includes an optical unit (not illustrated). The optical unit includes a plurality of lenses and focuses an image on the image pickup element accommodated in the housing 1104. By adjusting the relative positions of the plurality of lenses, the focal point can be adjusted. This operation can also be performed automatically.

The display apparatus according to this embodiment may include red, green, and blue color filters. The red, green, and blue color filters may be disposed in a delta arrangement.

The display apparatus according to this embodiment may be used in a display unit of an electronic apparatus such as a mobile terminal. In this case, the display apparatus may have both a display function and an operating function. Examples of the mobile terminal include cellular phones such as smart phones, tablets, and head mount displays.

Figure 5B:
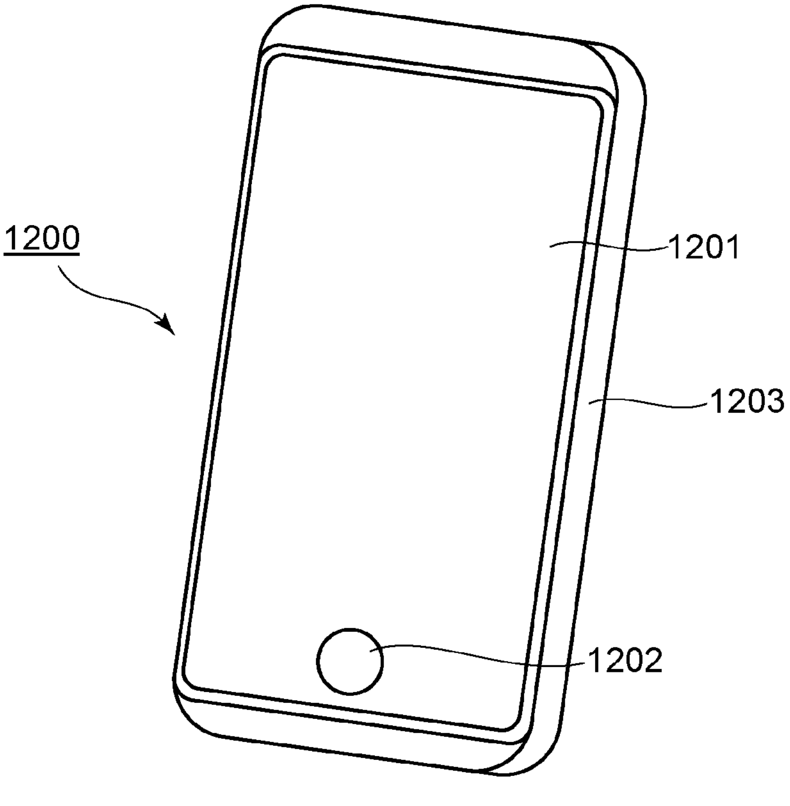
FIG. 5B schematically illustrates an example of a mobile device according to an embodiment of the present disclosure.

FIG. 5B schematically illustrates an example of an electronic apparatus according to this embodiment. An electronic apparatus 1200 includes a display unit 1201, an operation unit 1202, and a housing 1203. The housing 1203 may include a circuit, a printed board including the circuit, a battery, and a communication unit. The operation unit 1202 may be a button or a touch-sensitive response unit. The operation unit may be a biometric recognition unit that, for example, releases a lock through recognition of fingerprints. An electronic apparatus including a communication unit can also be referred to as a communication apparatus.

Figure 6A:
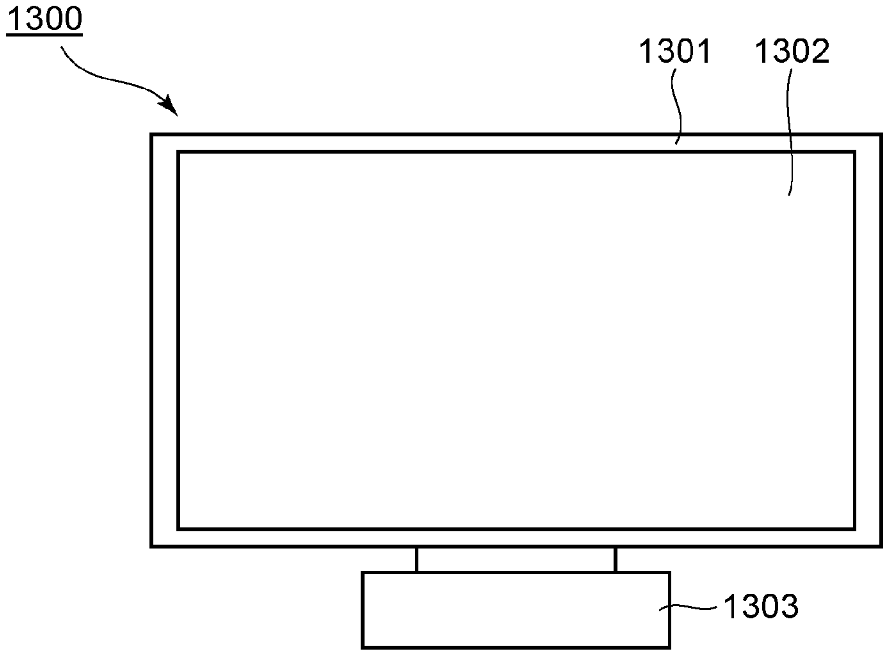
FIG. 6A schematically illustrates an example of a display apparatus according to an embodiment of the present disclosure.
Figure 6B:
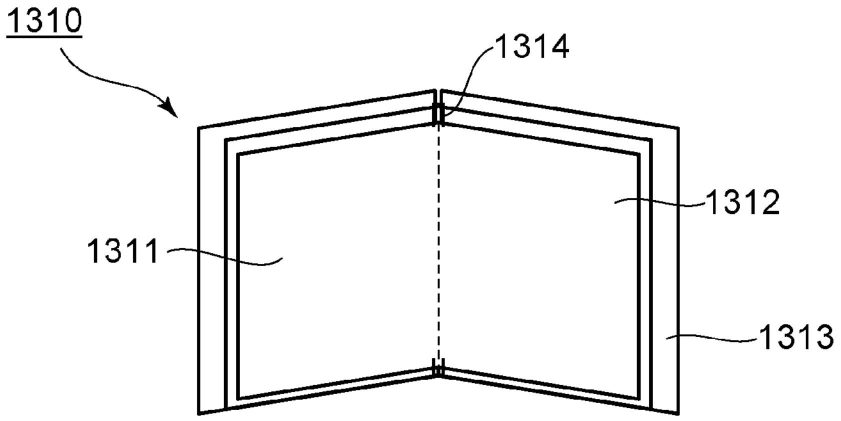
FIG. 6B schematically illustrates an example of a foldable display apparatus.

FIGS. 6A and 6B schematically illustrate examples of display apparatuses according to this embodiment. FIG. 6A illustrates a display apparatus such as a television monitor or a PC monitor. A display apparatus 1300 includes a frame 1301 and a display unit 1302. A light-emitting device according to this embodiment may be used for the display unit 1302. The display apparatus 1300 includes a base 1303 that supports the frame 1301 and the display unit 1302. The base 1303 need not necessarily be in the form illustrated in FIG. 6A. The lower side of the frame 1301 may serve as a base. The frame 1301 and the display unit 1302 may be bent such that the display surface of the display unit 1302 is curved. The radius of the curvature may be 5,000 mm or more and 6,000 mm or less.

FIG. 6B schematically illustrates another example of a display apparatus according to this embodiment. A display apparatus 1310 in FIG. 6B is configured to be foldable and is what is called a foldable display apparatus. The display apparatus 1310 includes a first display unit 1311, a second display unit 1312, a housing 1313, and a bending point 1314. The first display unit 1311 and the second display unit 1312 may include the light-emitting device according to this embodiment. The first display unit 1311 and the second display unit 1312 may be a seamless, monolithic display apparatus. The first display unit 1311 and the second display unit 1312 can be divided by the bending point. The first display unit 1311 and the second display unit 1312 may display different images, or the first and second display units may together display a single image.

Figure 7A:
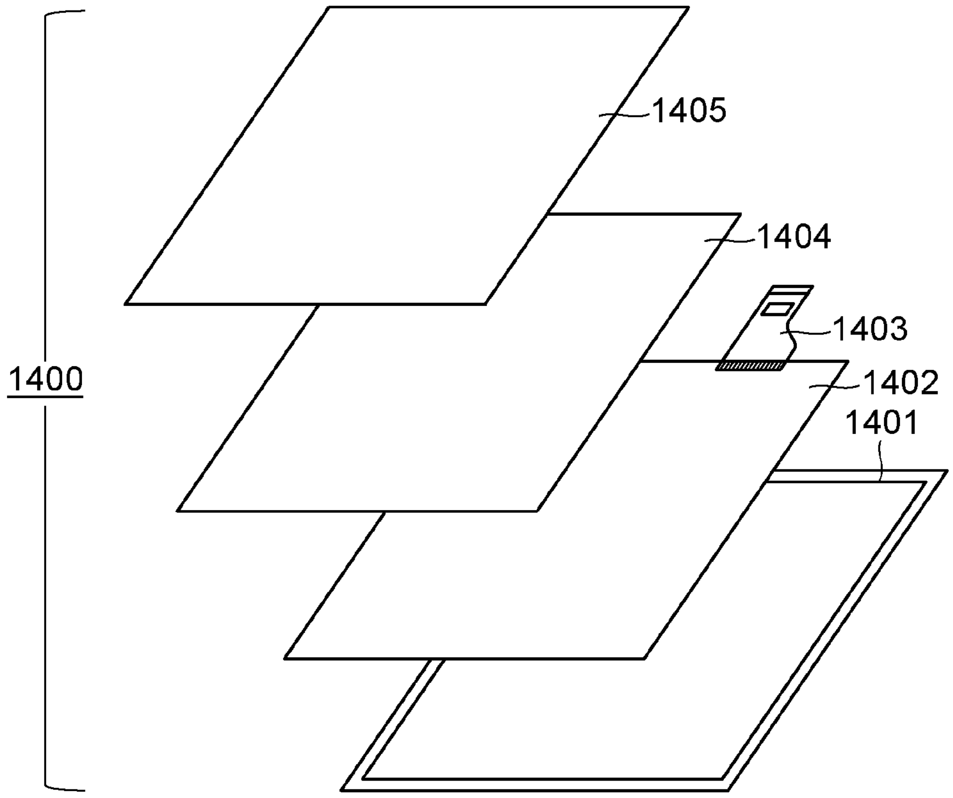
FIG. 7A schematically illustrates an example of an illumination apparatus according to an embodiment of the present disclosure.

FIG. 7A schematically illustrates an example of an illumination apparatus according to this embodiment. An illumination apparatus 1400 may include a housing 1401, a light source 1402, a circuit board 1403, an optical film 1404 that transmits light emitted from the light source 1402, and a light diffusion unit 1405. The light source 1402 may include the organic light-emitting element according to this embodiment. The optical filter may be a filter for improving the color rendering properties of the light source. The light diffusion unit effectively diffuses light from the light source and helps the light reach a wide region for, for example, lighting up. The optical filter and the light diffusion unit may be disposed on the light-emitting side of the illumination apparatus. Optionally, a cover may be disposed at an outermost portion.

The illumination apparatus is, for example, an indoor illumination apparatus. The illumination apparatus may emit light of cool white, day white, or any other color from blue to red. The illumination apparatus may include a light modulation circuit that modulates the light or a color modulation circuit that modulates the color of the emitted light. The illumination apparatus may include the organic light-emitting element according to this embodiment and a power supply circuit connected thereto. The power supply circuit is a circuit that converts AC voltage to DC voltage. Cool white has a color temperature of 4200 K, and day white has a color temperature of 5000 K. The illumination apparatus may include a color filter.

The illumination apparatus according to this embodiment may also include a heat dissipation unit. The heat dissipation unit is configured to dissipate heat inside the apparatus out of the apparatus and may be formed of, for example, a metal of high specific heat or liquid silicone.

Figure 7B:
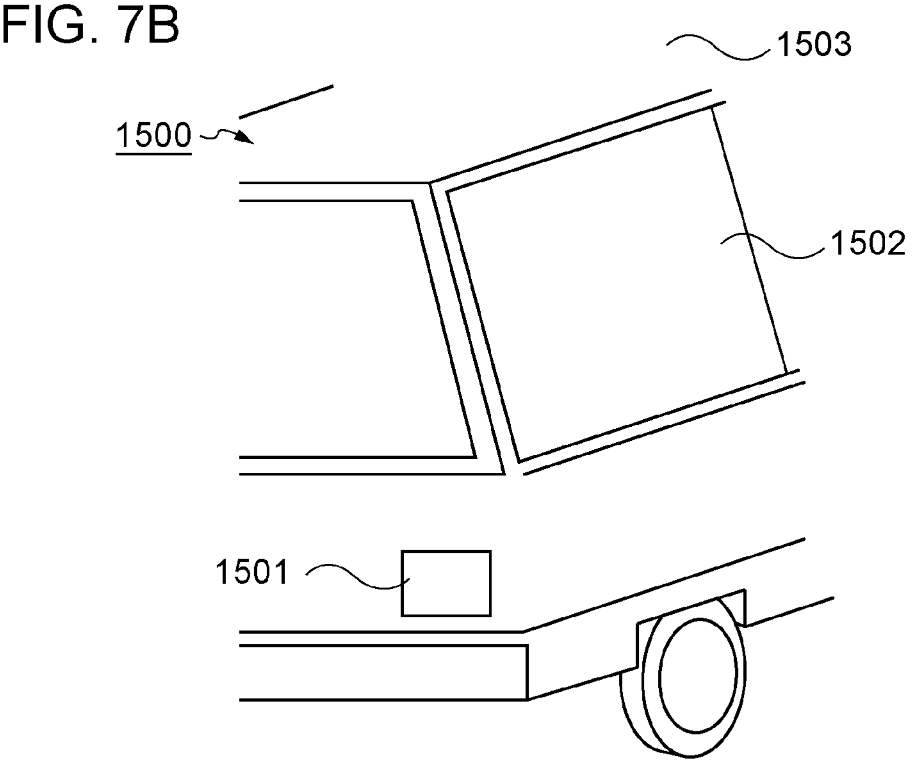
FIG. 7B schematically illustrates an automobile that is an example of a moving object according to an embodiment of the present disclosure.

FIG. 7B schematically illustrates an automobile that is an example of a moving object according to this embodiment. The automobile includes a tail lamp that is an example of a lighting fixture. An automobile 1500 includes a tail lamp 1501, and the tail lamp may be configured to be turned on in response to, for example, brake operation.

The tail lamp 1501 may include the organic light-emitting element according to this embodiment. The tail lamp 1501 may include a protective member that protects the organic EL element. The protective member may be made of any material that is strong to some extent and transparent, and may be made of, for example, polycarbonate. The polycarbonate may be mixed with, for example, a furandicarboxylic acid derivative or an acrylonitrile derivative.

The automobile 1500 may include a car body 1503 and a window 1502 attached thereto. The window 1502 may be a transparent display unless it is a window for checking the front and rear of the automobile. The transparent display may include the organic light-emitting element according to this embodiment.

In this case, components, such as electrodes, of the organic light-emitting element are formed of transparent materials.

The moving object according to this embodiment may be, for example, a ship, an aircraft, or a drone. The moving object may include a body and a lighting fixture disposed on the body. The lighting fixture may emit light for allowing the position of the body to be recognized. The lighting fixture includes the organic light-emitting element according to this embodiment.

Application examples of the display apparatuses according to the above embodiments will be described with reference to FIGS. 8A and 8B. The display apparatuses can be applied to systems that can be worn as wearable devices such as smart glasses, head-mounted displays (HMDs), and smart contact lenses. An image pickup and display apparatus used in such an application example includes an image pickup apparatus that can photoelectrically convert visible light and a display apparatus that can emit visible light.

Figure 8A:
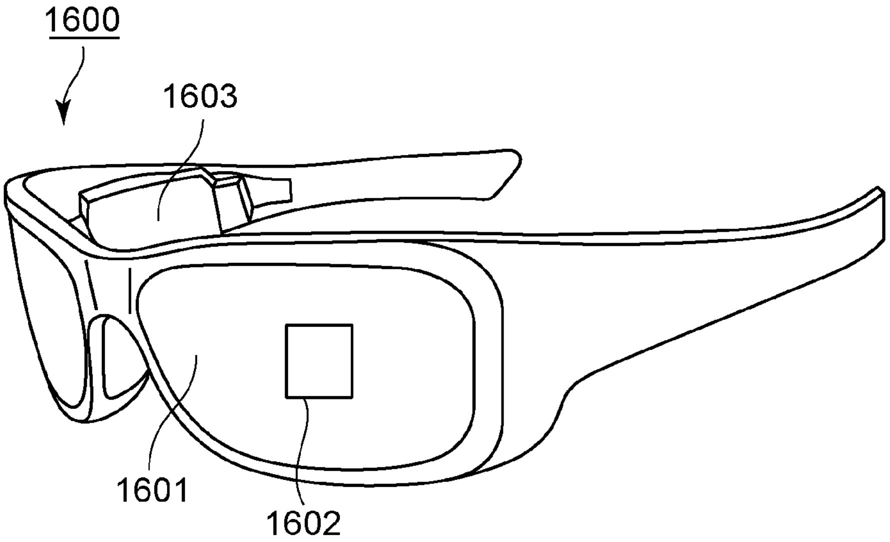
FIG. 8A schematically illustrates an example of a wearable device according to an embodiment of the present disclosure.

FIG. 8A illustrates eyeglasses 1600 (smart glasses) according to one application example. An image pickup apparatus 1602, such as a complementary metal-oxide semiconductor (CMOS) sensor or a single-photon avalanche diode (SPAD), is disposed on the front side of a lens 1601 of the eyeglasses 1600. The display apparatus according to any one of the above embodiments is provided on the rear side of the lens 1601.

The eyeglasses 1600 further include a controller 1603. The controller 1603 functions as a power source for supplying electricity to the image pickup apparatus 1602 and the display apparatus according to any of the embodiments. The controller 1603 controls the operation of the image pickup apparatus 1602 and the display apparatus. The lens 1601 is provided with an optical system for focusing light on the image pickup apparatus 1602.

Figure 8B:
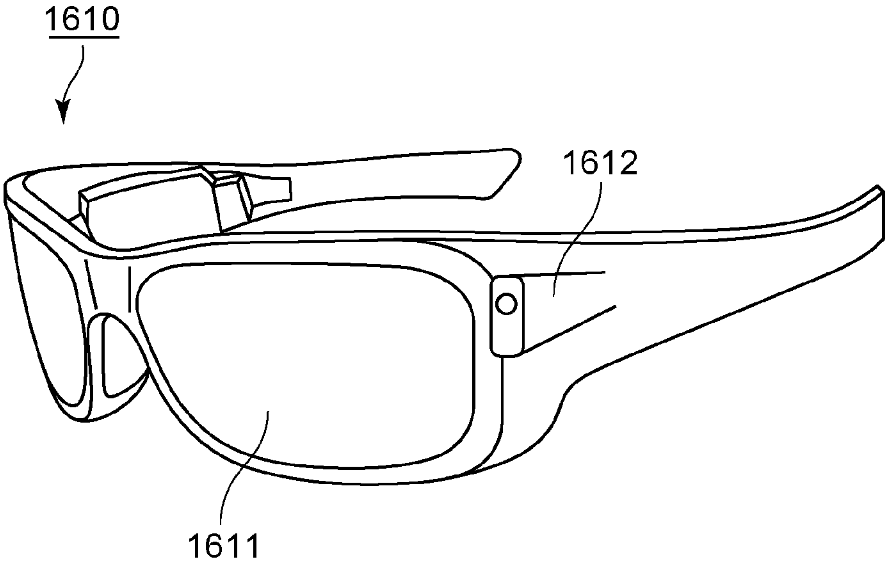
FIG. 8B schematically illustrates an example of a wearable device according to an embodiment of the present disclosure, the wearable device including an image pickup apparatus.

FIG. 8B illustrates eyeglasses 1610 (smart glasses) according to one application example. The eyeglasses 1610 include a controller 1612, and the controller 1612 is equipped with an image pickup apparatus corresponding to the image pickup apparatus 1602 and a display apparatus. A lens 1611 is provided with an optical system for focusing light on the image pickup apparatus in the controller 1612 and projecting light emitted from the display apparatus, and an image is projected onto the lens 1611. The controller 1612 functions as a power source for supplying electricity to the image pickup apparatus and the display apparatus and also controls the operation of the image pickup apparatus and the display apparatus. The controller may include a gaze detection unit that detects the gaze of a wearer. The gaze may be detected using infrared radiation. An infrared light emission unit emits infrared light to an eyeball of a user gazing at a displayed image. The reflection of the emitted infrared light from the eyeball is detected by an image pickup unit including a light-receiving element, whereby a captured image of the eyeball is obtained. Due to the presence of a reduction unit that reduces light from the infrared light emission unit to the display unit in plan view, degradation of image quality is reduced.

The gaze of the user toward the displayed image is detected from the captured image of the eyeball obtained by infrared imaging. Any known method may be used for the gaze detection using the captured image of the eyeball. For example, a gaze detection method based on a Purkinje image formed by the reflection of irradiation light on a cornea may be used.

More specifically, a gaze detection process based on a pupil-corneal reflection method is performed. Using the pupil-corneal reflection method, a gaze vector representing the direction (rotation angle) of the eyeball is calculated on the basis of a pupil image and a Purkinje image included in the captured image of the eyeball, whereby the gaze of the user is detected.

A display apparatus according to an embodiment of the present disclosure may include an image pickup apparatus including a light-receiving element and may control a displayed image on the display apparatus on the basis of the gaze information of the user from the image pickup apparatus.

Specifically, the display apparatus determines, on the basis of the gaze information, a first visual field at which the user gazes and a second visual field other than the first visual field. The first visual field and the second visual field may be determined by the controller of the display apparatus, or may be determined by an external controller and sent therefrom. In a display area of the display apparatus, the display resolution of the first visual field may be controlled to be higher than the display resolution in the second visual field. That is, the resolution in the second visual field may be set to be lower than that in the first visual field.

The display area includes a first display area and a second display area different from the first display area, and an area of high priority is determined from the first display area and the second display area on the basis of the gaze information. The first visual field and the second visual field may be determined by the controller of the display apparatus, or may be determined by an external controller and sent therefrom. The resolution in the area of high priority may be controlled to be higher than the resolution in the area other than the area of high priority. That is, the resolution in an area of relatively low priority may be set to be lower.

Artificial intelligence (AI) may be used to determine the first visual field or the area of high priority. AI may be a model configured to estimate, from an image of an eyeball, the angle of gaze and the distance to an object gazed, by using the image of the eyeball and the actual direction of gaze of the eyeball in the image as teaching data. The AI program may be included in the display apparatus, the image pickup apparatus, or an external apparatus. When the AI program is included in the external apparatus, the obtained data is transmitted to the display apparatus via communications.

When display control is performed on the basis of visual recognition, smart glasses further including an image pickup apparatus that captures an external image are suitable for use. Smart glasses can display captured external information in real time.

Figure 9:
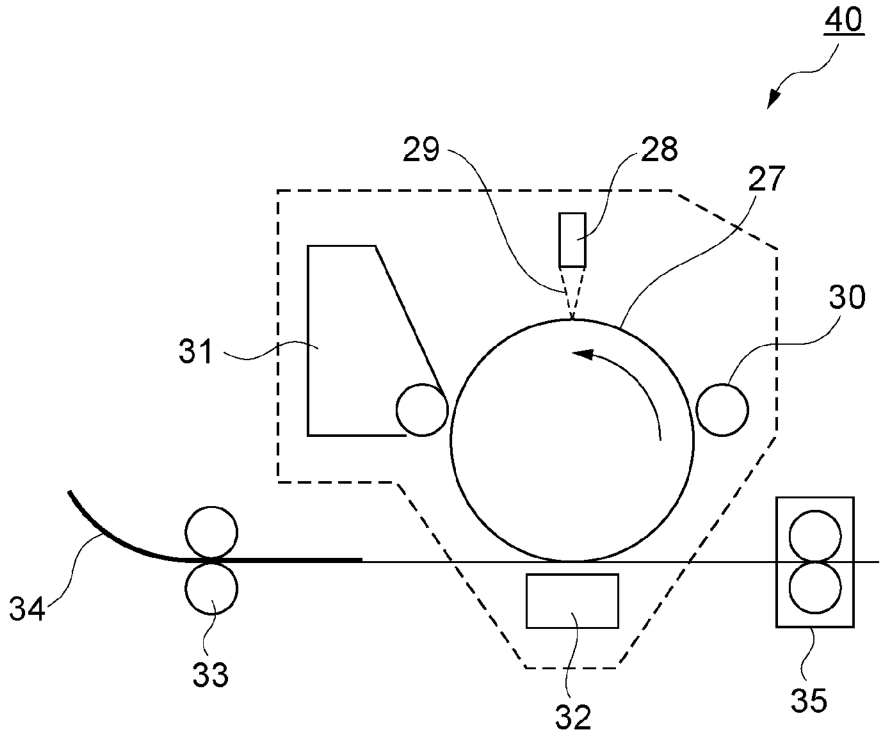
FIG. 9 schematically illustrates an example of an image-forming apparatus according to an embodiment of the present disclosure.

FIG. 9 schematically illustrates an example of an image-forming apparatus according to this embodiment. An image-forming apparatus 40 is an electrophotographic image-forming apparatus and includes a photoreceptor 27, an exposure light source 28, a charging unit 30, a developing unit 31, a transfer unit 32, a conveyer roller 33, and a fixing unit 35. The exposure light source 28 emits light 29, and an electrostatic latent image is formed on the surface of the photoreceptor 27. The exposure light source 28 includes the organic light-emitting element according to this embodiment. The developing unit 31 contains toner and the like. The charging unit 30 charges the photoreceptor 27. The transfer unit 32 transfers a developed image onto a recording medium 34. The conveyer roller 33 conveys the recording medium 34. The recording medium 34 is paper, for example. The fixing unit 35 fixes an image formed on the recording medium 34.

Figures 10A, 10B:
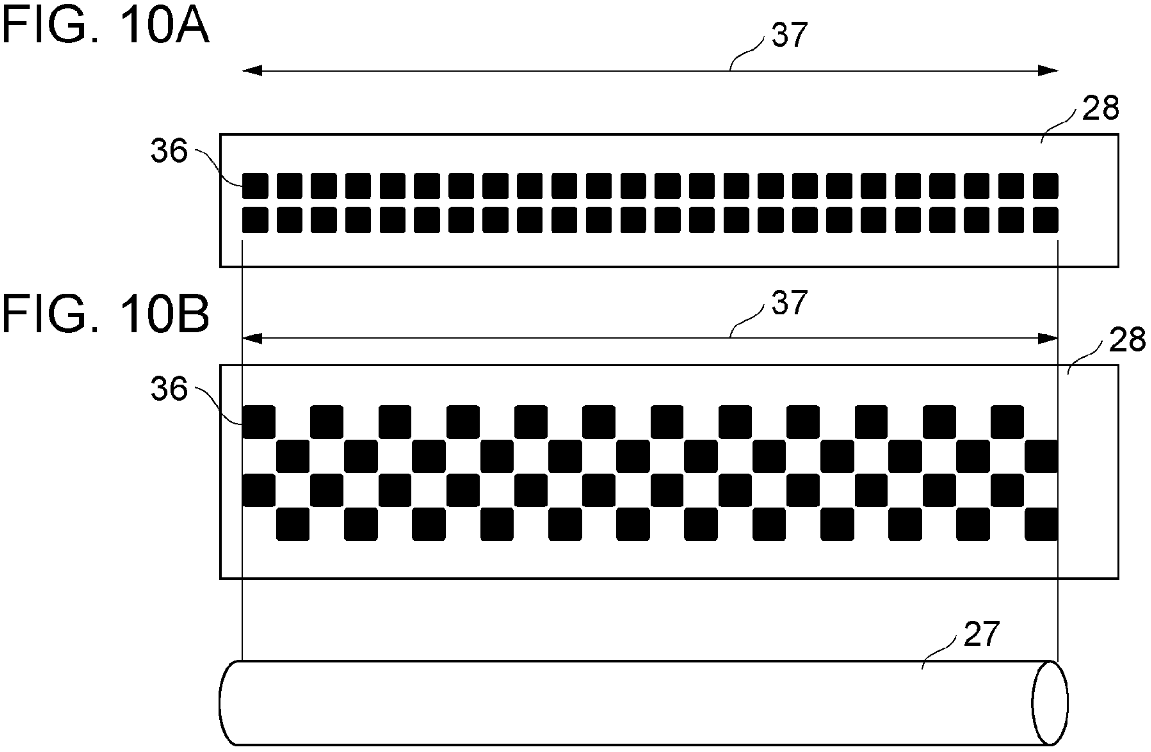
FIGS. 10A and 10B each schematically illustrate an example of an exposure light source of an image-forming apparatus according to an embodiment of the present disclosure.

FIGS. 10A and 10B each illustrate the exposure light source 28 and each schematically illustrate how a plurality of light-emitting portions 36 are arranged on a long substrate. An arrow 37 indicates the row direction in which the organic light-emitting elements are arranged. The row direction is the same as the direction of the rotation axis of the photoreceptor 27. This direction can also be referred to as the major-axis direction of the photoreceptor 27. In FIG. 10A, the light-emitting portions 36 are arranged along the major-axis direction of the photoreceptor 27. In FIG. 10B, unlike FIG. 10A, the light-emitting portions 36 are alternately arranged in the row direction in a first row and a second row. The first row and the second row are located at different positions in the column direction. In the first row, the plurality of light-emitting portions 36 are arranged at intervals. In the second row, the light-emitting portions 36 are arranged at positions corresponding to the spaces between the light-emitting portions 36 in the first row. That is, the plurality of light-emitting portions 36 are arranged at intervals also in the column direction. The arrangement in FIG. 10B can be referred to as, for example, a lattice arrangement, a staggered arrangement, or a checkered pattern.

As described above, the use of an apparatus including the organic light-emitting element according to this embodiment enables a stable display with good image quality over a long period of time.

EXAMPLES

The present disclosure will now be described with reference to Examples. It should be noted that the present disclosure not limited to these Examples.

Example 1 (Synthesis of Exemplary Compounds A25 and A33)

Exemplary compounds A25 and A33 were synthesized by the following synthesis scheme.

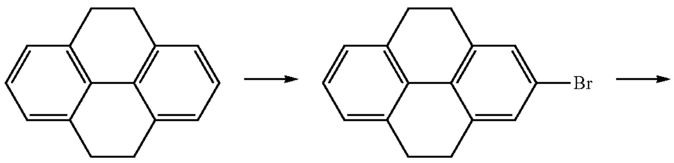

m-1 m-2

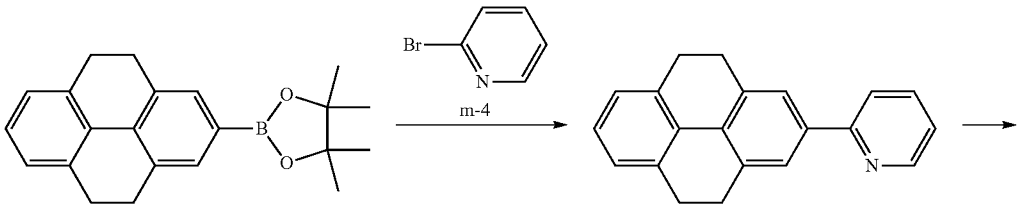

m-3 m-5

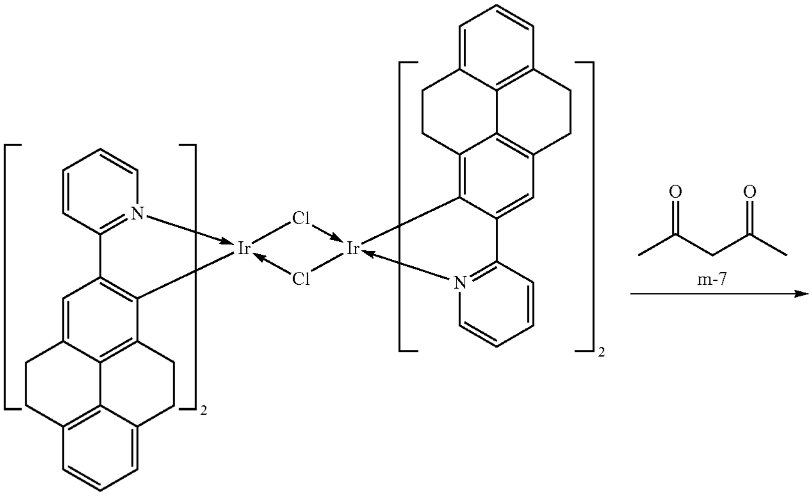

m-6

-continued

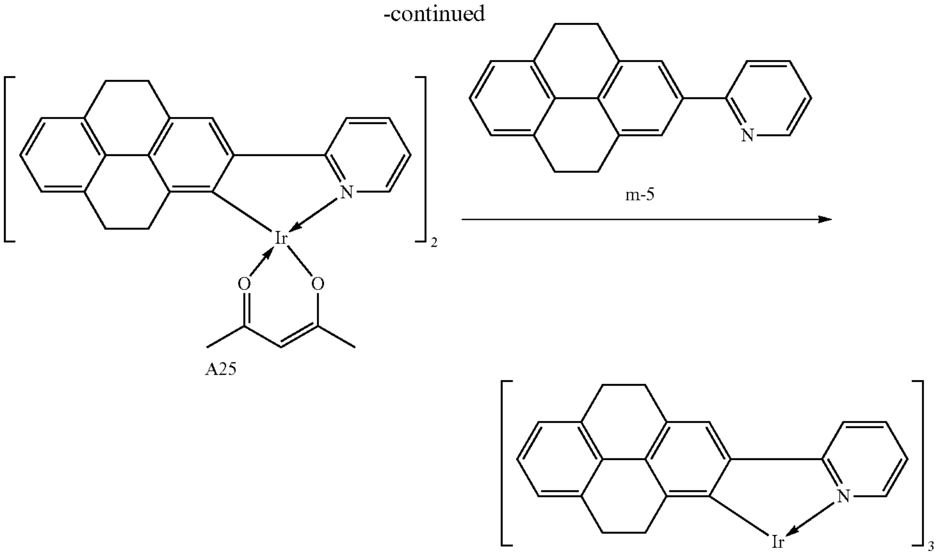

A25 m-5 A33

(1) Synthesis of Compound m-2

The following reagents and solvent were placed in a 2000 ml recovery flask.

Compound m-1: 10.0 g (0.05 mol)

Bromine: 6.9 g (0.04 mol)

Chloroform: 500 ml

Next, the reaction solution was stirred at room temperature under a stream of nitrogen. After completion of the reaction, water was added at room temperature, and the reaction solution was subjected to liquid-liquid extraction. The organic layer was concentrated, and the resulting residue was purified by column chromatography (chloroform/heptane=1:4) and then recrystallized from chloroform/methanol to obtain 11.3 g of a light brown solid m-2 (yield: 82%).

(2) Synthesis of Compound m-3

The following reagents and solvent were placed in a 200 ml recovery flask.

Compound m-2: 10.0 g (35.1 mmol)

Bispinacol diborolane: 13.4 g (52.6 mmol)

$Pd(PPh_3)_2Cl_2$: 0.3 g (0.04 mmol)

Potassium acetate: 8.6 g (87.7 mmol)

Dioxane: 200 ml

Next, the reaction solution was heated with stirring under a stream of nitrogen. After completion of the reaction, pure water was added at room temperature. The reaction solution was extracted with toluene, and the extract was concentrated, after which the resulting residue was purified by column chromatography (toluene/heptane=1:4) and then washed by dispersion with heptane to obtain 8.1 g of a light brown solid m-3 (yield: 70%).

(3) Synthesis of Compound m-5

The following reagents and solvents were placed in a 200 ml recovery flask.

Compound m-3: 5.0 g (15.0 mmol)

Compound m-4: 2.85 g (18.1 mmol)

$Pd(PPh_3)_4$: 0.17 g

Toluene: 50 ml

Ethanol: 25 ml

2 M aqueous sodium carbonate solution: 25 ml

Next, the reaction solution was heated with stirring at 80° C. for 6 hours under a stream of nitrogen. After completion of the reaction, water was added, and liquid-liquid extraction was performed. The resulting product was dissolved in chloroform, purified by column chromatography (chloroform), and then recrystallized from chloroform/methanol to obtain 2.2 g of a light yellow solid compound m-5 (yield: 52%).

(4) Synthesis of Compound m-6

The following reagents and solvents were placed in a 200 ml recovery flask.

2-Ethoxyethanol: 30 ml

Ion-exchanged water: 10 ml

Iridium (III) chloride hydrate: 0.45 g

Compound m-5: 1.0 g (3.5 mmol)

Next, the reaction solution was heated to 120° C. and stirred for 6 hours. After cooling, water was added, and the resulting product was filtered and washed with water. The resulting product was dried to obtain 1.2 g of a yellow solid compound m-6 (yield: 87%).

(5) Synthesis of Exemplary Compound A25

The following reagents and solvent were placed in a 200 ml recovery flask.

2-Ethoxyethanol: 30 ml

Compound m-6: 1.0 g (0.6 mmol)

Compound m-7: 0.25 g (2.5 mmol)

Sodium carbonate: 0.7 g (6.3 mmol)

Next, the reaction solution was heated to 100° C. and stirred for 6 hours. After cooling, methanol was added, and the resulting product was filtered and washed with methanol. The resulting product was dried to obtain 0.7 g of a yellow solid exemplary compound A25 (yield: 64%).

Exemplary compound A25 was subjected to mass spectrometry using MALDI-TOF-MS (Autoflex LRF manufactured by Bruker Corporation).

MALDI-TOF-MS

Measured value: m/z=857, calculated value: $C_{47}H_{40}IrN_2O_2$=857

(6) Synthesis of Exemplary Compound A33

The following reagents and solvent were placed in a 50 ml recovery flask.

Exemplary compound A25: 0.5 g (0.6 mmol)

Compound m-5: 1.7 g (5.8 mmol)

Glycerol: 15 ml

Next, the reaction solution was heated to 230° C. and stirred for 3 hours. After cooling to 100° C., 2 mL of toluene was added, and the resulting product was stirred to room temperature. Subsequently, heptane was added, and the resulting product was filtered. The residue was purified by silica gel column chromatography (ethyl acetate) to obtain 0.1 g of a thick yellow solid A35 (yield: 20%).

Exemplary compound A25 was subjected to mass spectrometry using MALDI-TOF-MS (Autoflex LRF manufactured by Bruker Corporation).

MALDI-TOF-MS

Measured value: m/z=1040, calculated value: $C_{63}H_{49}IrN_3$=1040

Examples 2 to 7 (Synthesis of Exemplary Compounds)

Exemplary compounds of Examples 2 to 7 shown in Table 2 were synthesized in the same manner as in Example 1 except that the raw materials m-2, m-4, and m-7 in Example 1 were changed. Measured values (m/z) of mass spectrometry determined in the same manner as in Example 1 are also shown.

TABLE 2

| Example | Exemplary compound | Raw material m-2 | Raw material m-4 | Raw material m-7 | m/z |
|---|---|---|---|---|---|
| 2 | B25 | 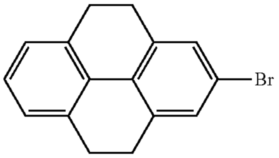 | 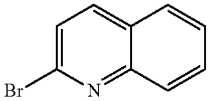 [SMILES: Brc1ccc2ccccc2n1] | 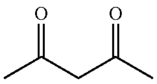 | 956 |
| 3 | A27 | 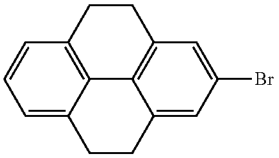 | 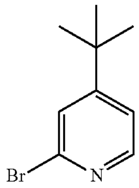 | 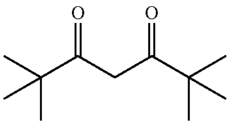 | 1052 |
| 4 | C9 | 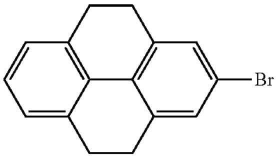 | 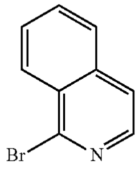 [SMILES: Brc1nccc2ccccc12] | 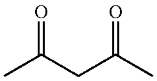 | 956 |
| 5 | C13 | 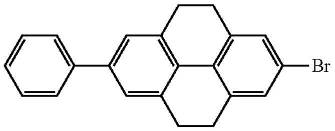 [SMILES: Brc1cc2c3c(c1)CCc1cc(-c4ccccc4)cc(c1-3)CC2] | 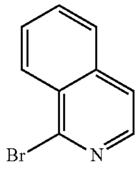 [SMILES: Brc1nccc2ccccc12] | 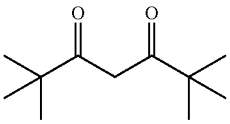 | 1204 |
| 6 | D23 | 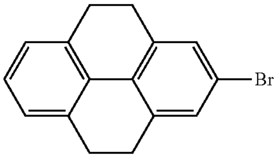 | 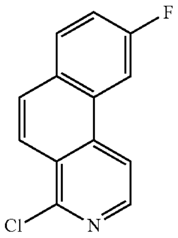 [SMILES: Fc1ccc2ccc3c(Cl)nccc3c2c1] | 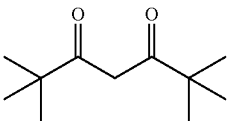 | 1176 |

TABLE 2-continued

| Example | Exemplary compound | Raw material m-2 | Raw material m-4 | Raw material m-7 | m/z |
|---|---|---|---|---|---|
| 7 | E17 | 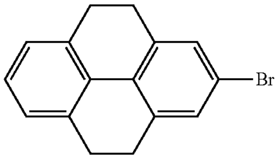 [SMILES: Brc1cc2c3c(c1)CCc1cccc(c1-3)CC2] | 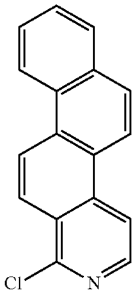 [SMILES: Clc1nccc2c1ccc1c3ccccc3ccc21] | 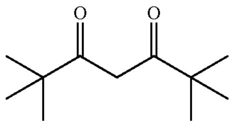 | 1240 |

Examples 8 and 9 (Synthesis of Exemplary Compounds)

Exemplary compounds of Examples 8 and 9 shown in Table 3 were synthesized in the same manner as in Example 1 except that the raw materials m-2, m-4, and m-5 in Example 1 were changed. Measured values (m/z) of mass spectrometry determined in the same manner as in Example 1 are also shown.

TABLE 3

| Example | Exemplary compound | Raw material m-2 | Raw material m-4 | Raw material m-5 | m/z |
|---|---|---|---|---|---|
| 8 | B16 | 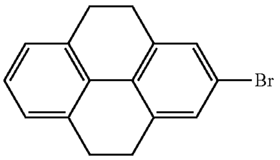 [SMILES: Brc1cc2c3c(c1)CCc1cccc(c1-3)CC2] | 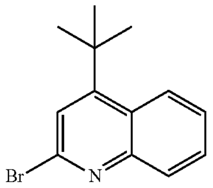 | 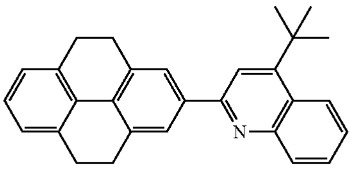 [SMILES: CC(C)(C)c1cc(-c2cc3c4c(c2)CCc2cccc(c2-4)CC3)nc2ccccc12] | 1357 |
| 9 | C18 | 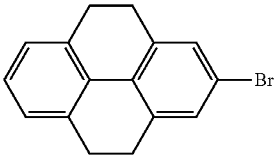 | 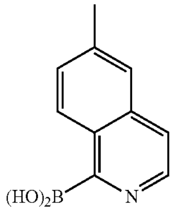 | 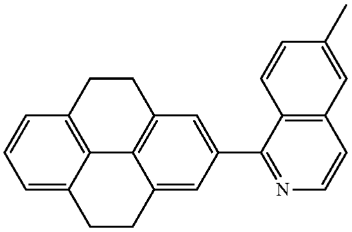 [SMILES: Cc1ccc2c(-c3cc4c5c(c3)CCc3cccc(c3-5)CC4)nccc2c1] | 1231 |

Example 10 (Synthesis of Exemplary Compound A1)

Exemplary compound A1 was synthesized by the following synthesis scheme.

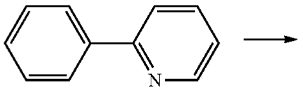

k-1

-continued

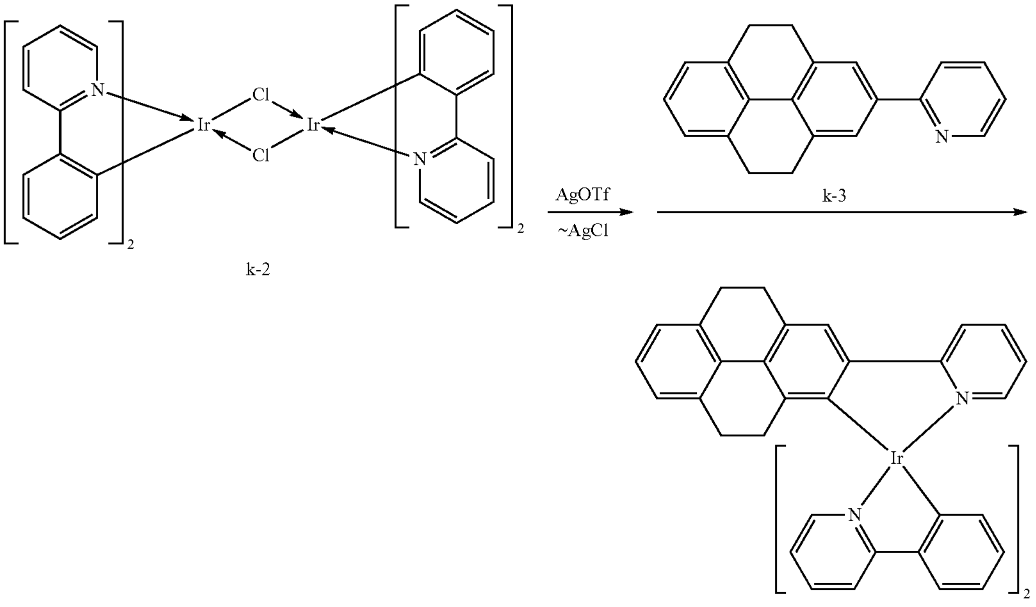

k-2 k-3 A1

(1) Synthesis of Compound k-2

The synthesis of compound k-2 from compound k-1 is the same as (4) Synthesis of compound m-6 in Example 1, and thus the description thereof is omitted.

(2) Synthesis of Exemplary Compound A1

The following reagents and solvents were placed in a 200 ml recovery flask.

Compound k-2: 1.0 g (0.9 mmol)

AgOTf: 0.5 g (1.9 mmol)

Dichloromethane: 50 ml

Methanol: 2 ml

Next, the reaction solution was stirred at room temperature for 6 hours. Thereafter, the solvents were distilled off under reduced pressure to obtain a yellow solid.

Next, the yellow solid obtained and the following reagent and solvent were placed in a 200 ml recovery flask. Compound k-3 was synthesized according to the procedure (1) to (3) in Example 1.

Ethanol: 30 ml

Compound k-3: 0.4 g (1.4 mmol)

Next, the reaction solution was heated to 85° C. and stirred for 3 hours. After cooling, filtration was performed. The residue was purified by silica gel column chromatography (chloroform:heptane=1:1) to obtain 0.9 g of a thick yellow solid A1 (yield: 59%).

Exemplary compound A1 was subjected to mass spectrometry using MALDI-TOF-MS (Autoflex LRF manufactured by Bruker Corporation).

MALDI-TOF-MS

Measured value: m/z=783, calculated value: $C_{43}H_{32}IrN_3$=783

Examples 11 to 20 (Synthesis of Exemplary Compounds)

Exemplary compounds of Examples 11 to 20 shown in Table 4 were synthesized in the same manner as in Example 10 except that the raw materials k-1 and k-3 in Example 10 were changed. Measured values (m/z) of mass spectrometry determined in the same manner as in Example 10 are also shown.

TABLE 4

| Example | Exemplary compound | Raw material k-1 | Raw material k-3 | m/z |
|---|---|---|---|---|
| 11 | A2 | 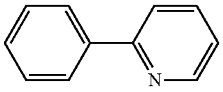 [SMILES: c1ccc(-c2ccccn2)cc1] | 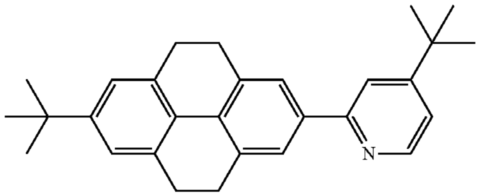 [SMILES: CC(C)(C)c1ccnc(-c2cc3c4c(c2)CCc2cc(C(C)(C)C)cc(c2-4)CC3)c1] | 895 |

TABLE 4-continued
| Example | Exemplary compound | Raw material k-1 | Raw material k-3 | m/z |
|---|---|---|---|---|
| 12 | A10 | 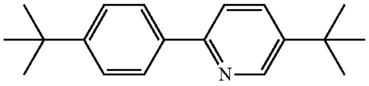 [SMILES: CC(C)(C)c1ccc(-c2ccc(C(C)(C)C)cn2)cc1] | 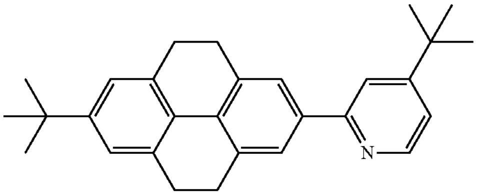 [SMILES: CC(C)(C)c1ccnc(-c2cc3c4c(c2)CCc2cc(C(C)(C)C)cc(c2-4)CC3)c1] | 1119 |
| 13 | A14 | 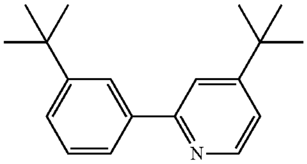 [SMILES: CC(C)(C)c1cccc(-c2cc(C(C)(C)C)ccn2)c1] | 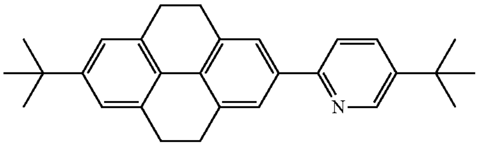 [SMILES: CC(C)(C)c1ccc(-c2cc3c4c(c2)CCc2cc(C(C)(C)C)cc(c2-4)CC3)nc1] | 1063 |
| 14 | A12 | 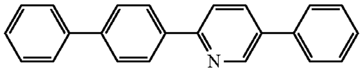 [SMILES: c1ccc(-c2ccc(-c3ccc(-c4ccccc4)cn3)cc2)cc1] | 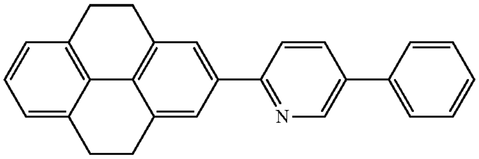 [SMILES: c1ccc(-c2ccc(-c3cc4c5c(c3)CCc3cccc(c3-5)CC4)nc2)cc1] | 1163 |
| 15 | A17 | 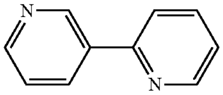 [SMILES: c1ccc(-c2cccnc2)nc1] | 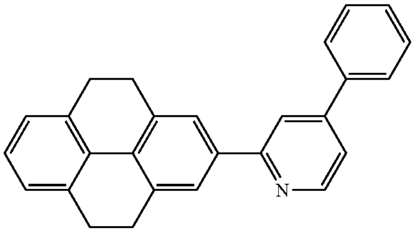 [SMILES: c1ccc(-c2ccnc(-c3cc4c5c(c3)CCc3cccc(c3-5)CC4)c2)cc1] | 861 |
| 16 | B10 | 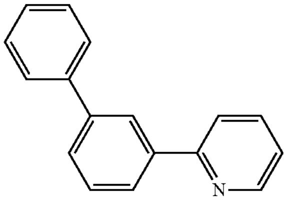 [SMILES: c1ccc(-c2cccc(-c3ccccn3)c2)cc1] | 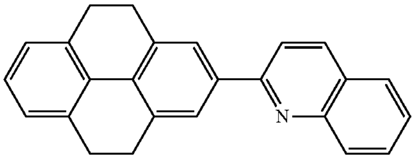 [SMILES: c1cc2c3c(c1)CCc1cc(-c4ccc5ccccc5n4)cc(c1-3)CC2] | 985 |
| 17 | C2 | 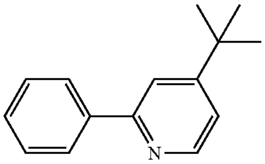 [SMILES: CC(C)(C)c1ccnc(-c2ccccc2)c1] | 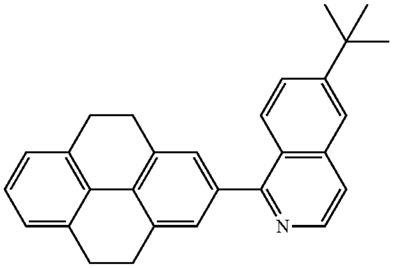 [SMILES: CC(C)(C)c1ccc2c(-c3cc4c5c(c3)CCc3cccc(c3-5)CC4)nccc2c1] | 1001 |

TABLE 4-continued
| Example | Exemplary compound | Raw material k-1 | Raw material k-3 | m/z |
|---|---|---|---|---|
| 18 | D11 | 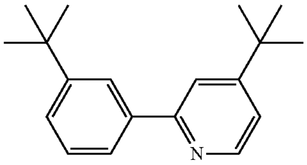 [SMILES: CC(C)(C)c1cccc(-c2cc(C(C)(C)C)ccn2)c1] | 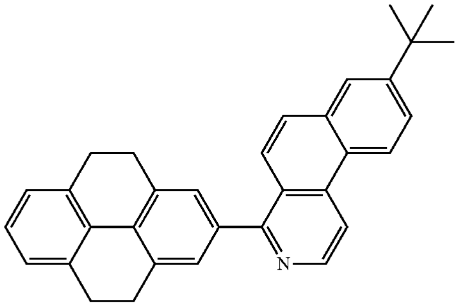 [SMILES: CC(C)(C)c1ccc2c(ccc3c(-c4cc5c6c(c4)CCc4cccc(c4-6)CC5)nccc32)c1] | 1163 |
| 19 | D12 | 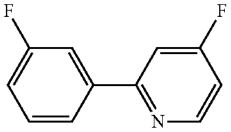 [SMILES: Fc1cccc(-c2cc(F)ccn2)c1] | 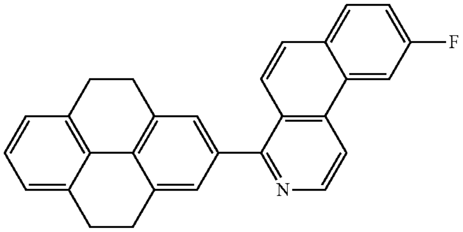 [SMILES: Fc1ccc2ccc3c(-c4cc5c6c(c4)CCc4cccc(c4-6)CC5)nccc3c2c1] | 973 |
| 20 | E1 | 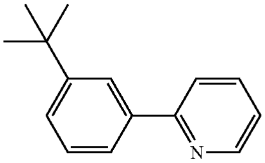 [SMILES: CC(C)(C)c1cccc(-c2ccccn2)c1] | 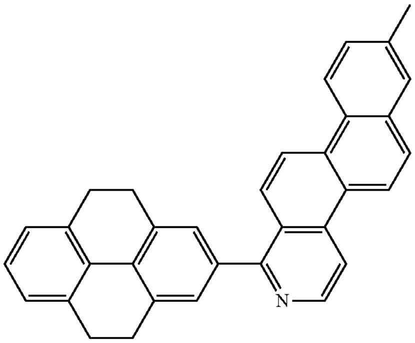 [SMILES: Cc1ccc2c(ccc3c4ccnc(-c5cc6c7c(c5)CCc5cccc(c5-7)CC6)c4ccc23)c1] | 1059 |

Comparative Examples 1 and 2 (Synthesis of Comparative Compounds)

Comparative compound 1-a and comparative compound 1-b shown in Table 5 were synthesized in the same manner as in Example 1 except that the raw materials m-2 and m-4 in Example 1 were changed. Measured values (m/z) of mass spectrometry determined in the same manner as in Example 1 are also shown.

First, an ITO film was formed on a glass substrate and subjected to desired patterning to form an ITO electrode (anode). At this time, the ITO electrode was formed so as to have a thickness of 100 nm. The substrate on which the ITO electrode was formed in this manner was used as an ITO substrate in the following process. Next, organic compound layers and an electrode layer shown in Table 6 were successively formed on the ITO substrate by performing vacuum deposition by resistance heating in a vacuum chamber at $1.33\times10^{-4}$ Pa. At this time, the electrode area of the counter electrode (metal electrode layer, cathode) was set to 3 $mm^2$.

TABLE 5

| Comparative Example | Compound | Structure | Raw material m-2 | Raw material m-4 | m/z |
|---|---|---|---|---|---|
| 1 | 1-a | 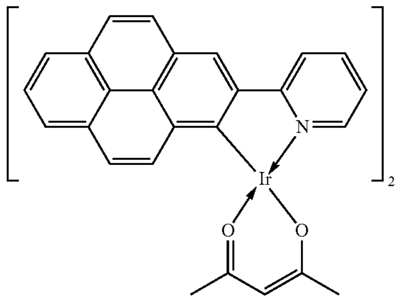 | 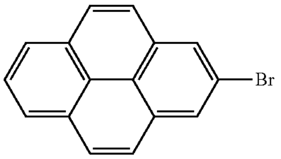 [SMILES: Brc1cc2ccc3cccc4ccc(c1)c2c34] | 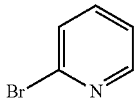 | 847 |
| 2 | 1-b | 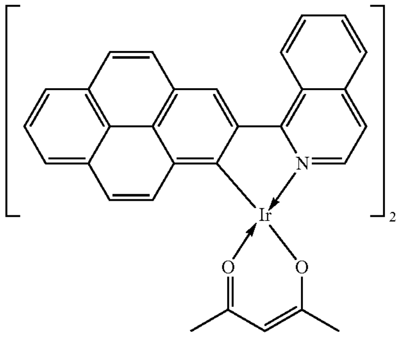 | 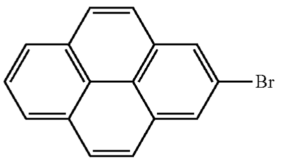 [SMILES: Brc1cc2ccc3cccc4ccc(c1)c2c34] | 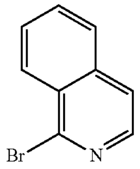 [SMILES: Brc1nccc2ccccc12] | 948 |

In an attempt to perform sublimation purification of comparative compound 1-a, a decrease in purity was observed. Comparative compound 1-a and comparative compound 1-b were measured for emission wavelength and each found to have a maximum emission wavelength λmax of more than 680 nm and not within the visible light region. Thus, comparative compound 1-a and comparative compound 1-b are not suitable for organic light-emitting elements for image display devices such as displays. Furthermore, in an attempt to perform sublimation purification of comparative compound 1-b, sublimation purification could not be successfully performed, and decomposition was observed. This is probably because the sublimation temperature was high due to a pyrene skeleton with very high ligand planarity and pyrolysis occurred before sublimation occurred, as described above.

Example 21

An organic light-emitting element having a bottom-emission structure was produced in which an anode, a hole injection layer, a hole transport layer, an electron blocking layer, a light-emitting layer, a hole blocking layer, an electron transport layer, an electron injection layer, and a cathode were sequentially formed on a substrate.

TABLE 6

| | | | Material | Proportion in light-emitting layer (mass %) | Thickness (nm) |
|---|---|---|---|---|---|
| Electrode layer | Cathode | | Al | — | 100 |
| Organic compound layer | Electron injection layer (EIL) | | LiF | — | 1 |
| | Electron transport layer (ETL) | | ET2 | — | 20 |
| | Hole blocking layer (HBL) | | ET11 | — | 20 |
| | Light-emitting layer (EML) | Host | BB16 | 90 | 20 |
| | | Guest | A1 | 10 | |
| | Electron blocking layer (EBL) | | HT19 | — | 15 |
| | Hole transport layer (HTL) | | HT3 | — | 30 |
| | Hole injection layer (HIL) | | HT16 | — | 5 |

The characteristics of the element obtained were measured and evaluated. The light-emitting element had a maximum emission wavelength of 532 nm and a maximum external quantum efficiency (E.Q.E.) of 11%. Furthermore, a continuous driving test at a current density of 100 mA/cm$^2$ was performed to measure the time (LT95) taken for the luminance degradation to reach 5%. When the time (LT95) taken for the luminance degradation to reach 5% in Comparative Example 3 was taken as 1.0, LT95 in this Example was 1.4.

In this Example, the following measurement apparatuses were used. Specifically, the current-voltage characteristics were measured with a microammeter 4140B manufactured by Hewlett-Packard Company, and the emission luminance was measured with a BM7 manufactured by TOPCON Corporation.

Examples 22 to 31 and Comparative Example 3

Organic light-emitting elements were produced in the same manner as in Example 21 except that the materials used to form the layers were appropriately changed to compounds shown in Table 7. For the layers not listed in Table 7, the same configuration as in Example 21 was used. The characteristics of the elements obtained were measured and evaluated in the same manner as in Example 21. The results of the measurements are shown in Table 7 together with the results of Example 21.

TABLE 7

| | HIL | HTL | EBL | EML Host | EML Guest | HBL | ETL | E.Q.E [%] | LT95 [—] |
|---|---|---|---|---|---|---|---|---|---|
| Example 21 | HT16 | HT3 | HT19 | BB16 | A1 | ET11 | ET2 | 11 | 1.3 |
| Example 22 | HT16 | HT3 | HT19 | BB16 | A14 | ET12 | ET15 | 12 | 1.4 |
| Example 23 | HT16 | HT2 | HT15 | BB17 | A10 | ET12 | ET2 | 11 | 1.5 |
| Example 24 | HT16 | HT2 | HT15 | CC19 | A11 | ET11 | ET2 | 11 | 1.4 |
| Example 25 | HT16 | HT3 | HT19 | CC18 | A17 | ET12 | ET15 | 11 | 1.4 |
| Example 26 | HT16 | HT3 | HT19 | AA7 | A25 | ET12 | ET15 | 11 | 1.2 |
| Example 27 | HT16 | HT3 | HT19 | BB41 | B5 | ET11 | ET15 | 8 | 1.7 |
| Example 28 | HT16 | HT3 | HT19 | CC4 | C9 | ET12 | ET2 | 9 | 1.9 |
| Example 29 | HT16 | HT2 | HT15 | BB38 | D11 | ET12 | ET15 | 12 | 1.9 |
| Example 30 | HT16 | HT3 | HT19 | BB20 | D6 | ET12 | ET15 | 11 | 1.9 |
| Example 31 | HT16 | HT2 | HT15 | EM16 | A1 | ET11 | ET2 | 10 | 1.1 |
| Comparative Example 3 | HT16 | HT3 | HT19 | BB37 | 1-a | ET11 | ET2 | 2 | 1.0 |

Table 7 shows that the maximum external quantum efficiency (E.Q.E.) of Comparative Example 3 is 2%, whereas the maximum external quantum efficiencies of Examples 21 to 31 are 8% to 12%, indicating that the organic light-emitting elements of Examples 21 to 31 have higher light emission efficiencies. This is probably because the organic compounds contained as guests in the light-emitting layers of the organic light-emitting elements of Examples 21 to 31 have higher quantum yields than comparative compound 1-a contained as a guest in the light-emitting layer of Comparative Example 3. The reason for this is probably as follows: since the organic compounds contained as guests in the light-emitting layers of the organic light-emitting elements of Examples 21 to 31 each have a tetrahydropyrene skeleton, the t-conjugated system does not excessively extend as described above, and sufficient MLCT transition can be exhibited.

Table 7 also shows that the organic light-emitting elements of Examples 21 to 31 are longer lived than the organic light-emitting element of Comparative Example 3. It is presumed that the Ir complex (comparative compound 1-a) contained as a guest in the light-emitting layer of the organic light-emitting element of Comparative Example 3 is a material having low sublimability and thus have been decomposed during vacuum deposition to contaminate the element with impurities, thus resulting in low element durability. By contrast, the organic compounds contained as guests in the light-emitting layers of the organic light-emitting elements of Examples 21 to 31 each have a tetrahydropyrene skeleton, and thus have good sublimability as described above and have been stably deposited without being decomposed, thus suppressing a decrease in element durability.

Example 32

An organic light-emitting element was produced in the same manner as in Example 21 except that organic compound layers and an electrode layer shown in Table 8 were successively formed.

TABLE 8

| | | | Material | Proportion in light-emitting layer (mass %) | Thickness (nm) |
|---|---|---|---|---|---|
| Electrode layer | Cathode | | Al | — | 100 |
| Organic compound layer | Electron injection layer (EIL) | | LiF | — | 1 |
| | Electron transport layer (ETL) | | ET2 | — | 20 |
| | Hole blocking layer (HBL) | | ET11 | — | 20 |
| | Light-emitting layer (EML) | Host | BB37 | 60 | 20 |
| | | Guest | A10 | 10 | |
| | | Assist | EM30 | 30 | |
| | Electron blocking layer (EBL) | | HT19 | — | 15 |

TABLE 8-continued

| | Material | Proportion in light-emitting layer (mass %) | Thickness (nm) |
|---|---|---|---|
| Hole transport layer (HTL) | HT3 | — | 30 |
| Hole injection layer (HIL) | HT16 | — | 5 |

The characteristics of the element obtained were measured and evaluated in the same manner as in Example 21. The light-emitting element emitted green light and had a maximum external quantum efficiency (E.Q.E.) of 19%. A continuous driving test was performed in the same manner as in Example 21; LT95 was 2.6, relative to LT95 in Comparative Example 3 taken as 1.0.

Examples 33 to 42

Organic light-emitting elements were produced in the same manner as in Example 32 except that the materials used to form the layers were appropriately changed to compounds shown in Table 9. For the layers not listed in Table 9, the same configuration as in Example 32 was used. The characteristics of the elements obtained were measured and evaluated in the same manner as in Example 34. The results of the measurements are shown in Table 9 together with the results of Example 32.

TABLE 9

| | | | | EML | | | | | E.Q.E |
|---|---|---|---|---|---|---|---|---|---|
| | HIL | HTL | EBL | Host | Guest | Assist | HBL | ETL | [%] |
| Example 32 | HT16 | HT3 | HT19 | BB37 | A10 | EM30 | ET11 | ET2 | 19 |
| Example 33 | HT16 | HT3 | HT19 | BB19 | A14 | EM29 | ET26 | ET3 | 18 |
| Example 34 | HT16 | HT2 | HT15 | CC18 | A15 | EM38 | ET13 | ET2 | 17 |
| Example 35 | HT16 | HT2 | HT15 | CC19 | A5 | EM37 | ET13 | ET2 | 17 |
| Example 36 | HT16 | HT3 | HT19 | BB18 | A29 | AA16 | ET16 | ET15 | 18 |
| Example 37 | HT16 | HT3 | HT19 | AA7 | B1 | AA1 | ET16 | ET15 | 14 |
| Example 38 | HT16 | HT3 | HT19 | BB41 | B2 | A10 | ET17 | ET15 | 13 |
| Example 39 | HT16 | HT3 | HT19 | BB19 | C1 | EM40 | ET13 | ET2 | 16 |
| Example 40 | HT16 | HT2 | HT15 | BB29 | C9 | EM38 | ET15 | ET3 | 16 |
| Example 41 | HT16 | HT3 | HT19 | BB19 | D23 | ET15 | ET15 | ET15 | 19 |
| Example 42 | HT16 | HT2 | HT15 | CC21 | D24 | EM30 | ET2 | ET2 | 18 |

As described above, an organic light-emitting element having a high maximum external quantum efficiency and high light emission efficiency was achieved by using an organic compound having a tetrahydropyrene skeleton as a guest of a light-emitting layer.

According to the present disclosure, an organic compound having good light-emitting properties can be provided.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-122660, filed Jul. 27, 2021, which is hereby incorporated by reference herein in its entirety.

What is claimed is:

1. An organic compound represented by formula [1], $$IrL_mL'_n \quad [1]$$

wherein, in formula [1], Ir represents iridium; L and L' represent bidentate ligands different from each other; m is an integer of 1 to 3, and when m is 1, n is 2, when m is 2, n is 1, and when m is 3, n is 0; a partial structure $IrL_m$ is a partial structure represented by formula [2], and a partial structure $IrL'_n$ is a partial structure represented by formula [3-1] or formula [3-2]; when m is 2 or greater, a plurality of L moieties may be the same or different; and when n is 2 or greater, a plurality of L' moieties may be the same or different,

[2]

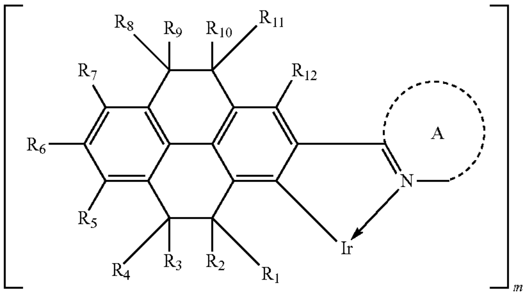

-continued

[3-1]

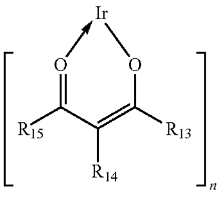

[3-2]

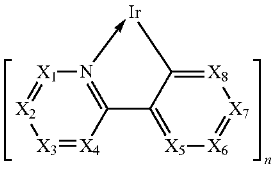

in formula [2], a ring A is selected from formulae [A-1] to [A-5],

[A-1]

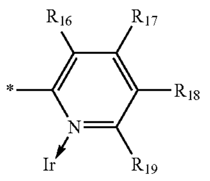

[A-2]

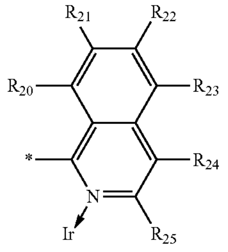

[A-3]

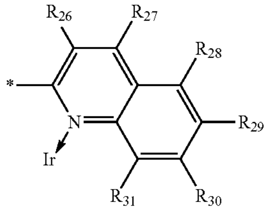

[A-4]

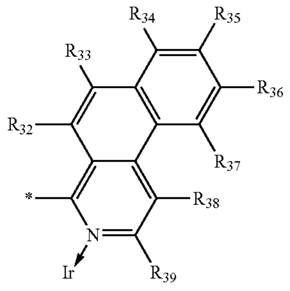

[A-5]

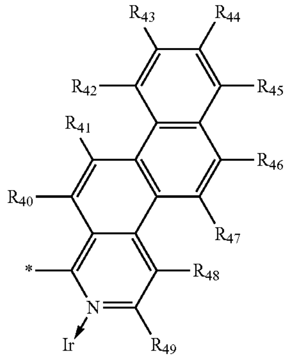

in formulae [A-1] to [A-5], * represents a bonding position, in formulae [2], [3-1], and [A-1] to [A-5], $R_1$ to $R_{49}$ are each independently selected from a hydrogen atom, a deuterium atom, a halogen atom, a substituted or unsubstituted alkyl group, a substituted or unsubstituted alkoxy group, a substituted or unsubstituted amino group, a substituted or unsubstituted aryloxy group, a substituted or unsubstituted silyl group, a cyano group, a substituted or unsubstituted aromatic hydrocarbon group, and a substituted or unsubstituted heterocyclic group, and in formula [3-2], $X_1$ to $X_8$ are each independently selected from a carbon atom and a nitrogen atom, and when $X_1$ to $X_8$ are carbon atoms, the carbon atoms each have a hydrogen atom, a deuterium atom, or a substituent, and each substituent is independently selected from a halogen atom, a substituted or unsubstituted alkyl group, a substituted or unsubstituted alkoxy group, a substituted or unsubstituted amino group, a substituted or unsubstituted aryloxy group, a substituted or unsubstituted silyl group, a cyano group, a substituted or unsubstituted aromatic hydrocarbon group, and a substituted or unsubstituted heterocyclic group.

2. The organic compound according to claim 1, wherein, in formula [2], $R_1$ to $R_4$ and $R_8$ to $R_{11}$ are each independently selected from a hydrogen atom and an alkyl group.

3. The organic compound according to claim 1, wherein, in formula [2], the ring A is represented by formula [A-1] or [A-4].

4. An organic light-emitting element comprising:

a first electrode;

a second electrode; and an organic compound layer disposed between the first electrode and the second electrode and including at least a light-emitting layer, wherein the organic compound layer contains the organic compound according to claim 1.

5. The organic light-emitting element according to claim 4, wherein the light-emitting layer contains the organic compound.

6. The organic light-emitting element according to claim 5, wherein the light-emitting layer further contains a second organic compound.

7. The organic light-emitting element according to claim 6, wherein the second organic compound has an azine ring as a skeleton.

8. The organic light-emitting element according to claim 6, wherein the second organic compound has at least one structure selected from a triphenylene structure, a phenanthrene structure, a chrysene structure, and a fluoranthene structure.

9. The organic light-emitting element according to claim 6, wherein the second organic compound has at least one structure selected from a dibenzothiophene structure and a dibenzofuran structure.

10. The organic light-emitting element according to claim 6, wherein the second organic compound has no sp3 carbon.

11. The organic light-emitting element according to claim 6, wherein the light-emitting layer further contains a compound different from the organic compound and the second organic compound.

12. The organic light-emitting element according to claim 4, wherein the light-emitting layer is a first light-emitting layer, a second light-emitting layer different from the first light-emitting layer is further disposed between the first light-emitting layer and the first electrode or between the first light-emitting layer and the second electrode, and the second light-emitting layer emits light with a color different from a color of light emitted from the light-emitting layer.

13. The organic light-emitting element according to claim 12, wherein the organic light-emitting element emits white light.

14. A display apparatus comprising a plurality of pixels, wherein at least one of the plurality of pixels includes the organic light-emitting element according to claim 4 and an active element connected to the organic light-emitting element.

15. The display apparatus according to claim 14, further comprising a color filter.

16. A photoelectric conversion apparatus comprising:

an optical unit including a plurality of lenses;

an image pickup element that receives light that has passed through the optical unit; and a display unit that displays an image captured by the image pickup element, wherein the display unit includes the organic light-emitting element according to claim 4.

17. An electronic apparatus comprising:

a housing;

a communication unit that communicates with an external unit; and a display unit, wherein the display unit includes the organic light-emitting element according to claim 4.

18. An illumination apparatus comprising:

a light source; and a light diffusion unit or an optical filter, wherein the light source includes the organic light-emitting element according to claim 4.

19. A moving object comprising:

a body; and a lighting fixture disposed on the body, wherein the lighting fixture includes the organic light-emitting element according to claim 4.

20. An exposure light source for an electrophotographic image-forming apparatus, comprising the organic light-emitting element according to claim 4.

* * * * *